US011156682B2

(12) United States Patent
Yang et al.

(10) Patent No.: US 11,156,682 B2
(45) Date of Patent: Oct. 26, 2021

(54) SINGLE LAYER MAGNETIC RESONANCE IMAGING TRANSMIT/RECEIVE RADIO FREQUENCY COIL FOR DIFFERENT ANATOMIES

(71) Applicant: Quality Electrodynamics, LLC, Mayfield Village, OH (US)

(72) Inventors: Xiaoyu Yang, Indiana, PA (US); Tsinghua Zheng, Chesterland, OH (US); Haoqin Zhu, Mayfield Village, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 845 days.

(21) Appl. No.: 15/933,860

(22) Filed: Mar. 23, 2018

(65) Prior Publication Data
US 2018/0275233 A1    Sep. 27, 2018

Related U.S. Application Data

(60) Provisional application No. 62/476,073, filed on Mar. 24, 2017.

(51) Int. Cl.
*G01R 33/36*  (2006.01)
*G01R 33/341*  (2006.01)
(Continued)

(52) U.S. Cl.
CPC ....... *G01R 33/3628* (2013.01); *G01R 33/341* (2013.01); *G01R 33/34046* (2013.01); *G01R 33/3415* (2013.01)

(58) Field of Classification Search
None
See application file for complete search history.

(56) References Cited

U.S. PATENT DOCUMENTS 4,680,549 A    7/1987 Tanttu
4,782,298 A *  11/1988 Arakawa ............ G01R 33/3628
                                                       324/318
(Continued)

FOREIGN PATENT DOCUMENTS

WO    20150043612 A1    4/2015

OTHER PUBLICATIONS

Notice of Allowance dated Jul. 31, 2020 in connection with U.S. Appl. No. 15/706,005.
(Continued)

*Primary Examiner* — Jonathan Cwern
(74) *Attorney, Agent, or Firm* — Eschweiler & Potashnik, LLC

(57) ABSTRACT

A magnetic resonance imaging (MRI) radio frequency (RF) coil array configured to operate in a transmit (Tx) mode or in a receive (Rx) mode, comprising: a plurality of rows configured in an anatomy-specific shape, a row including a plurality of RF coil elements, an RF coil element including an LC coil and a magnitude/phase control component, where the LC coil, upon resonating with a primary coil at the working frequency of the primary coil, generates a local amplified Tx field based on an induced current in the LC coil, where a magnitude or a phase of the induced current is independently adjustable, where the magnitude/phase control component is configured to adjust the magnitude or phase of the induced current, and where the magnitude or phase of the induced current of a first RF coil element is independently adjustable from that of a second, different RF coil element.

46 Claims, 30 Drawing Sheets

(51) Int. Cl.
*G01R 33/34* (2006.01)
*G01R 33/3415* (2006.01)

(56) References Cited

U.S. PATENT DOCUMENTS

| | | | |
|---|---|---|---|
| 4,825,162 A | | 4/1989 | Roemer et al. |
| 4,987,370 A | | 1/1991 | Leussler et al. |
| 5,317,266 A | * | 5/1994 | Meissner ............ G01R 33/341 324/318 |
| 5,355,087 A | | 10/1994 | Claiborne |
| 5,386,191 A | | 1/1995 | McCarten |
| 5,455,595 A | | 10/1995 | Yokoyama |
| 5,777,474 A | | 7/1998 | Srinivasan |
| 5,903,150 A | | 5/1999 | Roznitsky |
| 5,910,728 A | | 6/1999 | Sodickson |
| 6,177,797 B1 | * | 1/2001 | Srinivasan ....... G01R 33/34046 324/318 |
| 6,249,121 B1 | | 6/2001 | Boskamp |
| 6,323,648 B1 | | 11/2001 | Belt |
| 6,529,005 B1 | | 3/2003 | Kasten |
| 6,791,328 B1 | | 9/2004 | Nabetani |
| 6,980,002 B1 | * | 12/2005 | Petropoulos ....... G01R 33/3415 324/309 |
| 6,982,554 B2 | | 1/2006 | Kurpad et al. |
| 7,180,296 B2 | | 2/2007 | Gross |
| 7,663,367 B2 | | 2/2010 | Wiggins |
| 9,097,769 B2 | | 8/2015 | Schillak |
| 9,274,189 B2 | | 1/2016 | Soutome |
| 9,459,331 B2 | | 10/2016 | Otake |
| 9,541,614 B2 | | 1/2017 | Soutome |
| 9,638,771 B2 | | 5/2017 | Soutome |
| 9,880,242 B2 | | 1/2018 | Darnell |
| 10,168,402 B2 | | 1/2019 | Gunamony |
| 10,261,145 B2 | | 4/2019 | Wald |
| 10,324,147 B2 | | 6/2019 | McNulty |
| 2002/0169374 A1 | | 11/2002 | Jevtic |
| 2006/0071661 A1 | | 4/2006 | Ong |
| 2009/0121482 A1 | | 5/2009 | Rickard |
| 2010/0213941 A1 | | 8/2010 | Driesel et al. |
| 2011/0118723 A1 | | 5/2011 | Turner |
| 2012/0223709 A1 | | 9/2012 | Schillak et al. |
| 2012/0262173 A1 | | 10/2012 | Soutome et al. |
| 2012/0326515 A1 | | 12/2012 | Murai |
| 2013/0063147 A1 | | 3/2013 | Findeklee |
| 2013/0119991 A1 | | 5/2013 | Soutome et al. |
| 2013/0314091 A1 | | 11/2013 | Otake et al. |
| 2015/0260821 A1 | | 9/2015 | Biber |
| 2015/0323628 A1 | | 11/2015 | Wald et al. |
| 2015/0338478 A1 | | 11/2015 | Schillak et al. |
| 2016/0116556 A1 | | 4/2016 | Darnell |
| 2016/0209481 A1 | | 7/2016 | Gunamony et al. |
| 2016/0231400 A1 | | 8/2016 | Fath et al. |
| 2016/0254705 A1 | | 9/2016 | Jung |
| 2016/0334479 A1 | | 11/2016 | Poole et al. |
| 2017/0146622 A1 | | 5/2017 | Yang et al. |
| 2017/0219666 A1 | * | 8/2017 | Kim ................. G01R 33/34046 |
| 2018/0081008 A1 | | 3/2018 | Yang |
| 2018/0275226 A1 | | 9/2018 | Yang |
| 2018/0275234 A1 | | 9/2018 | Han et al. |
| 2018/0313918 A1 | | 11/2018 | Yang |
| 2018/0321339 A1 | | 11/2018 | Yang |
| 2018/0364318 A1 | | 12/2018 | Yang |
| 2020/0065020 A1 | | 2/2020 | Tai |

OTHER PUBLICATIONS

Notice of Allowance dated Apr. 10, 2019 in connection with U.S. Appl. No. 15/583,345.
Non-Final Office Action dated Aug. 13, 2020 in connection with U.S. Appl. No. 15/923,437.
Non-Final Office Action dated Nov. 8, 2018 in connection with U.S. Appl. No. 15/583,345.
W. Wang, et al., "Inductive Coupled Local TX Coil Design", Proc. Intl. Soc. Mag. Reson. Med. 18 (2010).
International Search Report and Written Opinion dated Nov. 9, 2017 in connection with International Patent Application No. PCT/US2017/042590.
U.S. Appl. No. 15/706,005, filed Sep. 15, 2017.
U.S. Appl. No. 15/583,345, filed May 1, 2017.
U.S. Appl. No. 15/923,437, filed Mar. 16, 2018.
U.S. Appl. No. 15/964,390, filed Apr. 27, 2018.
U.S. Appl. No. 15/971,075, filed May 4, 2018.
Non-Final Office Action dated Nov. 18, 2019 in connection with U.S. Appl. No. 15/706,005.
Wang J., "A Novel Method to Reduce the Signal Coupling of Surface Coils for MRI", Proc. ISMRM 4:1434 (1996).
Jovan Jevtic, "Ladder Networks for Capacitive Decoupling in Phased-Array Coils", Proc. Intl. Soc. Mag. Reson. Med 9 (2001).
Klaas P. Pruessmann et al, "SENSE: Sensitivity Encoding for Fast MRI", Magnetic Resonance in Medicine 42:952-962 (1999).
Ulrich Katscher et al, "Transmit SENSE", Magnetic Resonance in Medicine 49:144-150 (2003).
U.S. Appl. No. 16/009,546, filed Jun. 15, 2018.
Notice of Allowance dated Jan. 10, 2020 in connection with U.S. Appl. No. 15/964,390.

* cited by examiner

SINGLE LAYER MAGNETIC RESONANCE IMAGING TRANSMIT/RECEIVE RADIO FREQUENCY COIL FOR DIFFERENT ANATOMIES

RELATED APPLICATIONS

This application claims priority to and the benefit of U.S. Provisional Patent Application 62/476,073, filed Mar. 24, 2017.

BACKGROUND

A magnetic resonance imaging (MRI) system may include two kinds of MRI radio frequency (RF) coils. The first kind of MRI RF coil is a transmit (Tx) coil. A Tx coil, while operating in Tx mode, transmits high power RF energy into the anatomy of the subject being imaged to excite nuclei spins in the tissue being imaged. The second kind of MRI RF coil is a receive (Rx) coil. An Rx coil, while operating in Rx mode, detects weak signals from nuclei spins of the anatomy being imaged. A conventional MRI system uses a built-in whole body coil (WBC) as a Tx coil. In a conventional MRI system, due to the geometric size of the WBC, the WBC applies RF energy to a much larger region of tissue than is required to image a given region of interest. For example, when a head scan is performed and a WBC is used, not only the head, but also the shoulders and chest also receive a high level of RF energy. This creates a high level specific absorption rate (SAR) issue which limits the clinical utility of MRI systems that use a conventional WBC/Rx coil approach. As a result, a local Tx coil is frequently used to mitigate the SAR problem.

A local Tx coil is designed to apply RF energy into only the anatomy being imaged. There are two conventional approaches to transmitting energy from a power source to a local Tx coil. A first conventional approach is to use a direct connection between the power source to the Tx coil using wires. A direct connection using wires is energy efficient because the energy loss in the connection wires is trivial. A disadvantage of direct connection using wires is that dedicated wiring is required, which increases the cost and complexity of the coil.

A second conventional approach to transmitting energy from a power source to a local Tx coil is to use inductive coupling. In an inductive coupling approach, a primary coil is used to directly connect to a power source. The primary coil may be a WBC or another large coil. The primary coil is a resonant LC circuit. A second coil is also used. The second coil is another resonant circuit and is inductively coupled to the primary coil. Thus, energy can be transferred from the primary coil to the second coil. The second coil can be used to excite nearby anatomy more efficiently than the WBC because the second coil is smaller and closer to the nearby anatomy than the WBC. Compared to the first approach using a direct connection with wires, the inductive coupling approach may be less efficient than direct wiring but is still more efficient than a conventional WBC. One benefit of the inductive coupling approach is that no special wiring is required. However, conventional inductive coupling approaches require the use of multiple coils.

For example, a conventional inductively coupled knee coil uses two layers of RF coils. The first (inner) layer includes a plurality of Rx coil elements which detect signals from the anatomy while operating in Rx mode, and which are decoupled from the transmitting field while operating in Tx mode. The second (outer) layer is a standard birdcage coil which inductively couples to a WBC to create a local amplified transmitting field in Tx mode and which is disabled in Rx mode. However, this conventional inductively coupled dual-layer coil has drawbacks. For example, all the individual Rx coil elements in a conventional dual-layer coil need associated circuits for decoupling the Rx coil and the local Tx coil while operating in Tx mode. Conventional inductively coupled dual-layer coils also require circuits for switching off the Tx coil while operating in Rx mode, which require complex and expensive control circuits. This leads to complex and expensive coils. These multiple decoupling circuits and complex control circuits can also decrease the signal to noise ratio (SNR), thereby reducing image quality. Furthermore, the outer layer, by its proximity to the inner layer, will create additional noise when the inner layer is operating in Rx mode. Thus, dual-layer inductively coupled coils are not optimal.

It is advantageous to maintain a uniform Tx field when conducting MRI imaging. However, the human body is not of a uniform shape. Thus, coil arrays have been developed that attempt to maintain a more uniform Tx field over the region being imaged by arranging the elements of the coil array over a shape that more closely conforms to the human body than a generic cylindrical coil. However, the variety of human sizes and shapes makes maintaining a uniform Tx field challenging, even with coil arrays dedicated to different parts of the human anatomy.

DETAILED DESCRIPTION

Embodiments described herein include single layer MRI RF coils and coil elements configured for imaging different anatomies. In MRI, it is desirable for the Tx field to be spatially uniform in the imaging volume for better image uniformity. In a standard MRI system, the Tx field homogeneity is conventionally obtained by using a WBC for transmission. The WBC is the largest RF coil in the system. A large coil, however, produces lower signal-to-noise ratio (SNR) if it is also used for reception, because of its greater distance from the signal-generating tissues being imaged. Since a high SNR is desirable in MRI, embodiments employ single-layer anatomy-specific coils for Tx and Rx to enhance the SNR from the volume of interest. It is desirable for an RF coil to have a high SNR and a uniform Tx field. Anatomy-specific single-layer MRI RF coil arrays described herein are mechanically designed to facilitate patient handling and comfort, and to facilitate the positioning of MRI RF coil array elements in an advantageous physical location near to the anatomy being imaged. Anatomy-specific single-layer MRI RF coil arrays described herein are further configured to manipulate the uniformity of the Tx field by controlling the magnitude or phase of an induced current in an MRI RF coil array element. A discussion of exemplary single layer MRI RF coils, MRIRF coil arrays, RF coil elements, apparatus, and methods suitable for use by embodiments described herein now follows.

Figure 1:
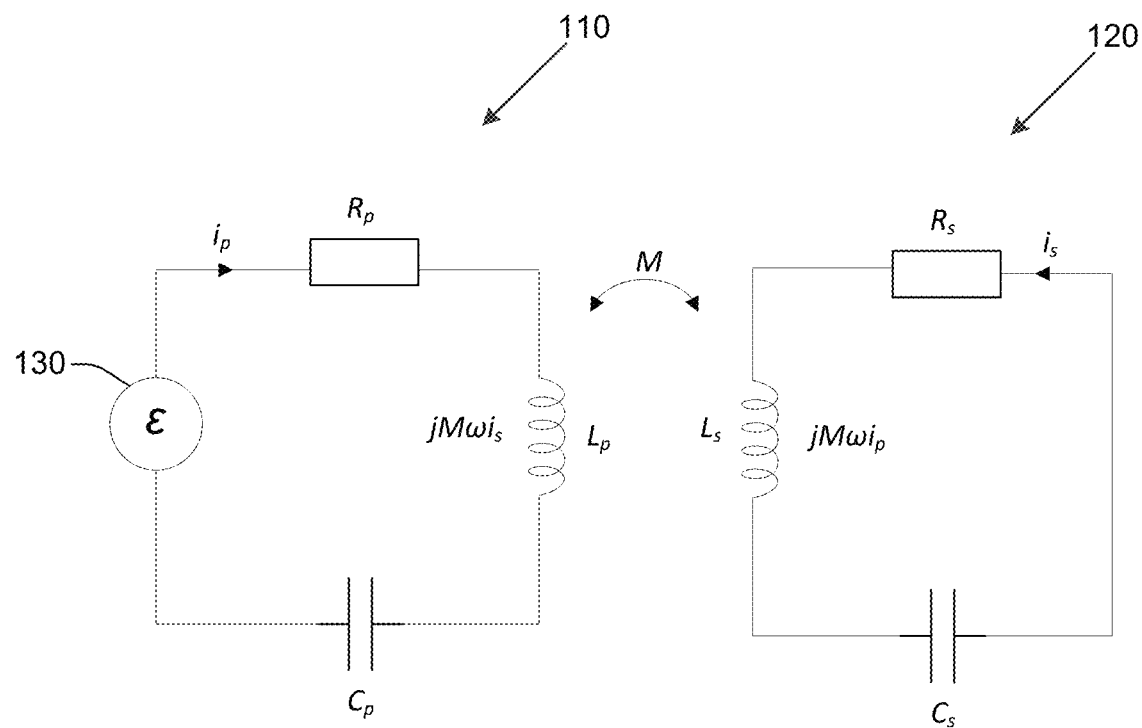
FIG. 1 illustrates inductively coupled resonant RF coils.

FIG. 1 illustrates an RF coil 110 and an RF coil 120. Coil 110 and coil 120 are resonant RF coils and are inductively coupled to each other. Coil 110 and coil 120 may be part of an MRI system. In this example, coil 110 operates as a primary coil and is driven by RF amplifier ε 130. Coil 120 operates as a secondary coil. Secondary coil 120 is inductively coupled to the primary coil 110 by mutual inductance M. Secondary coil 120 is driven by the mutual inductively coupled RF power from the primary coil 110. The primary coil 110 is, in this example, a WBC, while the secondary coil 120 is a local inductively coupled smaller coil. For the primary coil 110, $R_p$, $C_p$, and $L_p$ are defined as the coil loss resistance, the equivalent coil breaking point capacitance, and the equivalent total coil inductance respectively. The RF amplifier ε 130 is defined as an equivalent RF voltage source from an RF power amplifier through a matching circuit, which is not illustrated for clarity. The resistive loss from the RF amplifier ε 130 is absorbed by $R_p$, which may be pre-defined for simplicity of calculation. The mutual inductance between primary coil 110 and secondary coil 120 is defined as M. The resistive loss, the equivalent breaking point capacitance, and the total inductance of secondary RF coil 120 are defined as $R_s$, $C_s$, and $L_s$ respectively. The RF current through primary coil 110 is defined as $i_p$, and the RF current through secondary coil 120 is defined as $i_s$. Mutual inductance between primary RF coil 110 (e.g. $L_p$) and secondary RF coil 120 (e.g. $L_s$) generates an induced voltage on primary coil 110 $L_p$, which may be expressed as $+/-j\omega M i_s$. The sign of $j\omega M i_s$ is determined by the polarity between primary coil 110 and secondary coil 120. For clarity of exposition, the positive sign is used in this example. Similarly, the mutual inductance between secondary coil 120 and primary coil 110 generates an induced voltage on secondary coil 120, which may be expressed as $+/-j\omega M i_p$. The sign is the same for both primary coil 110 and secondary coil 120.

Using Kirchhoff's law, primary coil 110 and secondary coil 120 represented in FIG. 1 may be described by equation 1 below:

for primary coil 110: $Z_p i_p + j\omega M i_s = \varepsilon$ for secondary coil 120: $j\omega M i_p + Z_s i_s = 0$     (Eq. 1), where $$Z_p = R_p + j\left(\omega L_p - \frac{1}{\omega C_p}\right) \text{ and } Z_s = R_s + j\left(\omega L_s - \frac{1}{\omega C_s}\right),$$

where Z represents impedance.

Equation 1 may be re-written in matrix format, resulting in:

$$\begin{pmatrix} Z_p & j\omega M \\ j\omega M & Z_s \end{pmatrix}\begin{pmatrix} i_p \\ i_s \end{pmatrix} = \begin{pmatrix} \varepsilon \\ 0 \end{pmatrix} \quad \text{(Eq. 2)}$$

Thus, the solution to equation 2 is:

$$\begin{pmatrix} i_p \\ i_s \end{pmatrix} = \frac{1}{Z_p Z_s + \omega^2 M^2}\begin{pmatrix} Z_s \varepsilon \\ -j\omega M \varepsilon \end{pmatrix} \quad \text{(Eq. 3)}$$

where $i_p = \frac{Z_s \varepsilon}{(Z_p Z_s + \omega^2 M^2)}$ and $i_s = \frac{-j\omega M \varepsilon}{(Z_p Z_s + \omega^2 M^2)}$.

If both the primary coil 110 and the secondary coil 120 resonate at the same frequency, then $Z_p = R_p$ and $Z_s = R_s$. Thus $$i_p = \frac{R_s \varepsilon}{(R_p R_s + \omega^2 M^2)} \text{ and } i_s = \frac{-j\omega M \varepsilon}{(R_p R_s + \omega^2 M^2)}.$$

Recall that the phase of $i_s$ is opposite to the phase of $i_p$, per Lenz's Law. The ratio between $i_s$ and $i_p$ is $-j\omega M/R_s$. The secondary coil 120's quality factor (Q) may be high, i.e., the value of $R_s$ may be small. Therefore the ratio between current $i_s$ and $i_p$ may be large. Furthermore, because secondary coil 120 is smaller than primary coil 110 and is also closer to the imaging area than primary coil 110, the same magnitude of RF current generates a larger magnetic transmitting field at the area being imaged. Thus, a local inductive coil is significantly more power efficient than a large WBC coil and the local inductive coil's current is dominant compared to the primary coil's current even though their phases are opposite to each other. Furthermore, if a local inductive coil such as secondary coil 120 does not resonate at the frequency of primary coil 110, then the induced current $i_s$ in secondary coil 120 can be written as:

$$i_s = \frac{-j\omega M \varepsilon}{\left(R_p R_s + \omega^2 M^2 + jR_p\left(\omega L_s - \frac{1}{\omega C_s}\right)\right)} \quad \text{(Eq. 4)}$$

As shown in Eq. 4, the frequency deviation of secondary coil 120 from primary coil 110 can reduce the magnitude of $i_s$ and change the phase of $i_s$. This approach may be used by embodiments described herein to reduce the local coil 120's RF power efficiency if a particular MRI application requires it. For example, as demonstrated by Eq. 4, the induced current $i_s$ is a function of a coil loss resistance of primary coil 110, a coil loss resistance of secondary coil 120, or a difference between a working frequency of primary coil 110 and a resonant frequency of secondary coil 120. Thus, embodiments described herein may independently adjust a magnitude of the induced current in a local coil (e.g. secondary coil 120), or a phase of the induced current in a local coil (e.g. secondary coil 120) by adjusting the coil loss resistance of the primary coil (e.g. primary coil 110), the coil loss resistance of the secondary coil (e.g. secondary coil 120), or the difference between the working frequency and the resonant frequency. Embodiments described herein may therefore also adjust the magnitude of local Tx field generated by a single layer MRI RF coil operating in Tx mode.

Embodiments described herein include a single-layer MRI RF coil array that employs a single-layer approach to achieve a local inductively coupled Tx transmitter from a plurality of Rx receivers. An example single-layer MRI RF coil array may operate in a Tx mode or an Rx mode. In Rx mode the single-layer MRI RF coil array functions as a plurality of Rx receivers. In Tx mode multiple pin diodes may be used to re-configure all or less than all the plurality of Rx receivers so that either all or less than all of the plurality of Rx receivers may inductively couple to the WBC and amplify the transmit field. Under this single-layer approach there are multiple approaches that may be employed by embodiments described herein to create a Tx field with a local inductively coupled coil.

Figure 2:
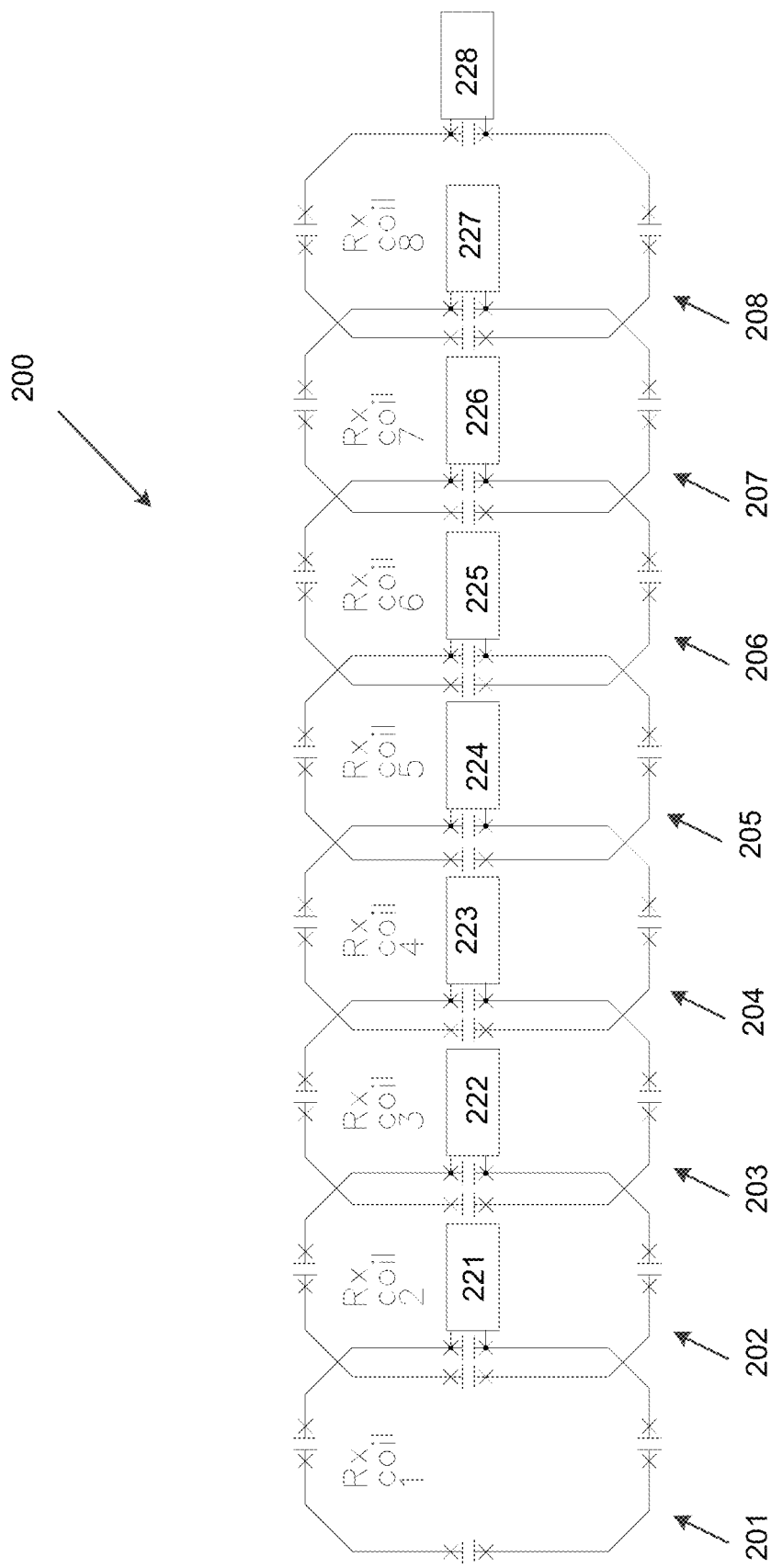
FIG. 2 illustrates a circuit diagram of an eight-rung birdcage coil.

A first single-layer approach is to use PIN diodes to configure a plurality of Rx coils together to create a local volume coil, such as a birdcage coil, and to inductively couple the local volume coil to a larger WBC. This first approach may be demonstrated by an example Rx coil that includes 8 loops configured as independent receivers on a cylindrical former. In examples described herein, a loop is considered to be an RF coil element, or RF coil array element. FIG. 2 is a diagram of an example 8-loop coil 200 in Rx mode. 8-loop coil 200 includes loops 201-208. In this example, a loop is served as an independent receiver, and includes receive electronics 221-228 respectively. Between directly neighboring loops (e.g. loops 202, 203, 204), the directly neighboring loops overlap each other to achieve good isolation, i.e., minimum mutual inductance. Good isolation between loops can also be achieved by using capacitors.

Figure 3:
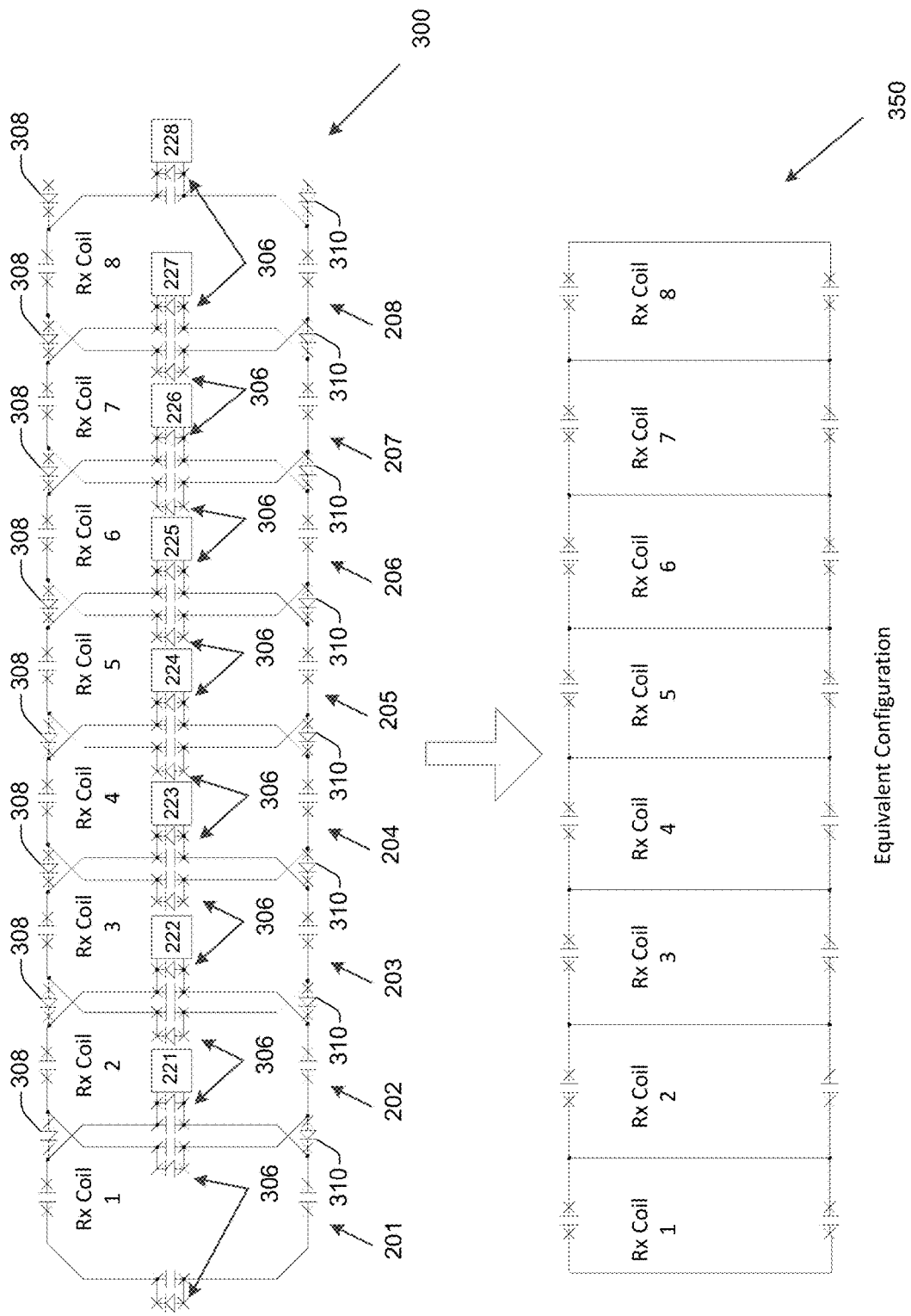
FIG. 3 illustrates a circuit diagram of an eight-rung birdcage coil and equivalent circuit.

FIG. 3 illustrates an Rx coil 300 that is similar to Rx 8-loop coil 200 illustrated in FIG. 2, but with additional elements and details. Rx coil 300 includes multiple PIN diodes 306, 308, and 310. A PIN diode has low impedance (e.g. is shorted) when it is forward biased by a DC power supply. In Tx mode the PIN diodes 306, 308, and 310 are forward biased. The circuitry supporting the PIN diodes 306, 308, and 310, such as RF chokes, is not illustrated in FIG. 3 for clarity. If all PIN diodes 306, 308, and 310 are shorted due to the application of a forward bias, then the circuit of the coil 300 is changed to the equivalent circuit 350. The equivalent circuit 350 illustrates an 8-rung birdcage coil that will inductively couple to a WBC in Tx mode and amplify the transmitting field and increase the efficiency of the WBC. In summary, the first approach of single-layer technology uses PIN diodes to reconfigure all or some of the Rx coil elements in a plurality of Rx coil elements into a local volume coil to increase WBC efficiency using inductive coupling, and to electrically link Rx coil elements together as one larger inductively coupled Tx coil. This first, conventional approach may be sub-optimal for two reasons. A first reason is that many diodes are required to link different Rx coils together. This increases the complexity of the coils. Therefore, this first, conventional approach may be expensive. The other reason is that even though PIN diodes are considered to be shorted when a forward bias is applied to the PIN diodes, the resistive losses of the PIN diodes are not trivial. A typical value of a forward biased PIN diode is 0.5 Ohm. This 0.5 Ohm could be larger than the coil loss itself for some high Q coils. This additional PIN diode resistive loss reduces the local inductively coupled RF coil's power efficiency.

Example embodiments described herein employ a second, different single-layer approach that uses PIN diodes to facilitate switching an Rx coil element into Tx mode so that all or part of all the Rx elements in a plurality of Rx elements can inductively couple to a WBC individually. In this approach, unlike in the first conventional approach, there are no PIN diodes between Rx elements (e.g., loops, RF coil elements) to link the Rx elements together. When forward-biased, a PIN diode may produce a negligible resistance (e.g., ~0.1Ω), which is essentially a short-circuit. When reverse-biased, a PIN diode may produce a high resistance (e.g., ~200 kΩ) in parallel with a low capacitance (e.g., ~2 pF), which is essentially an open-circuit.

An analysis of the induced current in the Rx elements of an array when operating in Tx mode illustrates the operation of the second approach employed by embodiments described herein. In this analysis it is assumed that the couplings among Rx elements are small and can be ignored. The couplings between Rx elements and the WBC are dominant. For example, the WBC field will induce voltage in one element and generate current flow in that element. That current flow will generate its own field. This additional field will induce voltage on this element's neighbors, including direct or indirect neighbors. This additional induced voltage is ignored in this analysis for clarity of exposition because of the assumption that the couplings among Rx elements are small.

Figure 4:
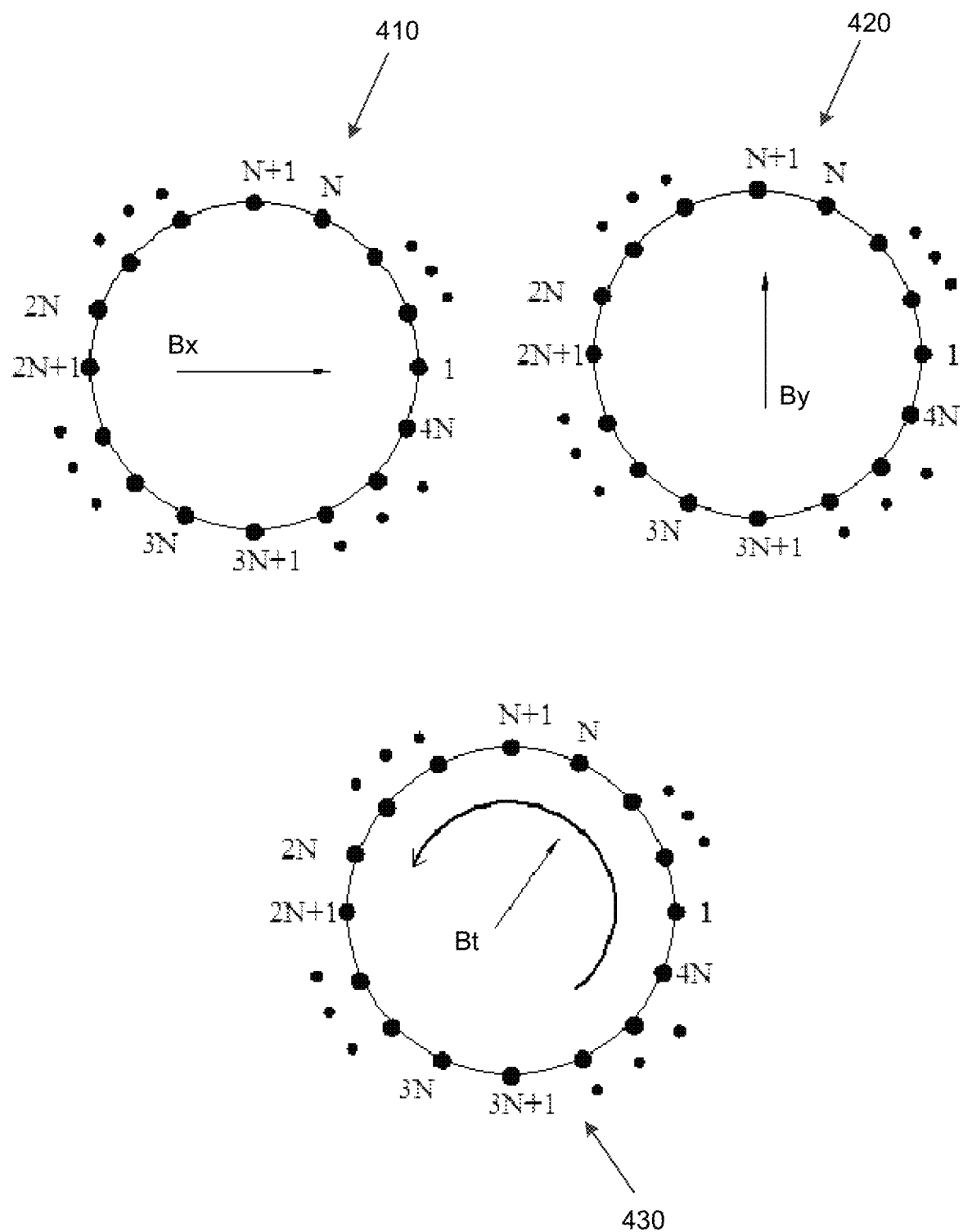
FIG. 4 illustrates current distribution through a birdcage coil.

FIG. 4 illustrates current distribution through rungs of a 4N-rung birdcage coil in circular polarized (CP) mode. Current distribution for a B field in the horizontal direction ($B_x$) is illustrated at 410. For a B field in the horizontal direction ($B_x$) the current through a rung k can be written as:

$$I_{kx} = I_0 \sin\left(\frac{2\pi}{4N}k\right)\sin(\omega_0 t) \quad \text{(Eq. 5)}$$

where k is the rung number (k=1, . . . , 4N) and $\omega_0$ is the working frequency.

Current distribution for a B field in the vertical direction ($B_y$) is illustrated at 420. For a B field in the vertical direction ($B_y$) the current through a rung k can be written as $$I_{ky} = \pm I_0 \cos\left(\frac{2\pi}{4N}k\right)\cos(\omega_0 t) \qquad \text{(Eq. 6)}$$

For current distribution for a B field in the vertical direction ($B_y$), the time domain function is cosine instead of sine due to the circular polarized mode requirement. Furthermore, the "±" symbol indicates that the direction of $B_y$ may be upward or downward. This affects the rotational direction of the final circular polarized B field, illustrated at 430, by making the final circular polarized B field rotate either clockwise or counterclockwise. The total current through a rung k is the sum of the two currents described in equation 5 and equation 6. Therefore:

$$I_k = \qquad \text{(Eq. 7)}$$
$$I_0 \sin\left(\frac{2\pi}{4N}k\right)\sin(\omega_0 t) \pm I_0 \cos\left(\frac{2\pi}{4N}k\right)\cos(\omega_0 t) = I_0 \cos\left(\omega_0 t \pm \frac{2\pi}{4N}k\right)$$

In this example, a first rung has the same current magnitude $I_0$ and angular frequency $\omega_0$ as another, different rung. The currents in different rungs differ with respect to phase. Thus, a typical high pass, low pass, or bandpass WBC's current distribution in its rungs can be described by Eq. 7.

Figure 5:
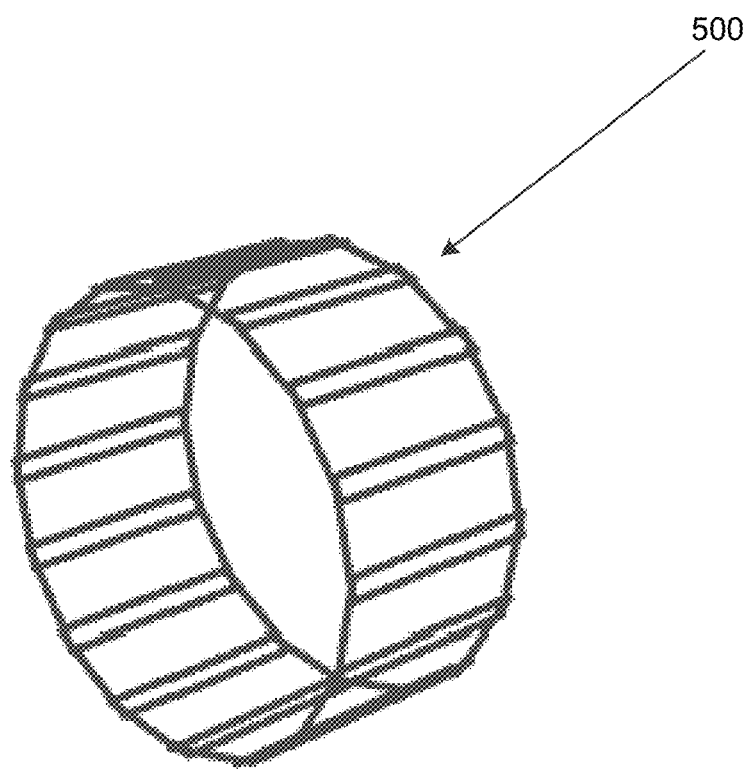
FIG. 5 illustrates an example birdcage coil.

Consider a 4N loops Rx coil that is put inside this circular polarized uniform B field, where the circular polarized uniform B field is generated by a birdcage coil or WBC. FIG. 4, element 430 illustrates current distribution for a B field generated from a birdcage coil or WBC in this situation. In this example, good isolation among all loops is assumed. Furthermore, in this example, each loop is identical, the loops use overlap to isolate the directly neighboring elements, all loops are in the same row, and the loops are wrapped around a cylindrical former. FIG. 5 illustrates an example 16 loop coil 500 configured as a birdcage coil.

In transmit mode the CP $B_1$ field from a birdcage coil (e.g. a WBC) induces voltage in each loop. The induced voltage for a loop can be written as $$V_{induced} = \frac{d(\vec{B_1} \cdot \vec{A_k})}{dt} \qquad \text{(Eq. 8)}$$

where $\vec{A}$ is the area vector, where the magnitude is the area of the $k_{th}$ loop and the direction is the direction perpendicular to the area towards the outside of the coil.

The $B_1$ field and area vector can be written as $$\vec{B_1} = B_1(\cos(\omega_0 t)\hat{x} + \sin(\omega_0 t)\hat{y}) \qquad \text{(Eq. 9)}$$

$$\vec{A_k} = A_0\left(\cos\left(\frac{2\pi}{8N} + (k-1)*\frac{2\pi}{4N}\right)\hat{x} + \sin\left(\frac{2\pi}{8N} + (k-1)*\frac{2\pi}{4N}\right)\hat{y}\right) \qquad \text{(Eq. 9a)}$$

where $A_0$ is the area of a loop. Loops in this example have identical dimensions and thus have the same areas. In particular embodiments, loops may have different areas, and calculations may be adjusted accordingly.

Then, equation 8 can be re-written as $$V_{induced} = A_0 B_1 \omega_0\left(-\sin(\omega_0 t)\cos\left(\frac{2\pi}{8N} + (k-1)*\frac{2\pi}{4N}\right) + \right. \qquad \text{(Eq. 10)}$$
$$\left. \cos(\omega_0 t)\sin\left(\frac{2\pi}{8N} + (k-1)*\frac{2\pi}{4N}\right)\right) =$$
$$A_0 B_1 \omega_0 \sin\left(\frac{2\pi}{8N} + (k-1)*\frac{2\pi}{4N} - \omega_0 t\right)$$

Therefore, the current through the equivalent $k_{th}$ rung position is $$I_{induced\ no\ coupling\_k} = \qquad \text{(Eq. 11)}$$
$$\frac{V_k - V_{k-1}}{R} = \frac{A_0 B_1 \omega_0}{R} * 2 * \sin\left(\frac{2\pi}{8N}\right) * \cos\left((k-1)*\frac{2\pi}{4N} - \omega_0 t\right)$$

where R is the impedance of a loop. At the resonant frequency the reactive part of the impedance is self-canceled and only the real part is left. As demonstrated by both equation 11 and equation 7, a uniform circular $B_1$ field results. The final $B_1$ field $B_t$ inside the loops is the sum of both. As a result the final $B_1$ field $B_t$ inside a small cylinder may be uniform.

In one embodiment, the isolations between coil elements are very small. If the isolations are not small and the mutual inductance is defined as $M_{kj}$ between the $k_{th}$ and $j_{th}$ elements, high order coupling among elements may be ignored, and thus:

$$V_{kj} = M_{kj}\frac{d(I_j)}{dt} \qquad \text{(Eq. 12)}$$

Therefore, the $k_{th}$ element will see additional coupled voltage from the $j_{th}$ element.

Summing all of the coupled voltages of the $k_{th}$ element results in:

$$V_k = A_0 B_1 \omega_0 \sin\left(\frac{2\pi}{8N} + (k-1)*\frac{2\pi}{4N} - \omega_0 t\right) - \qquad \text{(Eq. 13)}$$
$$\sum_{j=1\ and\ j \ne k}^{4N} \left(M_{kj}*A_0 B_1 \omega_0^2 \cos\left(\frac{2\pi}{8N} + (j-1)*\frac{2\pi}{4N} - \omega_0 t\right)\right)$$

Taking the same approach as illustrated in equation 11, then the induced current at the kth rung position can be written as $$I_{induced\ coupled\_k} = \qquad \text{(Eq. 14)}$$
$$I_{induced\ no\ coupling\_k} - \sum_{j=1\ and\ j \ne k\ or\ j \ne k-1}^{4N} \left((M_{kj} - M_{(k-1)j})* \right.$$
$$\left. A_0 B_1 \omega_0^2 \cos\left(\frac{2\pi}{8N} + (j-1)*\frac{2\pi}{4N} - \omega_0 t\right)\right)/R$$

As demonstrated by equation 14 above, the second term in the right side of equation 14 still creates a uniform $B_1$ field. Therefore, compared to the non-coupled case described in equation 11, the coupled case still creates a uniform $B_1$ field. The difference here is that the couplings create the coupled $B_1$ field which makes the whole coil array less power efficient than the non-coupled case. However, as long as this uniform coupled field is still more efficient than the primary coil, (i.e., the WBC) the coil elements may still be used to resonate to improve RF power efficiency and reduce SAR.

Figure 6:
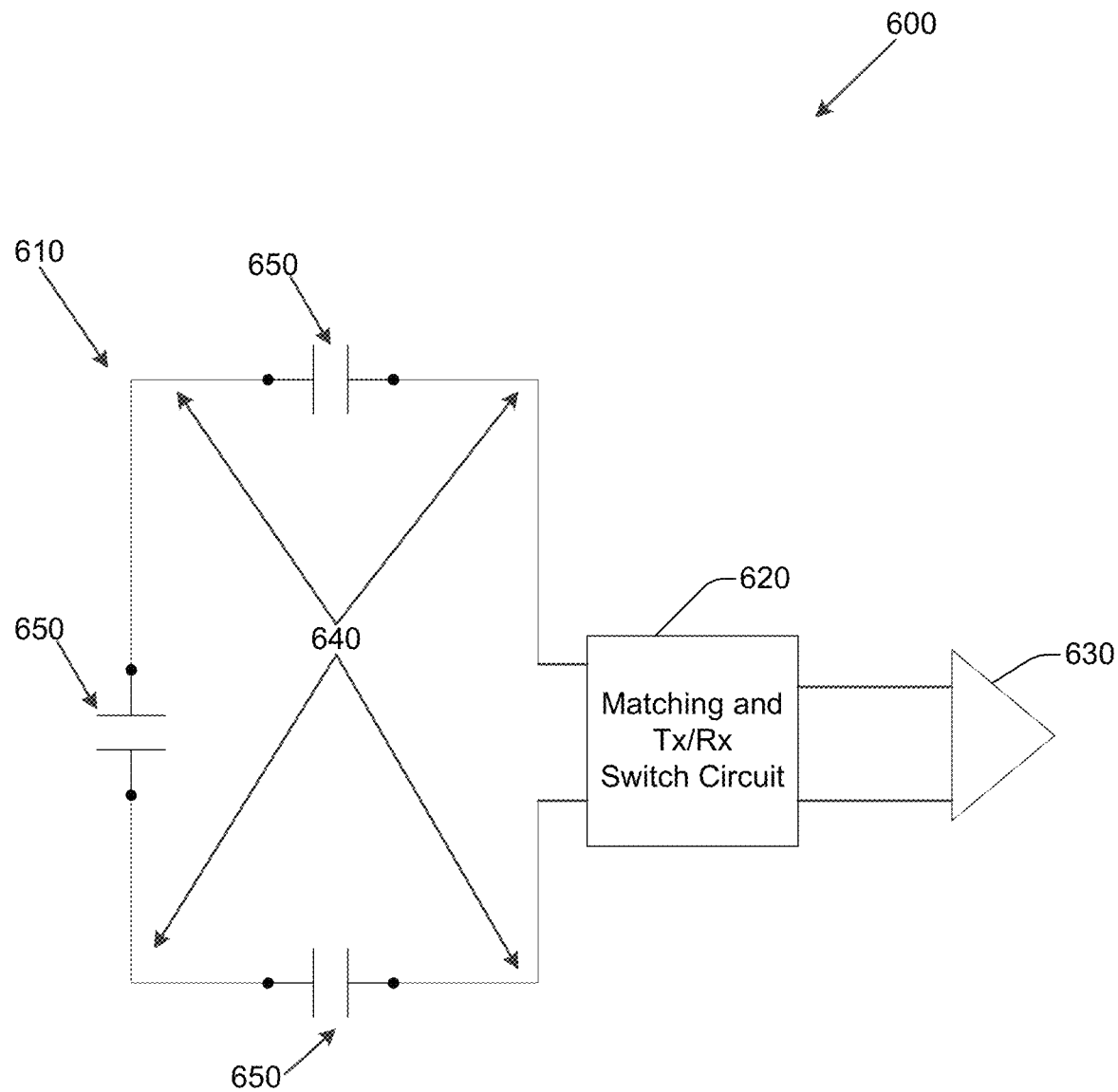
FIG. 6 illustrates an example single-layer MRI RF coil element.

FIG. 6 illustrates an example embodiment of an MRI RF coil element 600 that may be part of a single-layer MRI RF coil array, and that may be used in an MRI procedure for imaging different anatomical regions. MRI RF coil element 600 employs the second approach to generate a local Tx field. In FIG. 6, the configuration illustrated includes one Rx element only, for clarity. Employing a MRI RF coil element 600 as part of a single-layer MRI RF coil array using the second approach is simpler than the first approach because fewer PIN diodes are required to switch between Tx mode and Rx mode. Example embodiments thus improve on conventional approaches by saving space within the bore of an MRI apparatus because less hardware is used to construct example embodiments, by avoiding electromagnetic (EM) interference that may be caused by unnecessary hardware, and by reducing manufacturing costs by requiring less hardware, including PIN diodes, than conventional approaches. Example embodiments therefore offer at least one measurable improvement on conventional approaches in addition to providing improved SNR and more uniform fields.

FIG. 6 illustrates an MRI RF coil element 600 configured to operate in a transmit (Tx) mode or in a receive (Rx) mode. In one embodiment, MRI RF coil element 600 may be part of a single-layer MRI RF coil array configured for use in an MRI system. A single-layer MRI RF coil array comprises at least one RF coil element (e.g., MRI RF coil element 600). The single-layer MRI RF coil array may be arranged in an anatomy-specific shape or configuration, including a closed-shape configuration (e.g. a birdcage coil), or arranged in an open-shape configuration (e.g. in a "C" or "U" shape), or other shaped configuration. In one embodiment, the single-layer MRI RF coil array may be a birdcage coil array. For example, FIG. 5 illustrates an example birdcage coil array 500. Birdcage coil array 500 is a sixteen loop, single-row coil array comprising sixteen MRI RF coils. A member of the sixteen MRI RF coils may be, for example, MRI RF coil element 600. In another embodiment, an element of the single-layer MRI RF coil array is configured in a saddle-like configuration. In another embodiment, a first element of the single-layer MRI RF coil array is configured in a saddle-like configuration, while a second, different element of the single-layer MRI RF coil array is configured as a loop.

The at least one RF coil element 600 includes an LC coil 610, a matching and Tx/Rx switch circuit 620, and a preamplifier 630. LC coil 610 includes at least one inductor 640 and at least one capacitor 650. The at least one inductor 640 and the at least one capacitor 650 resonate at a first frequency (i.e., a resonant frequency). The at least one inductor 640 may be, for example, a co-axial cable, a copper wire, a copper foil soldered to a circuit board, or other conductor.

RF coils for MRI may need to be tuned and matched. Tuning involves establishing or manipulating the capacitance in a coil so that a desired resistance is produced. Matching involves establishing or manipulating the capacitance in a coil so that a desired reactance is achieved. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 T. The size of a conventional coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The capacitors can then be adjusted to produce the desired resistance. Once the desired resistance is achieved, then capacitance can be adjusted to cancel reactance.

The matching and Tx/Rx switch circuit 620, when operating in Tx mode, electrically isolates the LC coil 610 from the preamplifier 630 upon the LC coil 610 resonating with a primary coil (not illustrated) at a working frequency of the primary coil. The matching and Tx/Rx switch circuit 620 electrically isolates the LC coil 610 from the preamplifier 630 by providing a threshold level of impedance between the LC coil 610 and the preamplifier 630. The primary coil may be, for example, a WBC or other primary coil that is larger than RF coil element 600. The LC coil 610, upon resonating with the primary coil at the working frequency, generates a local amplified Tx field based on an induced current in the LC coil 610. The induced current has a magnitude and a phase. The magnitude of the induced current or the phase of the induced current may be independently adjustable. For example, the induced current is a function of at least a coil loss resistance of the WBC, a coil loss resistance of the LC coil 610, or a difference between a working frequency of the WBC and a resonant frequency of the LC coil 610. In this embodiment, the frequency of the induced current is the same as the working frequency of the current in the primary coil or WBC, even though the resonant frequency of the LC coil 610 may be different. Embodiments described herein facilitate adjusting the coil loss resistance of the WBC, the coil loss resistance of the LC coil 610, or the difference between the working frequency of the WBC and the resonant frequency of the LC coil 610. The magnitude of the induced current or the phase of the induced current are configured to be varied over a range of magnitudes or phases respectively. Example embodiments thus facilitate independently adjusting the magnitude of an induced current in LC coil 610, or a phase of the induced current.

Matching and Tx/Rx switch circuit 620, when operating in Rx mode, electrically connects the LC coil 610 with the preamplifier 630 by providing low impedance between the LC coil 610 and the preamplifier 630. Preamplifier 630 may be a low input impedance low noise amplifier (LNA). In one embodiment, matching and Tx/Rx switch circuit 620 may be a capacitive matching and Tx/Rx switch circuit. In another embodiment, matching and Tx/Rx switch circuit 620 may be an inductive matching and Tx/Rx switch circuit.

Figure 7:
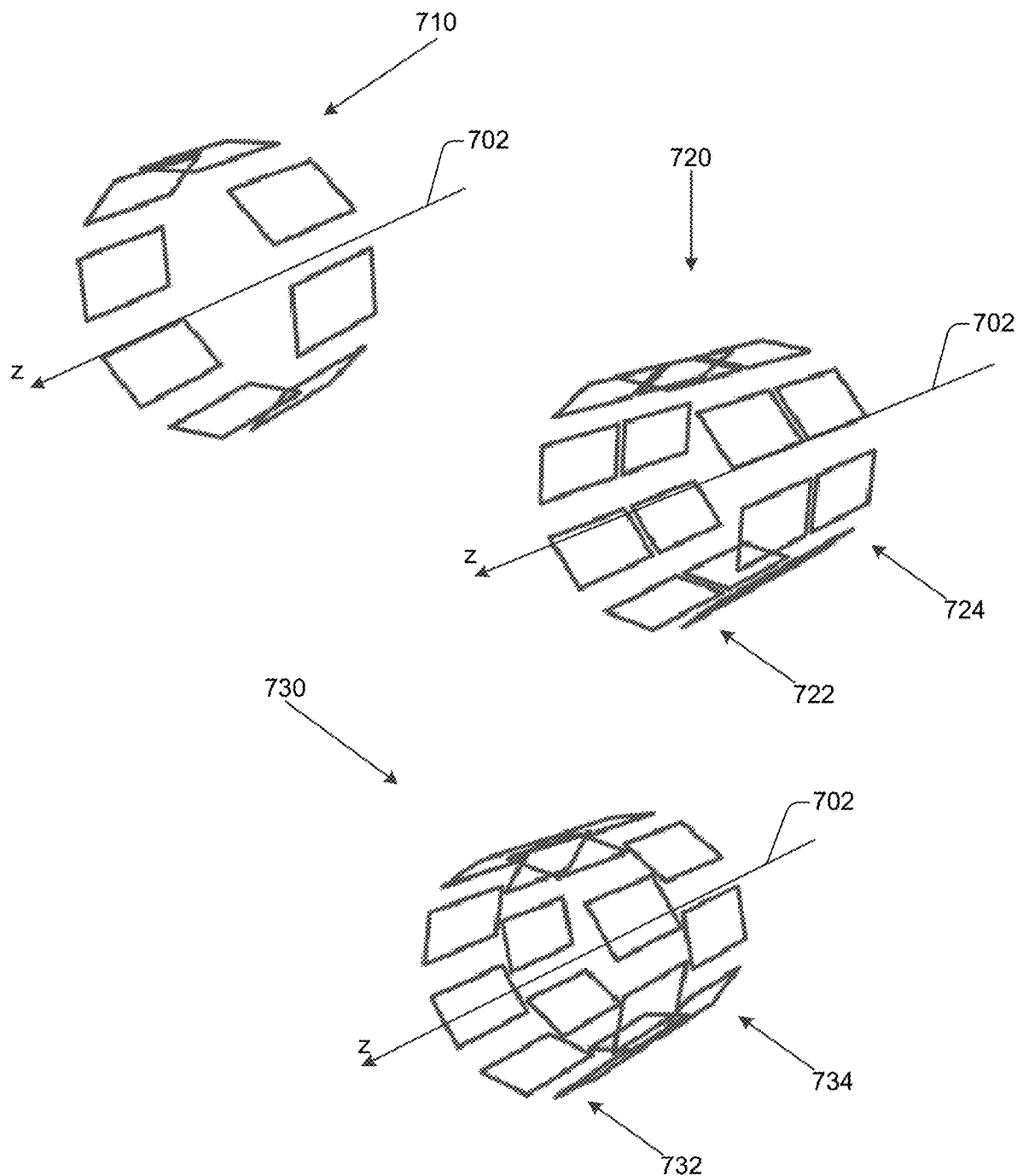
FIG. 7 illustrates an example single-layer MRI RF coil arrays.

Example MRI RF coil elements, MRI RF coil arrays, MRI RF coils, apparatus, and other embodiments, may be configured, for example, as bird cage coils. FIG. 7 illustrates one embodiment of a single-layer MRI RF coil array 710 that includes at least one MRI RF coil element arranged in a single-row birdcage configuration. The at least one MRI RF coil element may include, for example, MRI RF coil elements 600, 800, 900, 1000, 1100, 1200, or 1500. FIG. 7 also illustrates an example embodiment of a single-layer MRI RF coil array 720 that includes at least one example MRI RF coil elements arranged in a two-row configuration. Single-layer MRI RF coil array 720 includes a first row 722 aligned with a second row 724. First row 722 includes at least four RF coil elements. Second row 724 includes at least four RF coil elements. FIG. 7 further illustrates another, single-layer MRI RF coil array 730. Single layer MRI RF coil array 730 is similar to single-layer MRI RF coil array 720, except the first row 732 is not aligned with second row 734. For example, first row 732 may be rotated a number of degrees around a central axis (e.g. z axis) shared with second row 734, while 734 is not rotated, or is rotated a different number of degrees. In different embodiments, first row 732 may be aligned to within a threshold level of alignment with second row 734.

In one embodiment, MRI RF coil array 720 includes a first plurality of RF coil elements (e.g. first row 722) and a second plurality of RF coil elements (e.g. second row 724). The first plurality of RF coil elements and the second plurality of RF coil elements are radially disposed about a longitudinal axis 702. The first plurality and the second plurality may be longitudinally offset a threshold distance greater than zero along the longitudinal axis 702. In one embodiment, an element of the first plurality of RF coil elements is axially offset a threshold amount from a respective element of the second plurality of RF coil elements. For example, an element of the first plurality of RF coil elements may be axially offset 15 degrees, 30 degrees, or another, different number of degrees, from a respective element of the second plurality of RF coil elements. The first plurality and the second plurality may include the same number of RF coil elements, or may include different numbers of RF coil elements. For example, in one embodiment, the first plurality may include eight RF coil elements, while the second plurality may include nine RF coil elements. Other, different numbers of RF coil elements may be employed.

In another embodiment, the at least one RF coil elements is arranged in a three-row configuration. For example, a three-row single layer MRI RF coil array may include a first row that includes at least five RF coil elements, a second row that includes at least five RF coil elements, and a third row that includes at least five RF coil elements. In this embodiment, the first row, second row, and third row may be aligned axially, or may be unaligned axially. In another embodiment, other different numbers of rows, number of RF coil elements, or combinations of alignments may be employed.

For example, in one embodiment, MRI RF coil array 720 includes a first plurality of RF coil elements 722, a second plurality of RF coil elements 724, and a third plurality of RF coil elements (not illustrated). In this embodiment, the first plurality of RF coil elements 722, the second plurality of RF coil elements 724, and the third plurality of RF coil elements are radially disposed about a longitudinal axis. The first plurality 722, the second plurality 724, and the third plurality are longitudinally offset a threshold amount along the longitudinal axis. In one embodiment, an element of the first plurality 722 of RF coil elements is axially offset a threshold amount from a respective element of the second plurality 724 of RF coil elements or the third plurality of RF coil elements. The first plurality 722, the second plurality 724, and the third plurality may include the same number of RF coil elements, or may include different numbers of RF coil elements. For example, in one embodiment, the first plurality 722 may include eight RF coil elements, the second plurality 724 may include nine RF coil elements, and the third plurality may include seven RF coil elements. In another embodiment, the first plurality 722, the second plurality 724, or the third plurality may include other, different numbers of RF coil elements.

Figure 8:
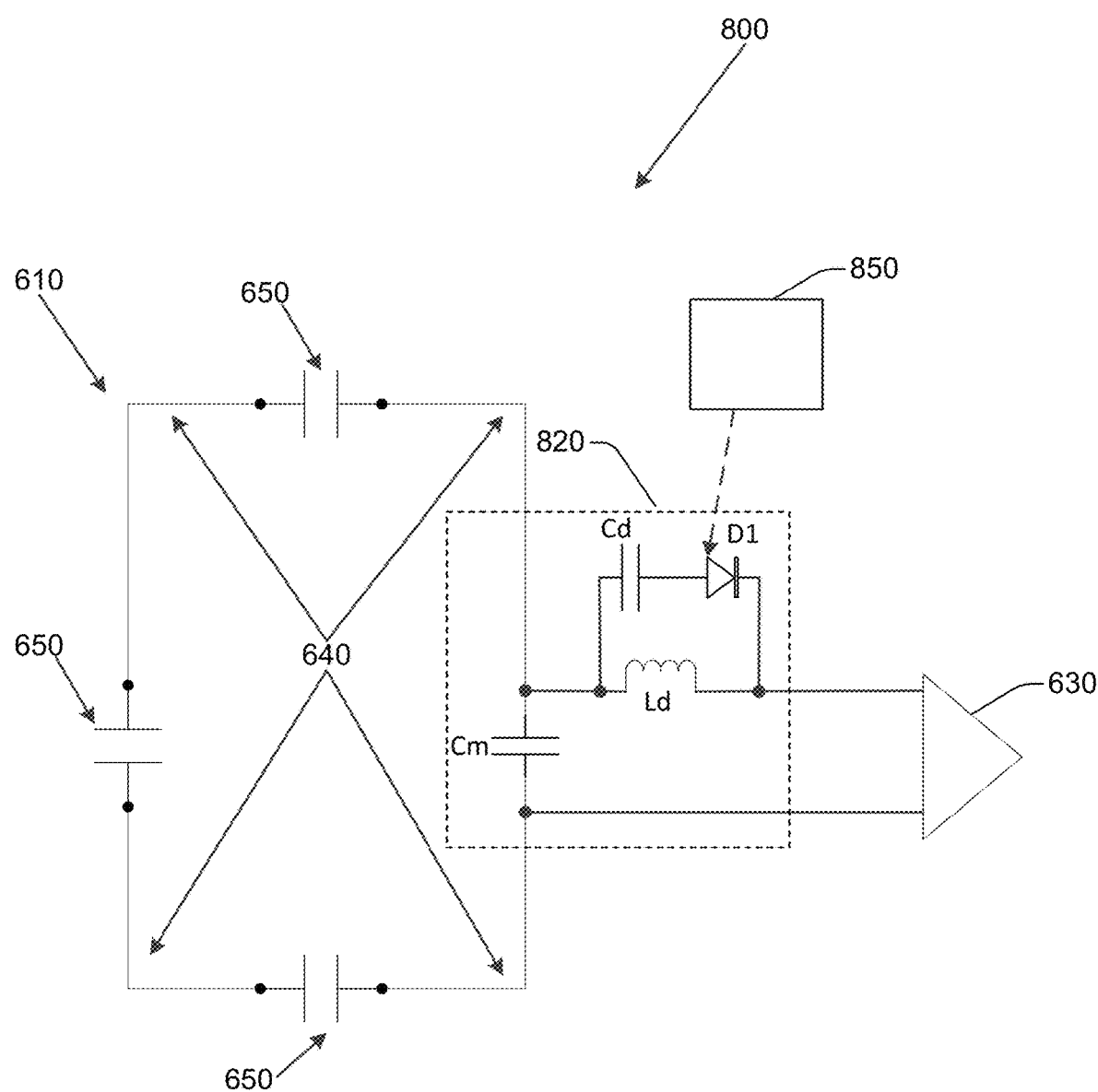
FIG. 8 illustrates an example single-layer MRI RF coil element.

FIG. 8 illustrates an MRI RF coil element 800. MRI RF coil element 800 is similar to MRI RF coil element 600, but includes additional elements and details. MRI RF coil element 800 may be part of a single-layer MRI RF coil array. The single-layer MRI RF coil array comprises at least one RF coil element 800. In one embodiment, MRI RF coil element 800 includes a matching and Tx/Rx switch circuit 820 configured to operate as a capacitive matching and Tx/Rx circuit. In this embodiment, matching and Tx/Rx switch circuit 820 includes a matching capacitor Cm, a first diode D1, a capacitor Cd, and a first inductor Ld. First diode D1 may be a PIN diode. The first diode D1, capacitor Cd, and first inductor Ld create a resonant tank circuit in Tx mode when first diode D1 is forward biased. This resonant tank circuit isolates input to the LNA preamplifier 630 from an induced high current or voltage in LC coil 610. The resonant tank circuit further facilitates LC coil 610, including capacitors 650, inductors 640, and matching capacitor Cm, to resonate at a high Q without preamplifier 630 being electrically connected to the RF coil.

In this embodiment, matching capacitor Cm has a first terminal and a second terminal. Matching capacitor Cm is connected, at a first terminal, to a first terminal of first inductor Ld. First inductor Ld is connected at a first terminal, to a capacitor Cd, at a first terminal. Capacitor Cd is connected, at a second terminal, to first diode D1, at a first terminal. First diode D1 is connected, at a second terminal to first inductor Ld, at a second terminal. First inductor Ld is connected, at a second terminal, to a first input terminal of preamplifier 630. Preamplifier 630 is connected, at a second input terminal, to the second terminal of matching capacitor Cm. In Rx mode, first diode D1 is backward biased (i.e., first diode D1 has a high impedance in Rx mode), so that effectively only Ld is presented between Cm and Preamplifier 630. While in this example first inductor Ld, first diode D1, and capacitor Cd are illustrated on a connection path between the first terminal of matching capacitor Cm and a first input terminal of preamplifier 630, in another embodiment, first inductor Ld, first diode D1, and capacitor Cd may be connected instead between the second terminal of matching capacitor Cm and the second input terminal of preamplifier 630.

In one embodiment, MRI RF coil element 800 further includes a PIN diode control circuit 850. PIN diode control circuit 850 facilitates selective control of first diode D1. For example, PIN diode control circuit 850 controls a forward bias applied to first diode D1. PIN diode control circuit 850 may be operably connected to, for example, first diode D1. In another embodiment, PIN diode control circuit 850 facilitates selective control of other, different diodes, including shunt diodes, or PIN diodes that comprise a magnitude/phase control component.

Figure 9:
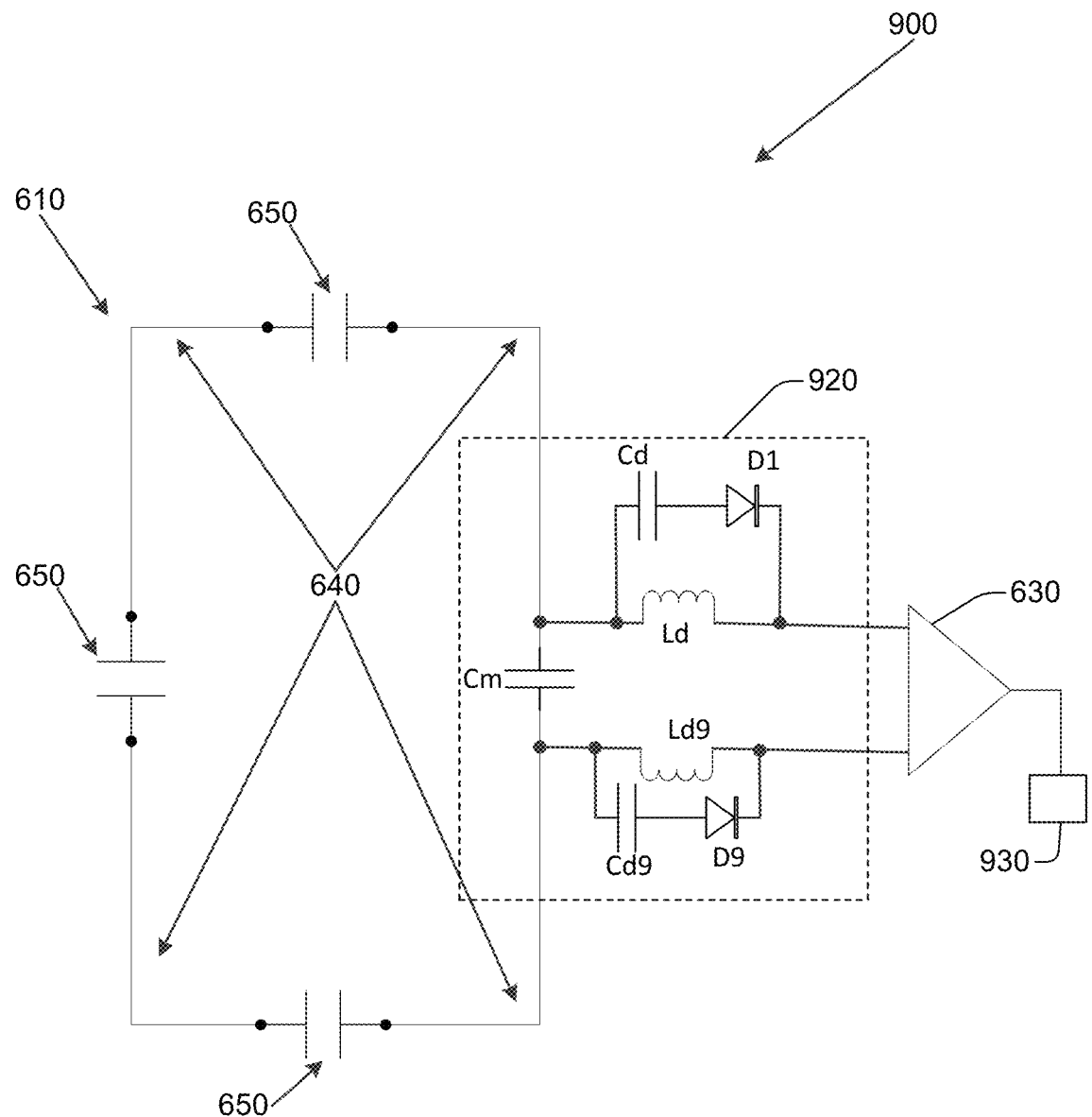
FIG. 9 illustrates an example single-layer MRI RF coil element.

FIG. 9 illustrates an MRI RF coil element 900. MRI RF coil element 900 is similar to MRI RF coil element 800, but includes additional elements and details. MRI RF coil element 900 includes matching and Tx/Rx switch circuit 920. In this embodiment, matching and Tx/Rx switch circuit 920 includes matching capacitor Cm, first diode D1, first capacitor Cd, and first inductor Ld. Matching and Tx/Rx switch 920 also includes second diode D9, second capacitor Cd9, and second inductor Ld9. Second diode D9 may be a PIN diode. The first diode D1, first capacitor Cd first inductor Ld, and second diode D9, second capacitor Cd9, and second inductor Ld9 create a resonant tank circuit in Tx mode when first diode D1 or second diode D14 is forward biased. This resonant tank circuit isolates input to preamplifier 630 from an induced high current or voltage in LC coil 610. The resonant tank circuit further facilitates LC coil 610, including capacitors 650, inductors 640, and matching capacitor Cm, resonating at a high Q without preamplifier 630 being electrically connected to the RF coil.

In this embodiment, matching capacitor Cm has a first terminal and a second terminal. Matching capacitor Cm is connected, at a first terminal, to a first terminal of first inductor Ld. First inductor Ld is attached at a first terminal, to first capacitor Cd, at a first terminal. First capacitor Cd is attached, at a second terminal, to first diode D1, at a first terminal. First diode D1 is attached, at a second terminal to a second terminal of first inductor Ld. First inductor Ld is connected, at a second terminal, to a first input terminal of preamplifier 630. Matching capacitor Cm is connected, at a second terminal, to a first terminal of second inductor Ld9. Second inductor Ld9 is connected, at a first terminal, to second capacitor Cd9, at a first terminal. Second capacitor Cd9 is connected, at a second terminal, to second diode D9, at a first terminal. Second diode D9 is connected, at a second terminal, to a second terminal of second inductor Ld9. Second inductor Ld9 is connected, at a second terminal, to a second input terminal of preamplifier 630.

In one embodiment, MR RF coil element 900 further includes a balun 930. In this embodiment, balun 930 is connected, at a first coaxial or two-connection terminal, to a first coaxial or two-connection output terminal of preamplifier 630. In another embodiment, balun 930 is connected between matching and Tx/Rx switch 920 and preamplifier 630. Balun 930 reduces a common mode current flowing in transmission lines that may connect MRI RF coil element 900 with an MRI system (not illustrated).

Figure 10:
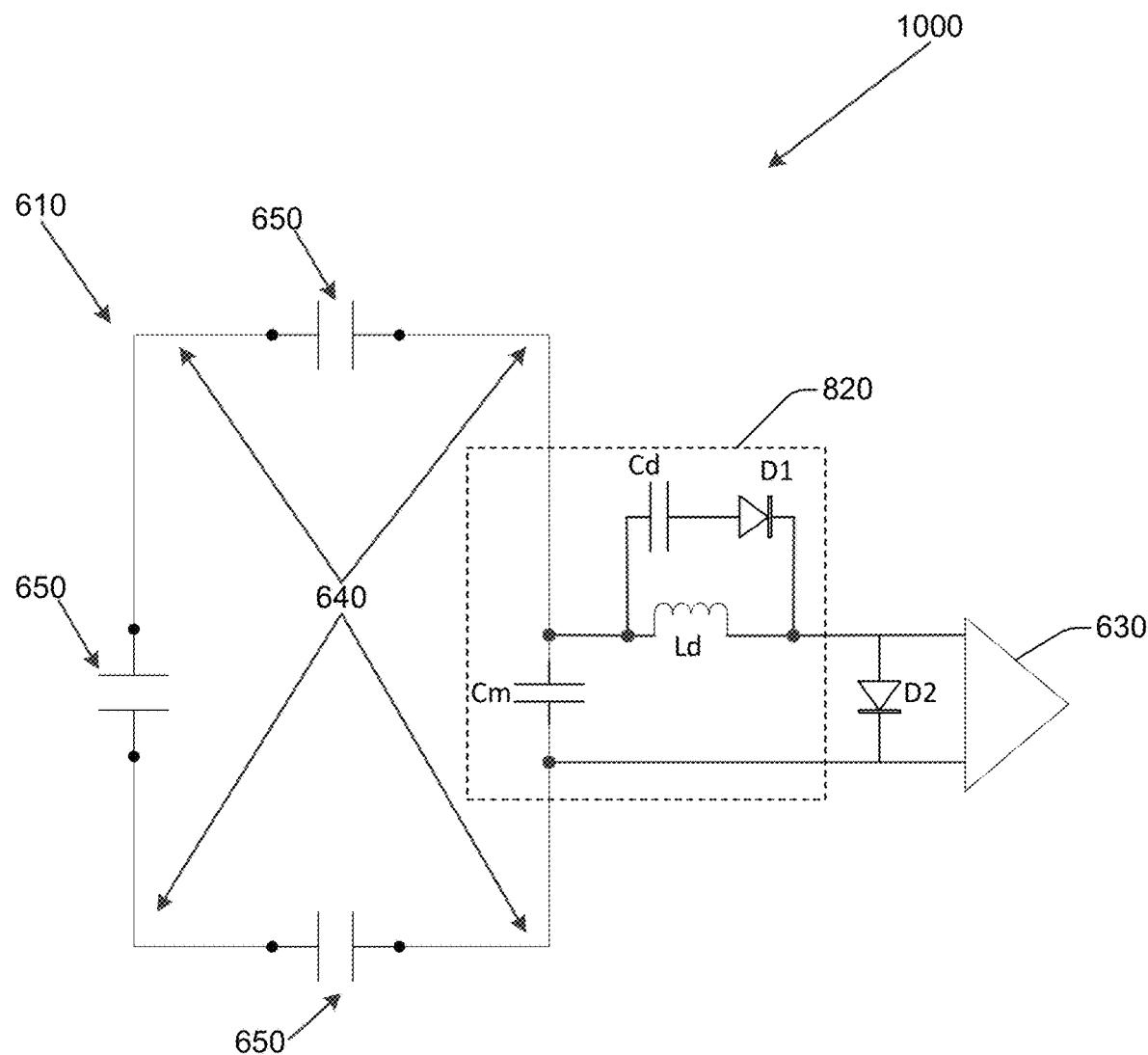
FIG. 10 illustrates an example single-layer MRI RF coil element.

FIG. 10 illustrates an MRI RF coil element 1000. MRI RF coil element 1000 is similar to MRI RF coil element 800, but includes additional elements and details. MRI RF coil element 1000 may be part of a single-layer MRI RF coil array. The single-layer MRI RF coil array comprises at least one RF coil element 1000. MRI RF coil element 1000 includes shunt diode D2. Shunt diode D2 may be a PIN diode. Shunt diode D2 has a first terminal and second terminal. Shunt diode D2 is connected, at a first terminal, to the first input terminal of preamplifier 630. Shunt diode D2 is connected, at a second terminal, to the second input terminal of preamplifier 630. To further improve isolation between high induced current in LC coil 610 and LNA preamplifier 630, shunt diode D2 provides additional shunt protection for the LNA preamplifier 630.

Figure 11:
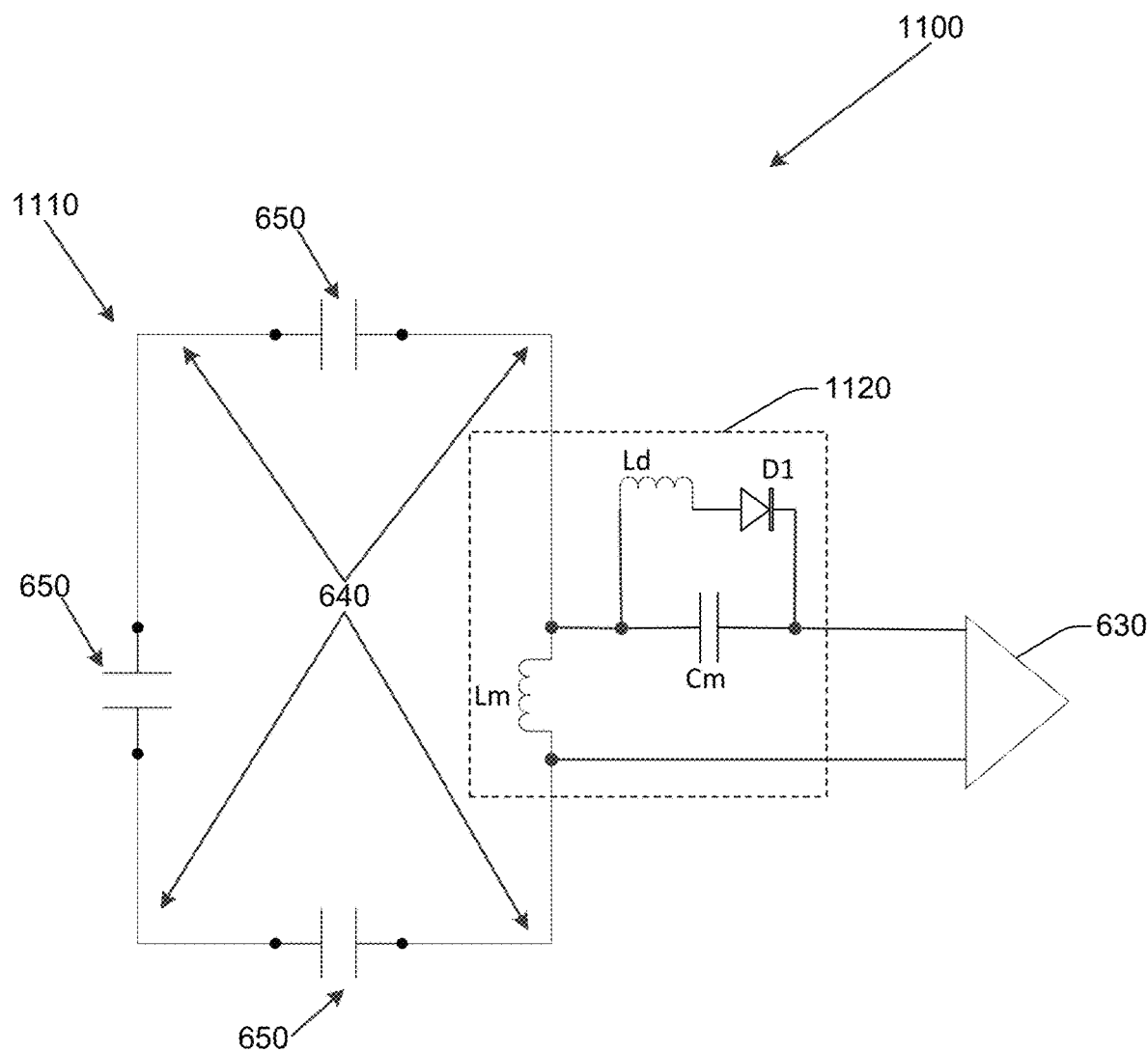
FIG. 11 illustrates an example single-layer MRI RF coil element.

FIG. 11 illustrates an MRI RF coil element 1100. MRI RF coil element 1100 is similar to MRI RF coil element 600, but includes additional elements and details. MRI RF coil element 1100 may be part of a single-layer MRI RF coil array. The single-layer MRI RF coil array comprises at least one RF coil element 1100. RF coil element 1100 includes an LC coil 1110. LC coil 1110 is similar to LC coil 610 but includes a matching inductor Lm having a first terminal and a second terminal. LC coil 1110 also includes at least one conductor 640 having a first end connected to the first terminal of the matching inductor Lm, and a second end connected to the second terminal of the matching inductor Lm.

In this embodiment, matching and Tx/Rx switch 1120 operates as an inductive matching circuit. Matching and Tx/Rx switch 1120 is connected to matching inductor Lm. Matching and Tx/Rx switch 1120 includes first inductor Ld having a first terminal and a second terminal, first diode D1 having a first terminal and a second terminal, and matching capacitor Cm having a first terminal and a second terminal. Matching inductor Lm is connected at a first terminal with the first terminal of matching capacitor Cm. Matching capacitor Cm is connected at a first terminal with the first terminal of first inductor Ld. First inductor Ld is connected at a second terminal with the first terminal of first diode D1. First diode D1 is connected at a second terminal with the second terminal of matching capacitor Cm. Matching capacitor Cm is connected at a second terminal with a first input terminal of pre-amplifier 630. Matching inductor Lm is connected, at a second terminal, with a second input terminal of pre-amplifier 630. The first diode D1, matching capacitor Cm, and first inductor Ld isolate input to the preamplifier 630 from an induced high current or voltage in LC circuit 1110 when first diode D1 is forward biased. While in this example first inductor Ld, first diode D1, and matching capacitor Cm are illustrated on a connection path between the first terminal of matching inductor Lm and a first input terminal of preamplifier 630, in another embodiment, first inductor Ld, first diode D1, and matching capacitor Cm may be connected instead between the second terminal of matching inductor Lm and the second input terminal of preamplifier 630.

Figure 12:
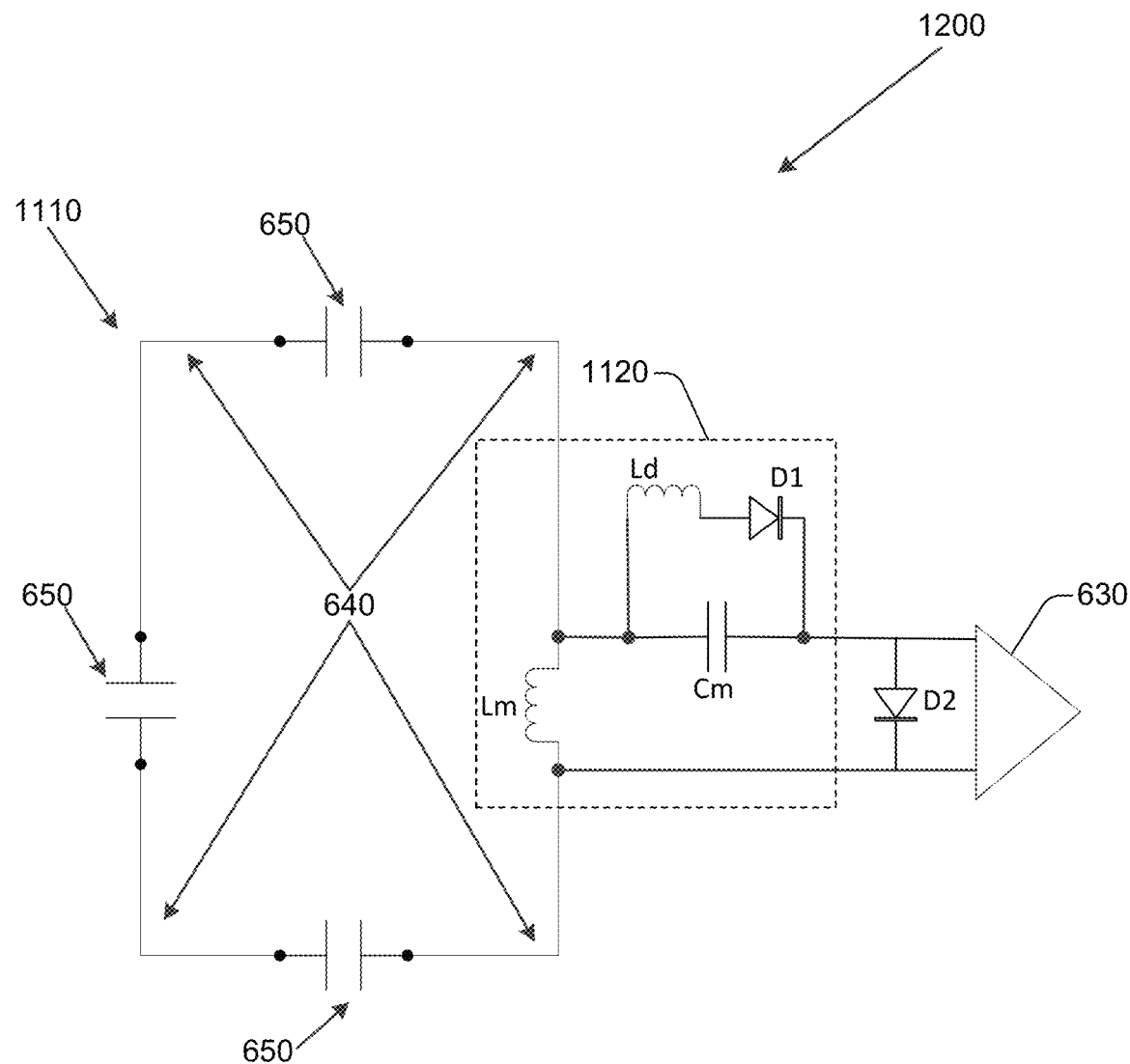
FIG. 12 illustrates an example single-layer MRI RF coil element.

FIG. 12 illustrates an MRI RF coil element 1200. MRI RF coil element 1200 is similar to MRI RF coil element 1100, but includes additional elements and details. MRI RF coil element 1200 may be part of a single-layer MRI RF coil array. The single-layer MRI RF coil array comprises at least one RF coil element 1200. MRI RF coil element 1200 includes shunt diode D2. Shunt diode D2 has a first terminal and second terminal. Shunt diode D2 is connected, at a first terminal, to a first input terminal of preamplifier 630. Shunt diode D2 is connected, at a second terminal, to a second input terminal of preamplifier 630. To further improve isolation between high current induced in LC coil 1110 and LNA preamplifier 630, shunt diode D2 provides additional shunt protection.

Embodiments described herein may include single-layer MRI RF coil arrays configured in shapes other than the cylindrical shape described above. For example, other shapes, including elliptical, rectangular, square, or other different shapes, may be used to build an Rx coil or single-layer MRI RF coil array for particular applications. For those shapes the concepts of the cylindrical case describe above are still applicable. Non-cylindrical shaped single-layer MRI RF coils may differ from cylindrical single-layer MRI RF coils in that the induced $B_1$ field of the other, non-cylindrical shapes is not as uniform as the induced $B_1$ field of the cylindrical case, but is still more than uniform enough for a Tx field in a clinical environment. The non-cylindrical shapes or cross sections discussed above are enclosed shapes or closed-shape configurations. Embodiments are not only applicable to an enclosed shape but may also be implemented as opened shapes, including MRI RF coil elements arranged on a single plane, on two parallel planes, on two planes that are within a threshold of parallel, or MRI RF coil elements arranged in an enclosed shape with a side not present, for example, a "C" shape or a "U" shape that includes three planes.

One embodiment of a single-layer MRI RF coil array that employs an opened shape includes a plurality of loops, saddles, or other MRI RF coil elements arranged on two parallel planes, or on non-parallel planes that are within a threshold tolerance of being parallel to each other, located at least a threshold distance apart, and that face each other directly. A threshold tolerance of being parallel may be, for example, a 1% tolerance, a 10% tolerance, or other, different tolerance. For example, a first point on a first MRI RF coil element may be located 20 cm from a corresponding first point on a facing, second MRI RF coil element, while a second point on the first MRI RF coil element may be located 22 cm from a corresponding second point on the second MRI RF coil element. In this embodiment, the size of the loops may be identical, or may be within a threshold margin of difference. For example, a first loop may describe an area of x cm², while a second loop may describe an area of 0.9x cm². In one embodiment, a plurality of different sized loops may be located on a first plane, while a second plurality of different sized loops may be located on a second, parallel plane, or on a second plane that is within a threshold tolerance of being parallel with the first plane.

Figure 13:
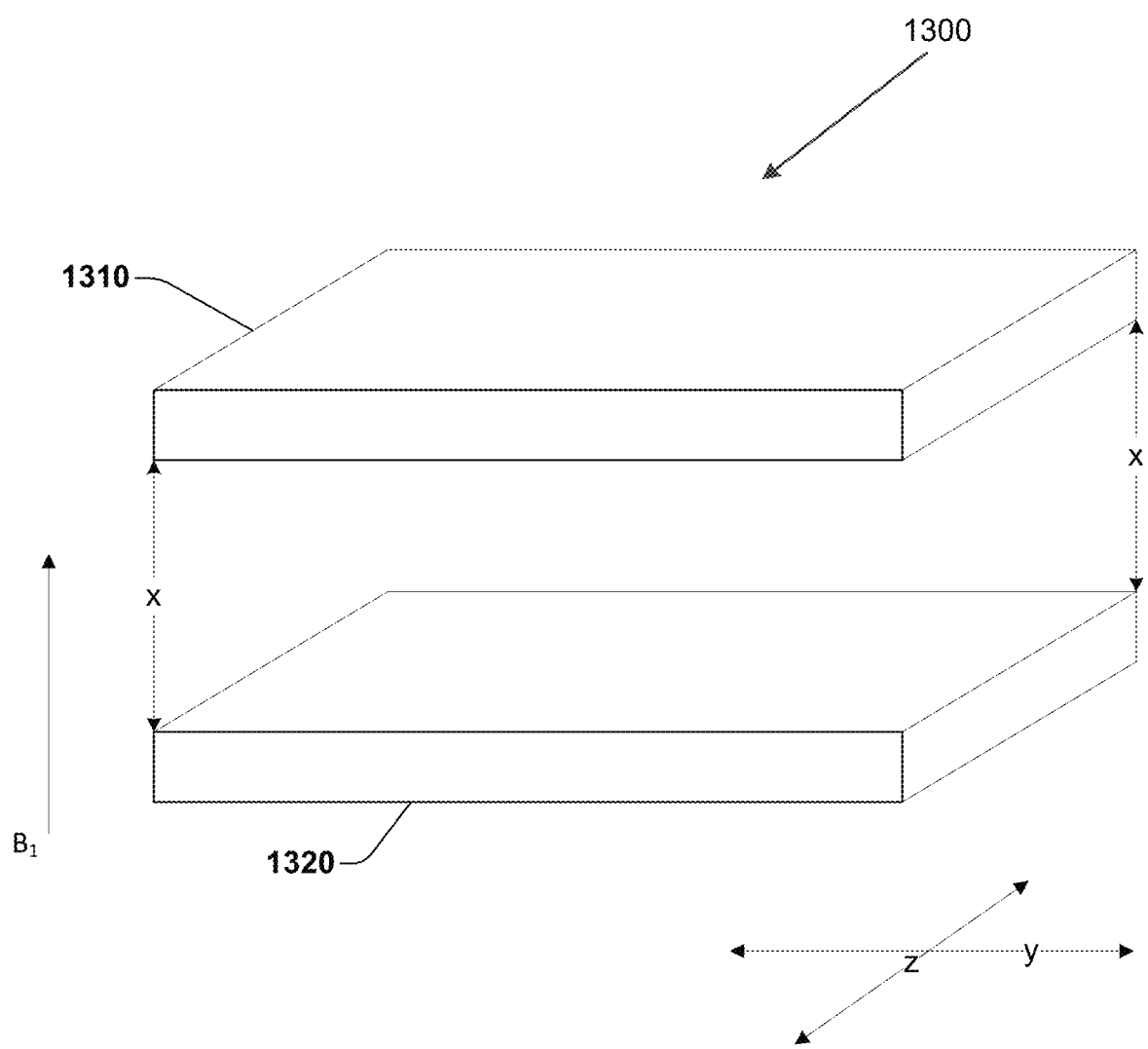
FIG. 13 illustrates an example open shape configuration single-layer MRI RF array.

FIG. 13 illustrates one embodiment of a single layer MRI RF coil array 1300 that includes at least two RF coil elements. While in this embodiment, only two RF coil loops are illustrated, in another embodiment, other, different numbers of RF coil loops may be employed. The at least two RF coil elements includes a first RF coil element 1310 and a second RF coil element 1320. First RF coil element 1310 and second RF coil element 1320 may include a single layer MRI RF coil element, including MRI RF coil element 600, 800, 900, 1000, 1100, 1200, or 1500, or other single-layer MRI RF coil elements described herein. First RF coil element 1310 is arranged on a first plane, while second RF coil element 1320 is arranged on a second, different plane parallel to the first plane. FIG. 13 illustrates an example open shape configuration. The first plane and the second plane may be parallel to each other, and are located at least a threshold distance from each other. The threshold distance is a distance greater than zero. The threshold distance may be a function of a volume to be imaged, for example, the size or shape of a human knee, wrist, or head. In this example, the at least a threshold distance is indicated by "x" in FIG. 13. The first plane and the second plane may, in another embodiment, be within threshold of parallel from each other. The first RF coil element 1310 and the second RF coil element 1320 may be offset laterally from each other a distance greater than zero, or may be directly aligned. For example, the first RF coil element 1310 and second RF coil element 1320 may be located 30 cm from each other in the x axis, and laterally offset 3 cm in the y axis or z axis. In other embodiments, other offsets may be employed.

First RF coil element 1310 and second RF coil element 1320 inductively couple to each other since they face each other. If both first RF coil element 1310 and second RF coil element 1320 are tuned independently to the same frequency without the presence of the other coil, their resonant frequency will split into two frequencies: a lower frequency and a higher frequency. The lower frequency is for the current of both RF coil element 1310 and RF coil element 1320 flowing in the same direction. The higher frequency is for the current of both RF coil element 1310 and RF coil element 1320 flowing in opposite directions. The frequencies may be written as $$f = \frac{1}{2\pi\sqrt{(L \pm M)C}},$$

where L is the inductance of the coil, C is the capacitance, and M is the mutual inductance between RF coil element 1310 and RF coil element 1320.

When both first RF coil element 1310 and second RF coil element 1320 are placed inside a WBC and the WBC generates a circular polarized (CP) uniform or a uniform $B_1$ field perpendicular to the planes of the coils, then the current induced in one of first RF coil element 1310 or second RF coil element 1320 by the WBC directly may be expressed as $$i_{1\_WBC} = \frac{\omega_0 A * B_1}{R} \quad \text{(Eq. 15)}$$

where A is the area of the loop, $B_1$ is the magnitude of WBC field, and R is the coil loss. In an example embodiment in which first RF coil element 1310 or second RF coil element 1320 includes RF coil element 600, 800, 900, 1000, 1100, 1200, or 1500, then the area A of the loop corresponds to the area of LC coil 610 or LC coil 1110. Here, R is the only term in the denominator of Eq. 15 because $$j\omega_0 L - j\frac{1}{\omega_0 C} = 0$$

at the resonant frequency $\omega_0$. The same current is also true for the other coil. For clarity, herein only the $B_1$ field perpendicular to the first plane and second plane is described. However, a $B_1$ field that is not perpendicular to the first plane and second plane may be described similarly. This is shown in equation 16 below.

$$i_{2\_WBC} = \frac{\omega_0 A * B_1}{R} \quad \text{(Eq. 16)}$$

Recall that both currents are flowing in the same direction. Because there is mutual inductance between first RF coil element 1310 and second RF coil element 1320, the final current $i_f$ of the first RF coil element 1310 includes the additional current caused by mutual inductance coupling. The final currents $i_1$ and $i_2$ can be written as:

$$i_1 = \frac{\omega_0 A * B_1}{R} - \frac{M\frac{d(i_{2\_WBC})}{dt}}{R} = \frac{\omega_0 A * B_1}{R} - M\frac{j(\omega_0^2 A * B_1)}{R^2} \quad \text{(Eq. 17)}$$

$$i_2 = \frac{\omega_0 A * B_1}{R} - \frac{M\frac{d(i_{1\_WBC})}{dt}}{R} = \frac{\omega_0 A * B_1}{R} - M\frac{j(\omega_0^2 A * B_1)}{R^2} \quad \text{(Eq. 18)}$$

Both $i_1$ and $i_2$ flow in the same direction and have the same current magnitude. In this example, the coupling or mutual inductance between the first loop or first RF coil element 1310 and the second loop or second RF coil element 1320 causes a Tx efficiency loss. Thus, the sign before M in equation 17 and equation 18 is "−", (i.e., negative sign). This embodiment thus may function as the equivalent of a two-turn solenoid or a saddle coil which generates a transmitting field that has a uniformity suitable for clinical use, including MRI procedures for different anatomical regions or shapes. For example, MRI RF coil array 1300 may be configured to image a human torso. In another embodiment, other, different configurations of coils may be employed.

In one embodiment of single-layer MRI RF coil array 1300, a member of the at least two RF coil elements (e.g. first RF coil element 1310, second RF coil element 1320) includes an LC coil, a matching and Tx/Rx switch circuit, and a preamplifier. In this embodiment, the LC coil includes at least one inductor and at least one capacitor. The at least one inductor and the at least one capacitor resonate at a first frequency. The LC coil is connected with the matching and transmit Tx/Rx switch circuit. The matching and transmit Tx/Rx switch circuit is connected to the preamplifier. The matching and Tx/Rx switch circuit, when operating in Tx mode, electrically isolates the LC coil from the preamplifier upon the LC coil resonating with a primary coil at the first frequency. The LC coil, upon resonating with the primary coil at the first frequency, generates a local amplified Tx field based on an induced current in the LC coil. A magnitude of the induced current or a phase of the induced current is independently adjustable. For example, the magnitude or phase of the induced current may be variable over a range of magnitudes or phases respectively, by varying the coil loss resistance of the primary coil, the coil loss resistance of first RF coil element 1310 or second RF coil element 1320, or the difference between the working frequency of the primary coil and the resonant frequency of first RF coil element 1310 or second RF coil element 1320. The matching and Tx/Rx switch circuit, when operating in Rx mode, electrically connects the LC coil with the preamplifier. In one embodiment, the matching and Tx/Rx switch circuit is a capacitive matching and Tx/Rx switch circuit. In another embodiment, the matching and Tx/Rx switch circuit is an inductive matching and Tx/Rx switch circuit. In one embodiment, the LC coil includes a shunt PIN diode or protection PIN diode that provides further shunt protection to the preamplifier.

Figure 14:
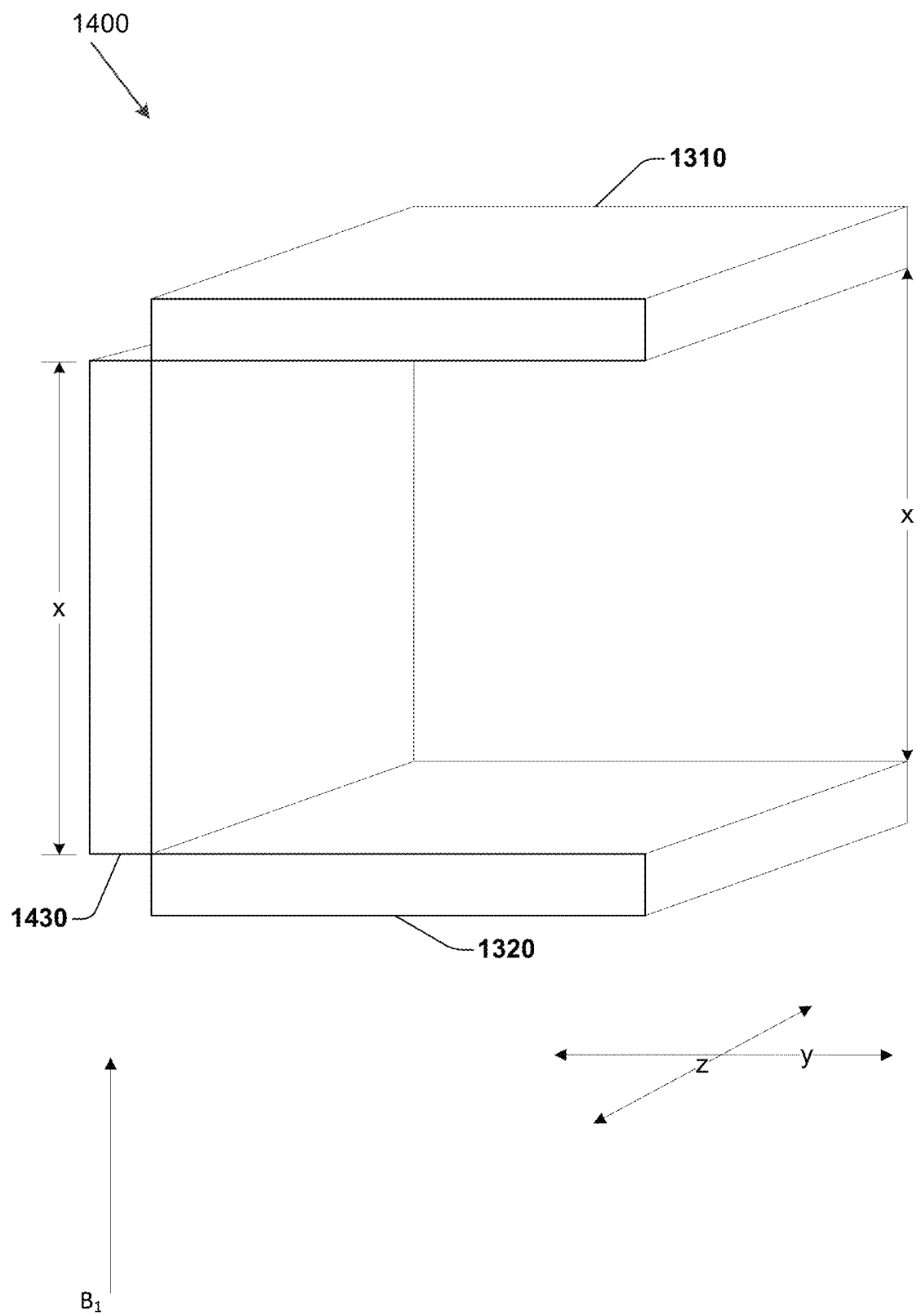
FIG. 14 illustrates an example open shape configuration single-layer MRI RF array.

FIG. 14 illustrates a single-layer MRI RF coil array 1400 that is similar to single-layer MRI RF coil array 1300 but that includes additional details and elements. Single-layer MRI RF coil array 1400 includes first RF coil element 1310, second RF coil element 1320, and also includes a third RF coil element 1430. FIG. 14 illustrates first RF coil element 1310, second RF coil element 1320, and third RF coil element 1430 disposed in an open shape configuration. In this embodiment, the RF coil elements 1310, 1320, and 1430 of MRI RF coil array 1400 are arranged approximately in the shape of a "C" or "U". MRI RF coil array 1400 may be configured to image, for example, a human shoulder. First loop or RF coil element 1310 is arranged on a first plane, while second loop or RF coil element 1320 is arranged on a second, different plane. The first plane and the second plane may be parallel or slightly non-parallel to each other, and are located at least a threshold distance from each other. The threshold distance is a non-zero distance greater than zero. In this example, the at least a threshold distance is indicated by "x" in FIG. 14. In one embodiment, third RF coil element 1430 is arranged on a third plane that is perpendicular to the first plane and the second plane. In another embodiment, third RF coil element 1430 is arranged on a third plane that is within a threshold degree of parallel with the first plane or the second plane. For example, in one embodiment configured for a first anatomy to be imaged, the third RF coil element 1430 is arranged on a third plane that is perpendicular with the first plane and the second plane. In another embodiment configured for a second, different anatomy, the third RF coil element 1430 is arranged on a third plane that is not perpendicular with the first plane and the second plane. In one embodiment, an angle formed by the intersection of the third plane with the first plane or the second plane is user adjustable.

In one embodiment, third RF coil element 1430 is offset from the first RF coil element 1310 or the second RF coil element 1320 a non-zero amount along a y axis or a z axis. For example, the first RF coil element 1310 and second RF coil element 1320 may be located 30 cm from each other in the x axis, and laterally offset 3 cm in the y axis. The third RF coil element 1430 may be laterally offset 2 cm in the z axis from the first RF coil element 1310 and the second RF coil element 1320. In other embodiments, other offsets may be employed.

Third RF coil element 1430, like first RF coil element 1310 and second RF coil element 1320, may include an MRI RF coil element described herein, including MRI RF coil elements 600, 800, 900, 1000, 1100, 1200, or 1500. While three RF coil elements are illustrated, in another embodiment, other, different numbers of RF coil elements may be employed.

In one embodiment of single-layer MRI RF array coil 1400, a member of the at least three RF coil elements (e.g. first RF coil element 1310, second RF coil element 1320, third RF coil element 1430) includes an LC coil, a matching and transmit (Tx)/receive (Rx) switch circuit, and a preamplifier. In this embodiment, the LC coil includes at least one inductor and at least one capacitor. The at least one inductor and the at least one capacitor resonate at a first frequency. The matching and Tx/Rx switch circuit, when operating in Tx mode, electrically isolates the LC coil from the preamplifier upon the LC coil resonating with a primary coil at the first frequency. The LC coil, upon resonating with the primary coil at the first frequency, generates a local amplified Tx field based on an induced current in the LC coil. A magnitude of the induced current or a phase of the induced current is independently adjustable. The matching and Tx/Rx switch circuit, when operating in Rx mode, electrically connects the LC coil with the preamplifier. In one embodiment, the matching and Tx/Rx switch circuit is a capacitive matching and Tx/Rx switch circuit. In another embodiment, the matching and Tx/Rx switch circuit is an inductive matching and Tx/Rx switch circuit. In one embodiment, the LC coil includes a shunt PIN diode or protection PIN diode that provides further shunt protection to the preamplifier.

Embodiments described herein may also be described using a mode approach. For example, two identical coils facing each other may both resonate at the same frequency if the other coil does not exist. Due to mutual inductance the two coils create two intrinsic resonant modes. The first mode is the lower frequency mode which is called saddle mode or co-rotation mode, where both coils' currents flow in the same direction. The other mode has a higher frequency and is called anti-saddle mode or counter-rotation mode in which the currents of the coils flow in opposite directions. If a uniform external field or a circular polarized uniform external field is applied to the coils, only the saddle mode configuration will have induced voltage because its net flux is non-zero while the anti-saddle mode's net flux is zero. As a result two identical coils, or coils having sufficient similarity, facing each other will generate an amplified B1 field by the local saddle mode which has a level of uniformity suitable for clinical use. The external uniform field serves as a selector for modes. The larger the net magnetic flux the mode has, the more energy from the external field is coupled.

This discussion can also be extended to embodiments that employ a plurality of MRI RF coil elements. For example, in an embodiment with N coil elements in which some or all of the N coil elements' isolations may not be good (i.e., the isolation may not be within a threshold tolerance), the N coil elements will couple to each other and create M Eigen-resonant modes in which a mode is a sum of some or all coil elements with different weighting coefficients and phases, where N and M are integers. In this embodiment, a mode is excited proportionally by the net magnetic flux of each mode from the WBC. The most uniform mode among all modes has the largest net magnetic flux from the WBC. For example, a two-element embodiment will be more uniform among modes. Therefore, the most uniform mode among the modes is the strongest mode excited by the WBC. If other less uniform modes' net magnetic fluxes from the WBC are not zero, they will be also excited but the induced fields from them are weaker than the most uniform mode, on average. The other less uniform modes make the final combined induced field more uniform than the induced field from the most uniform mode only. Thus, the final combined induced field is sufficiently uniform for use in clinical MRI applications, including MRI procedures for imaging different anatomies.

In summary, a plurality of single-layer MRI RF coils or MRI RF coil elements configured as a single-layer MRI RF coil array, resonating with a WBC coil in Tx mode will induce a local amplified Tx field. A coil array element may have the magnitude and phase of an induced current adjusted independently of another, different coil array element. The local amplified Tx field has a threshold level of uniformity and the single-layer MRI RF coil array is used as a transmitter coil. This amplified Tx field improves the WBC power efficiency and reduces the SAR compared to conventional approaches because non-related anatomy areas will not experience a high Tx field from the WBC. Because the Tx field is adjustable via independent phase or magnitude control, a region of tissue being imaged may be subjected to a more uniform Tx field at different locations within the region of tissue. In one embodiment, MRI RF array coils that connect to an MRI system can be connected through cables or may be connected wirelessly with no cables.

Embodiments described herein are configured such that the magnitude of the induced current or the phase of the induced current is variable over a range of magnitudes or phases respectively. Example embodiments adjust the magnitude and phase of the induced current $i_s$ of a coil in Tx mode such that the image quality is still acceptable for clinical MRI. When a single-layer MRI RF coil array operates in Rx mode, it operates as a phased array receiving coil with a frequency tuned to the working frequency for optimum SNR. Embodiments described herein provide magnitude and phase adjustment for an RF coil operating in Tx mode. Different approaches to adjust a coil's magnitude and phase are now described herein.

Recall from equation 3 that the local inductively coupled coil current can be written as:

$$i_s = \frac{-j\omega M \varepsilon}{(R_p R_s + \omega^2 M^2)} \quad \text{(Eq. 3.1)}$$

where $i_s$ is the induced current of local RF coil, $R_p$ is the coil loss resistance of the WBC, $R_s$ is the coil loss resistance of the local RF coil, M is the mutual inductance between the WBC and the local RF coil and e is the driving voltage of the WBC. The Eq. 3.1 immediately above assumes that both the WBC and the local RF coil resonate at the same working frequency. Because the local coil is smaller than the WBC, the magnetic field generated by $i_s$ is significantly larger than the magnetic field generated from the WBC. Therefore the Tx field is dominated by the local coil. The WBC is part of the MRI system and its frequency is fixed at the nominal working frequency. Typically, the working frequency of the WBC cannot be changed, and typically, a WBC cannot be removed from an MRI system in normal clinical practice.

Embodiments are configured to adjust the magnitude and phase of the induced $i_s$ of a coil (e.g., a loop, a coil array element) in a single-layer MRI RF coil array while operating in Tx mode. When a coil in a single-layer MRI RF coil array is operating in Rx mode, the single-layer MRI RF coil array operates as a phased array Rx coil where a coil's frequency is tuned to the working frequency for optimum SNR.

Figure 15:
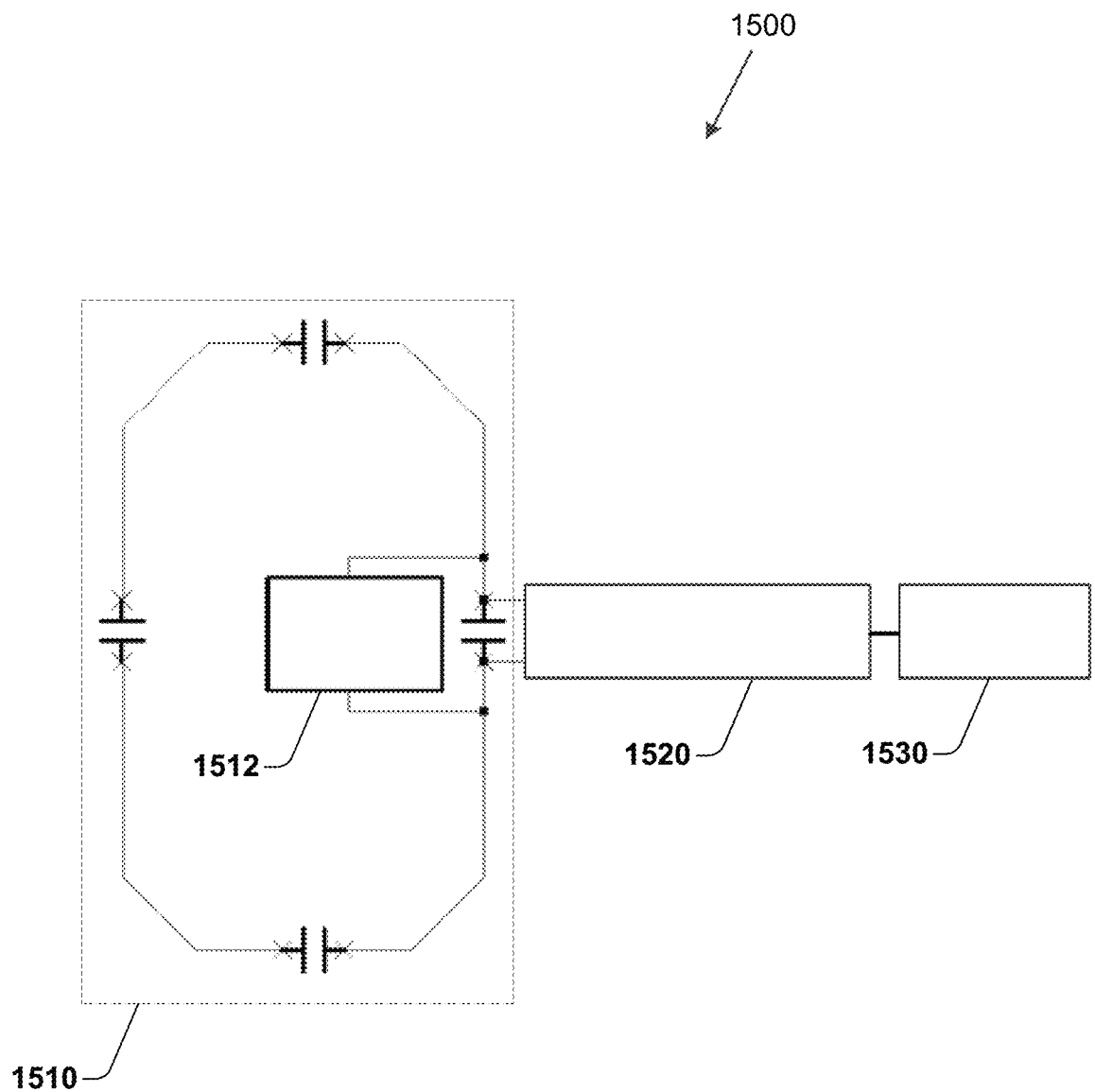
FIG. 15 illustrates an example single-layer MRI RF coil element.

FIG. 15 illustrates an example single-layer MRI RF coil array element 1500 configured to operate in a Tx mode and an Rx mode. Single-layer MRI RF coil array element 1500 includes an LC coil 1510, a matching and Tx/Rx switch circuit 1520 operably connected to the LC coil 1510, and a preamplifier or other Rx electronics 1530 operably connected to the matching and Tx/Rx circuit 1520. LC coil 1510 further includes a magnitude/phase control component 1512 operably connected to LC coil 1510.

LC coil 1510 includes at least one inductor and at least one capacitor, where the at least one inductor and the at least one capacitor resonate at a first frequency. The first frequency may be, for example, the working frequency. In one embodiment, LC coil 1510 may be configured as LC coil 610 illustrated in FIG. 6, 8, 9, or 10. In another embodiment, LC coil 1510 may be configured as LC coil 1110 as illustrated in FIG. 11 or 12.

In one embodiment, LC coil 1510 includes at least one conductor. The at least one conductor may be a flexible co-axial cable. Thus, LC coil 1510 may be configured as a flexible LC coil, and single-layer MRI RF coil array element 1500 may be configured as a flexible single-layer MRI RF coil array element.

The matching and Tx/Rx switch circuit 1520, when operating in Tx mode, electrically isolates LC coil 1510 from preamplifier 1530 upon LC coil 1510 resonating with a primary coil (not illustrated). The primary coil has a working frequency.

In one embodiment, the matching and Tx/Rx switch circuit 1520 is a capacitive matching and Tx/Rx switch circuit. For example, matching and Tx/Rx switch circuit 1520 may be configured as matching and Tx/Rx switch circuit 820 illustrated in FIG. 8. In another embodiment, matching and Tx/Rx switch circuit 1520 may be configured as matching and Tx/Rx switch circuit 920 illustrated in FIG. 9. In another embodiment, matching and Tx/Rx switch circuit 1520 may be configured using other, different matching and Tx/Rx switch circuitry configurations.

LC coil 1510, upon resonating with the primary coil, generates a local amplified Tx field based on an induced current in LC coil 1510. The induced current is generated by inductive coupling between LC coil 1510 and the primary coil. A magnitude of the induced current or a phase of the induced current is independently adjustable. The magnitude of the induced current or the phase of the induced current is configured to be varied over a range of magnitudes or phases respectively.

The matching and Tx/Rx switch circuit 1520, when operating in Rx mode, electrically connects LC coil 1510 with preamplifier 1530.

Magnitude/phase control component 1512 is configured to adjust the magnitude of the induced current or the phase of the induced current. In one embodiment, magnitude/phase control component 1512 is configured to, upon single-layer MRI RF coil array element 1500 operating in Tx mode, adjust the magnitude of the induced current or the phase of the induced current by shifting the first frequency of LC coil 1510 relative to the working frequency of the primary coil. For example, in one embodiment, magnitude/phase control component 1512 is configured to use a first approach to adjust a magnitude of the induced current or the phase of the induced current by shifting the MR coil's (e.g., LC coil 1510) resonant frequency from the working frequency of the WBC. Recall that the induced current $i_s$ may be expressed as:

$$i_s = \frac{-j\omega M \varepsilon}{\left(R_p R_s + \omega^2 M^2 + jR_p\left(\omega L_s - \frac{1}{\omega C_s}\right)\right)} \quad \text{(Eq. 4)}$$

where there is an additional term $$jR_p\left(\omega L_s - \frac{1}{\omega C_s}\right)$$

in the denominator.

If the coil frequency is same as the working frequency, this additional term is zero. Example embodiments adjust this new term by changing the frequency to either higher than the working frequency or lower than the working frequency. This facilitates adjusting the magnitude and phase of the induced current $i_s$ simultaneously. If the magnitude and phase of $i_s$ are changed, the magnitude and phase of the induced field is also changed. Thus we have a coil that is a pTx-equivalent coil. Eq. 4 changes magnitude and phase simultaneously. In some situations, it may be desirable to have additional freedom to control magnitude and phase independently. Embodiments facilitate controlling the magnitude and phase of the induced current independently.

In another embodiment, magnitude/phase control component 1512 is configured to use a second approach to adjust a coil's magnitude and phase by independently adding additional coil loss (i.e., resistance) when operating in Tx mode. For example, in one embodiment, the magnitude/phase control component 1512 is configured to, upon the single-layer MRI RF coil array element 1500 operating in Tx mode, adjust the magnitude of the induced current or the phase of the induced current by adding coil loss to the LC coil 1510. In this embodiment, the magnitude/phase control component 1512 comprises a resistor and a PIN diode connected in parallel with the at least one capacitor, where the single-layer MRI RF coil array element 1500 operates in Tx mode upon the injection of a DC bias into the PIN diode, where the DC bias forward biases the PIN diode.

Figure 16:
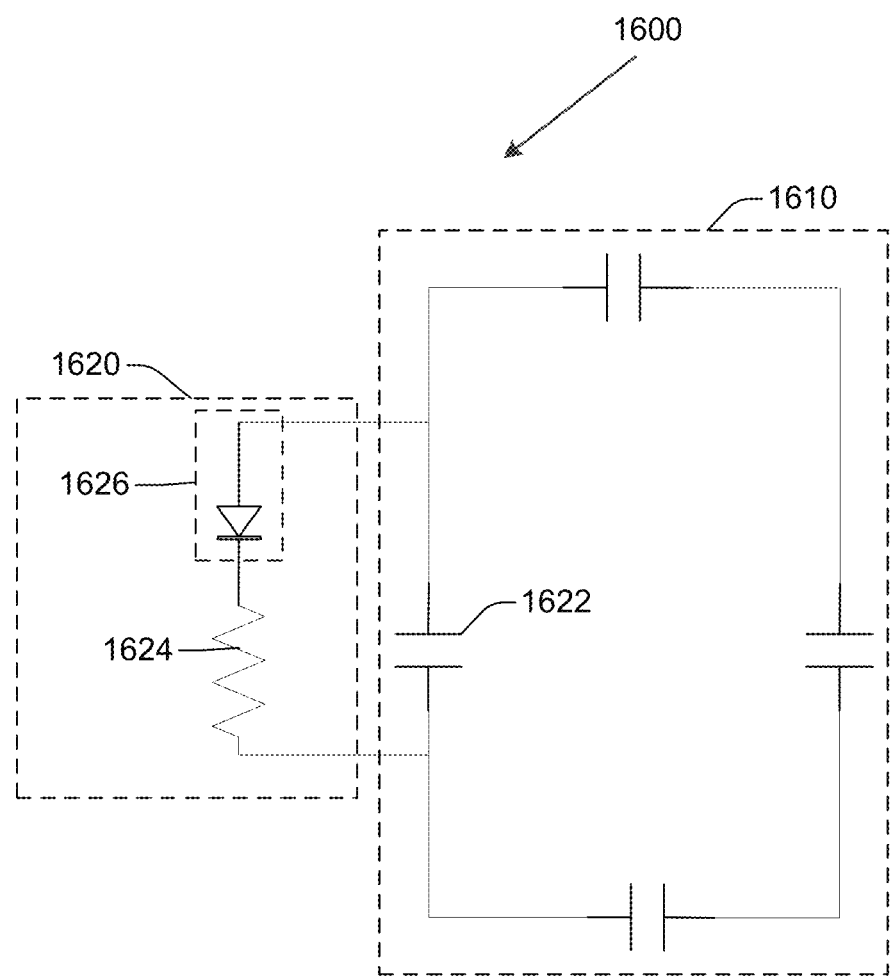
FIG. 16 illustrates an example single-layer MRI RF coil element.

This second approach includes increasing $R_s$ when operating in Tx mode. Increasing $R_s$ reduces the magnitude alone if the coil's resonant frequency is the same as the working frequency. Increasing $R_s$ reduces both magnitude and phase if the coil's resonant frequency and the working frequency are different. One example implementation of this second approach is illustrated in FIG. 16, which includes adding coil loss. In this embodiment, the single-layer MRI RF coil array element 1600 includes a magnitude/phase control component 1620, and LC coil 1610 that includes one or more breaking point capacitors 1622. A resistor 1624 is added in parallel to the capacitor 1622 through a PIN diode 1626. Matching and Rx/Tx switch circuit 1520 and preamplifier 1530 are not illustrated for clarity. The breaking point can also be a feeding point, i.e., a matching capacitor. In Tx mode the PIN diode 1626 is shorted and the resistor 1624 is in parallel with capacitor 1622, which causes $R_s$ to increase. The value of $R_s$ may be chosen to meet particular magnitude and phase requirements for imaging different anatomical regions. The resistor 1624 is configured to be powerful enough to take a high current in Tx mode. For example, resistors having resistance within the kilo-Ohms range may be employed to reduce current magnitude significantly. The smaller the resistor value, the lesser the current magnitude, and the lower the coil Q in Tx mode. In Rx mode the PIN diode 1626 is open, and the resistor 1624 is therefore not part of the coil resistance. This still results in a high Q receiving coil.

In another embodiment, the magnitude/phase control component 1512 is configured to, upon the single-layer MRI RF coil array element 1500 operating in Tx mode, adjust the magnitude of the induced current or the phase of the induced current by decreasing the induced current. In this embodiment, the magnitude/phase control component 1512 is configured to decrease the induced current by operating as a parallel resonant circuit when in Tx mode. In this embodiment, the magnitude/phase control component 1512 comprises an inductor and a PIN diode connected in parallel with a first member of the at least one capacitor, where the first member of the at least one capacitor has a higher capacitance than a second, different member of the at least one capacitor, where the single-layer MRI RF coil array element operates in Tx mode upon the injection of a DC bias into the PIN diode, where the DC bias forward biases the PIN diode. In one embodiment, the magnitude/phase control component 1512 introduces a blocking impedance of less than one-hundred Ohms to the LC coil when operating in Tx mode.

Figure 17:
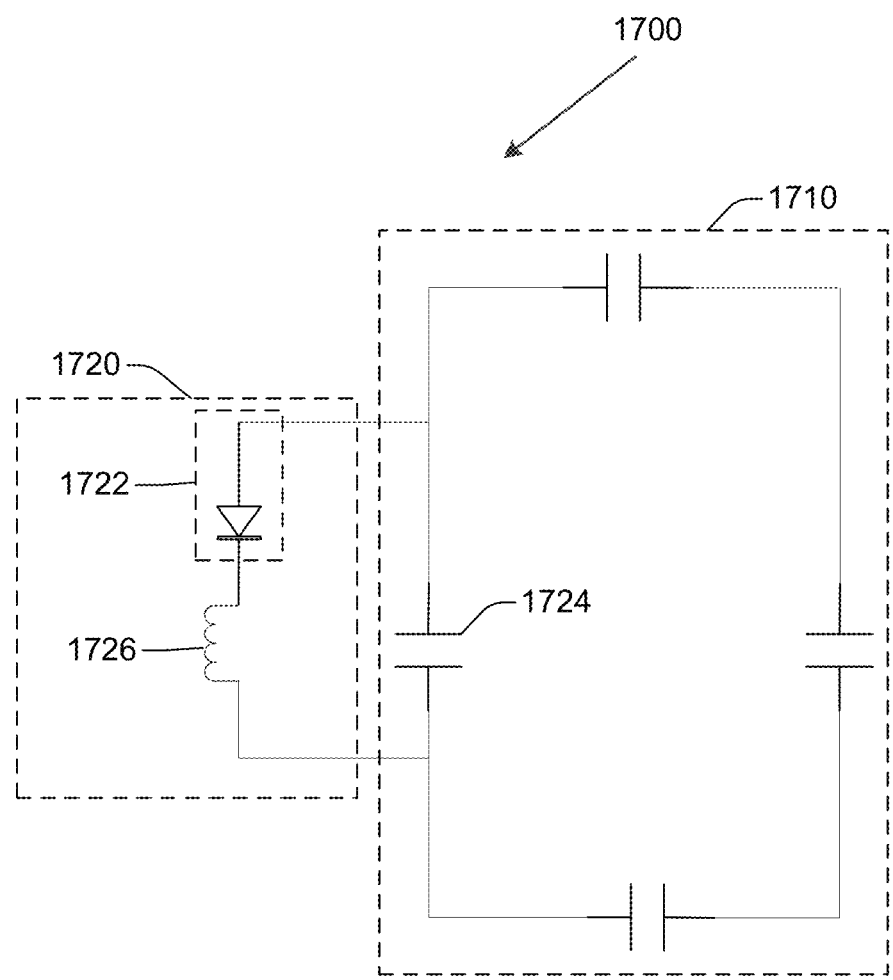
FIG. 17 illustrates an example single-layer MRI RF coil element.

For example, in one embodiment, magnitude/phase control component 1512 is configured to use a third approach that includes introducing a parallel resonant circuit in the coil when operating in Tx mode only. One example implementation of this third approach is illustrated in FIG. 17. FIG. 17 illustrates a single-layer MRI RF coil array element 1700 that includes LC coil 1710, and magnitude/phase control component 1720. Magnitude/phase control component 1720 is configured as an LC parallel resonant circuit. Magnitude/phase control component 1720 includes a PIN diode 1722 that controls magnitude/phase control component 1720 to minimize the induced current in a coil 1710 when operating in Tx mode. Typically, the blocking impedance of magnitude/phase control component 1720 when operating in Tx mode as an LC parallel resonant circuit is very large, e.g., several kOhm. This impedance almost completely eliminates the induced current in coil 1710. Example embodiments may still need to use the induced current. Thus, example embodiments may reduce current magnitude, but do not need to almost completely eliminate the current. Therefore example embodiments may employ a weak blocking impedance of several Ohms to tens of Ohms, instead of a strong blocking impedance of several kOhms. Example embodiments may use a capacitor 1724 having a large value of capacitance and inductor 1726 having a small value of inductance to resonate. This parallel resonant circuit 1720 can be installed anywhere in the coil 1710 to reduce the induced current in Tx mode only. Recalling that $$i_s = \frac{-j\omega M \varepsilon}{(R_p R_s + \omega^2 M^2)}$$

and Eq. 4, example embodiments thus facilitate controlling current magnitude by changing the value of $R_s$. In Rx mode the PIN diode 1722 is open. In one embodiment, example embodiments may reduce the current magnitude such that the single-layer MRI RF coil is operating in a non-amplified Tx mode.

Figure 18:
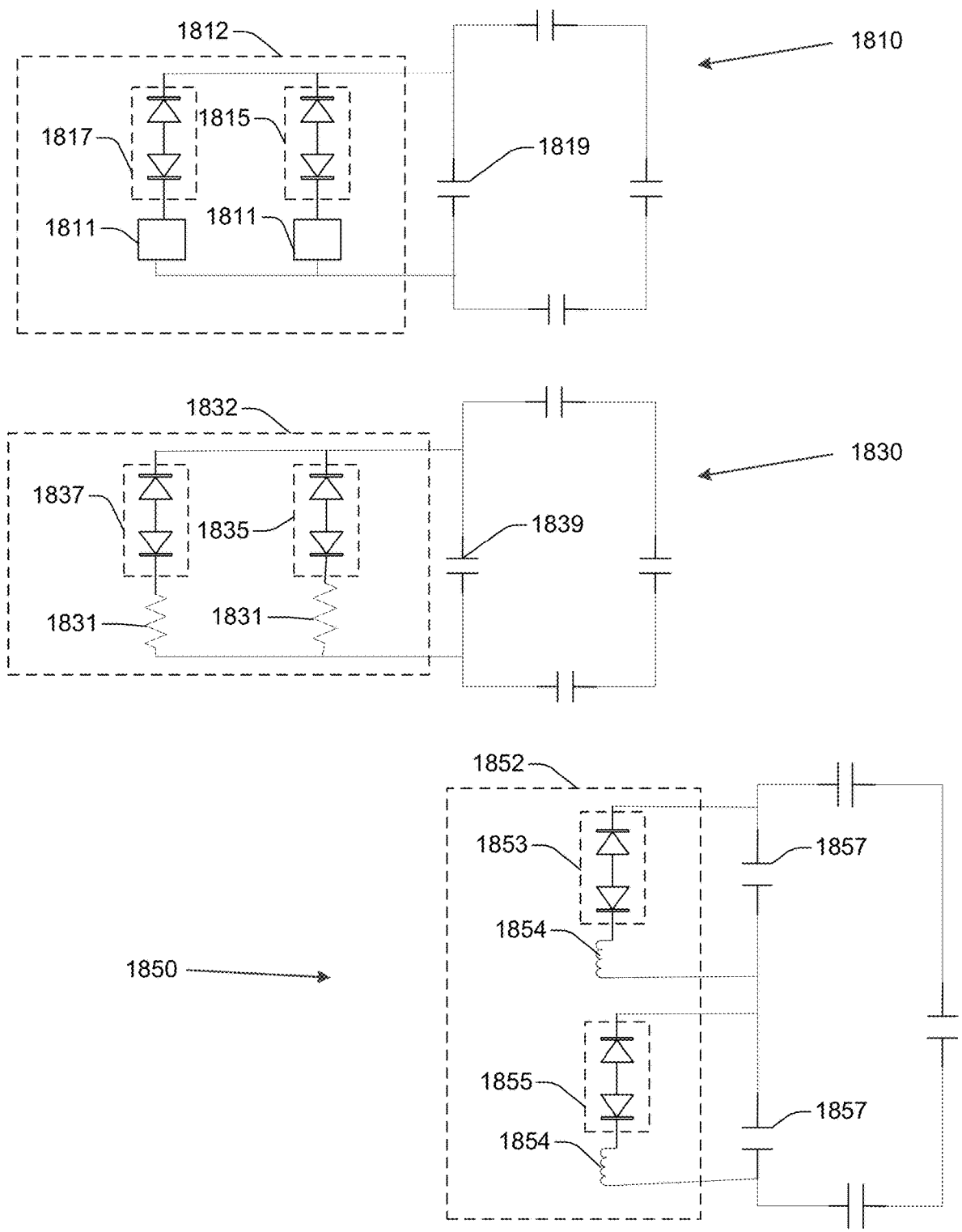
FIG. 18 illustrates example single-layer MRI RF coil elements.

The three approaches to adjust a coil's magnitude and phase described above may be employed together to create a mode selection approach for different induced current magnitudes and phases for the same coil in Tx mode. This approach is shown in FIG. 18. FIG. 18 illustrates single-layer MRI RF coil array elements 1810, 1830, and 1850. For clarity of illustration, FIG. 18 does not include matching and Tx/Rx switch circuitry or a preamplifier or other Rx electronics. FIG. 18 illustrates magnitude/phase control components 1812, 1832, and 1852 which are configured to provide two mode switching. Mode switching is conducted by applying a bias to PIN diode pairs 1815 and 1817, 1835 and 1837, or 1853 and 1855. Each of PIN diode pairs 1815 and 1817, 1835 and 1837, or 1853 and 1855 includes a pair of back-to-back PIN diodes. In other embodiments, three or more modes switching may be implemented by adding more back to back diodes into the path. The back to back diodes in PIN diode pairs 1815 and 1817, 1835 and 1837, or 1853 and 1855 have reverse polarization from each other. The PIN diodes' breakdown voltage may be greater than the induced voltage across the capacitor 1819, 1839, or 1857 respectively when operating in Tx mode. In Tx mode only one pair of diodes (e.g., either PIN diode pair 1815 or PIN diode pair 1817) will be ON (short). For example, PIN diode pair 1815 can be ON(short) and PIN diode pair 1817 can be OFF (open) or vice versa in Tx mode. The PIN diode pair 1815 pair path and the PIN diode pair 1817 pair path will have different induced magnitude and phase. These different magnitudes and phases may be used for different purposes depending on particular clinical scanning requirements. If one of the PIN diode pairs is not ON while the other one is ON, the breakdown voltage that is greater than the induced voltage across the capacitor will ensure the not-ON PIN diode pair path is not part of the coil and the pair of PIN diodes survives the currents generated when operating in Tx mode. The approach may be expanded to more than two modes, such as three modes, four modes, or more modes.

Magnitude/phase control component 1812 is configured to provide control of two different switchable magnitudes and phases by frequency shifting using reactance. Reactance components 1811 may include a capacitor or an inductor.

Magnitude/phase control component 1832 is configured to provide control of two different switchable magnitudes and phases using coil losses generated with the resistor-based approach described with respect to FIG. 16. Thus, magnitude/phase control component 1832 is similar to magnitude/phase control component 1812, but includes resistors 1831 instead of reactance components 1811.

Magnitude/phase control component 1852 is configured to provide control of two different switchable magnitudes and phases control using coil loss produced by LC parallel resonance. Magnitude/phase control component 1852 includes PIN diode pairs 1853 and 1855, and inductors 1854. One exemplary LC parallel resonance approach is described with respect to FIG. 17 which may be extended to the embodiment illustrated in FIG. 18.

Example embodiments thus provide circuits, components, means, or techniques to facilitate independent magnitude and phase control for an MRI RF coil by solving the magnitude and phase equation with the controllable variables as described above. Furthermore, example embodiments facilitate choosing more than one different magnitude and phase combination, i.e., more than one different Tx field pattern for different scanning or different anatomical region imaging requirements. In embodiments described herein, these approaches create Tx fields in Tx mode. In Rx mode, coils described herein operate as a phased array coil at the nominal working frequency.

Figure 19:
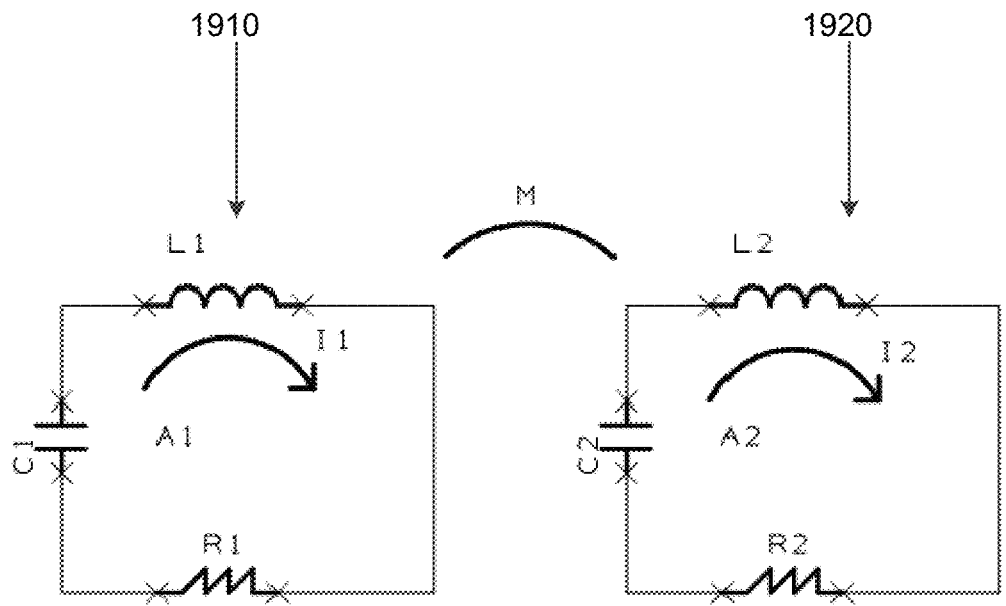
FIG. 19 illustrates inductively coupled resonant RF coils.

In addition to an induced current from a WBC field, an MRI RF coil array element as described herein may experience induced current from other MRI RF coil array elements due to non-trivial mutual inductance among the MRF RF coil array element and the other MRI RF coil array elements. FIG. 19 demonstrates this induced current. Two MRI RF coil array elements 1910 and 1920 are exposed in a uniform $B_1$ field of a WBC are shown in FIG. 19. In this example, the uniform $B_1$ field is perpendicular to MRI RF coil array elements 1910 and 1920. The two coil elements 1910 and 1920 have areas A1 and A2 respectively. The two coil elements 1910 and 1920 have non-trivial mutual inductance between them. The self inductances L1 and L2, capacitances C1 and C2, coil losses R1 and R2, current flow I1 and I2, and projected areas A1 and A2 for coil elements 1910 and 1920 respectively are illustrated as shown in FIG. 19.

From FIG. 19, equations 19 and 20 may be defined:

$$j\omega_0 B_1 A_1 = j\omega_0 L_1 I_1 + \frac{1}{j\omega_0 C_1} I_1 + R_1 I_1 + j\omega_0 M I_2 \qquad \text{Eq. 19}$$

$$j\omega_0 B_1 A_2 = j\omega_0 L_2 I_2 + \frac{1}{j\omega_0 C_2} I_2 + R_2 I_2 + j\omega_0 M I_1 \qquad \text{Eq. 20}$$

In one embodiment, assuming that both coil 1910 and coil 1920 also resonate at $\omega_0$ in Tx mode, then Eq. 19(3) and 20(4) can be simplified as below:

$$j\omega_0 B_1 A_1 = R_1 I_1 + j\omega_0 M I_2 \qquad \text{Eq. 21}$$

$$j\omega_0 B_1 A_2 = R_2 I_2 + j\omega_0 M I_1 \qquad \text{Eq. 22}$$

Solving equations 21 and 22 results in:

$$I_1 = \frac{j\omega_0 B_1 A_1 - j\omega_0 B_1 A_2 \frac{j\omega_0 M}{R_2}}{\frac{(\omega_0 M)^2}{R_2} + R_1} \qquad \text{Eq. 23}$$

$$I_2 = \frac{j\omega_0 B_1 A_2 - j\omega_0 B_1 A_1 \frac{j\omega_0 M}{R_1}}{\frac{(\omega_0 M)^2}{R_1} + R_2} \qquad \text{Eq. 24}$$

If mutual inductance is not trivial, i.e., $\omega_0 M \gg R_1$ and $R_2$, and if the values $A_1$ and $A_2$ are not significantly different, then Eq. 23 and 24 can be simplified as:

$$I_1 \cong \frac{-j\omega_0 B_1 A_2 \frac{j\omega_0 M}{R_2}}{\frac{(\omega_0 M)^2}{R_2} + R_1} \qquad \text{Eq. 25}$$

$$I_2 \cong \frac{-j\omega_0 B_1 A_1 \frac{j\omega_0 M}{R_1}}{\frac{(\omega_0 M)^2}{R_1} + R_2} \qquad \text{Eq. 26}$$

Thus, $I_1$ is determined by the WBC induced voltage in coil 1920, that is, by its neighbor coil 1910 instead of itself coil 1920 itself, and vice versa. Consequently, the local mutual inductance coupled modes among local array coils are dominant if the mutual inductances are not trivial. Therefore, the final induced field of the array coils (e.g., 1910 and 1920) from the WBC is the sum of the WBC induced fields from coils with trivial mutual inductance from other elements and the local coupled modes among the coils having non-trivial mutual inductances. In particular the local coupled modes may have multiple different frequencies and different Tx field patterns. Depending on the application in which coil 1910 and coil 1920 are being employed, (e.g., for a first anatomy, for a second, different anatomy) the correct local coupled mode or modes must be adjusted in such a way that its or their frequencies must be same as the working frequency $\omega_0$.

Example single-layer MRI RF coil arrays, coil array elements, coils, apparatus, systems, methods, or other embodiments may be configured for imaging different anatomical locations using the single-layer approach described herein. Example embodiments provide a universal approach to amplifying a WBC Tx field that is applied to different anatomies. For example, embodiments described herein may be configured to image head anatomy as a head coil. Example embodiments may also be used for head and neck or neurovascular imaging as a head/neck coil. Example embodiments may be configured for shoulder imaging as a shoulder coil. Example embodiments may be configured for cardiac applications as a cardiac, torso, pelvis, or prostate coil. Example embodiments may be configured for knee, arm, or leg anatomy as a knee, arm, or leg coil. Example embodiments may be configured for spinal imaging as a spine coil. Example embodiments may be configured as knee/foot coil. Example embodiments may be configured as a foot coil. Example embodiments may be configured for hand/wrist imaging as a hand/wrist coil. Example embodiments may be configured for breast imaging as a breast coil. Example embodiments may be configured as a multipurpose flexible coil. Example embodiments may be used to image other regions of interest using other types of coil that employ single layer approaches described herein.

Embodiments include a single layer MRI RF coil array configured to operate in a Tx mode or in a Rx mode. The single-layer MRI RF coil array includes a plurality of rows configured in an anatomy-specific shape. A row includes a plurality of RF coil elements. An RF coil element includes an LC coil, a matching and Tx/Rx switch circuit operably connected to the LC coil, a preamplifier operably connected to the matching and Tx/Rx circuit, and a magnitude/phase control component operably connected to the LC coil. The LC coil includes at least one inductor and at least one capacitor. The at least one inductor and the at least one capacitor resonate at a first frequency. In one embodiment, an RF coil element is configured as a loop coil or a saddle coil. In one embodiment, the LC coil includes at least one conductor. The at least one conductor may be, in one embodiment, a flexible co-axial cable.

The matching and Tx/Rx switch circuit, when operating in Tx mode, electrically isolates the LC coil from the preamplifier upon the LC coil resonating with a primary coil at a working frequency of the primary coil. The LC coil, upon resonating with the primary coil at the working frequency of the primary coil, generates a local amplified Tx field based on an induced current in the LC coil. In one embodiment, the primary coil is a whole body coil (WBC). A magnitude of the induced current or a phase of the induced current is independently adjustable. The magnitude of the induced current or the phase of the induced current is configured to be varied over a range of magnitudes or phases respectively.

In one embodiment, the magnitude of the induced current or the phase of the induced current is selectable from a set of pre-set values. In this embodiment, a user may select a pre-set magnitude or phase from a selection of pre-set magnitudes and phases. A pre-set magnitude and phase may be configured for imaging different anatomies. For example, a first pre-set magnitude and phase may be configured for imaging an adult human knee, while a second pre-set magnitude and phase may be configured for imaging an infant human knee. Other pre-set magnitudes and phases may be employed.

The matching and Tx/Rx switch circuit, when operating in Rx mode, electrically connects the LC coil with the preamplifier. In one embodiment, the matching and Tx/Rx switch circuit is a capacitive matching and Tx/Rx switch circuit. In another embodiment, the matching and Tx/Rx switch circuit is an inductive matching and Tx/Rx switch circuit.

The magnitude/phase control component is configured to adjust the magnitude of the induced current or the phase of the induced current. The magnitude of the induced current or the phase of the induced current of a first RF coil element is independently adjustable from the magnitude of an induced current or the phase of the induced current in a second, different RF coil element. In one embodiment, the magnitude of the induced current of the phase of the induced current is a function of a coil loss resistance of the primary coil. In another embodiment, the magnitude of the induced current of the phase of the induced current is a function of the coil loss resistance of the at least one MRI RF coil element. In another embodiment, the magnitude of the induced current of the phase of the induced current is a function of a difference between the working frequency of the primary coil and the first frequency.

In one embodiment, the single-layer MRI RF coil array further includes a shunt PIN diode. The shunt PIN diode has a first terminal connected to a first input terminal of the preamplifier, and a second terminal connected to a second input terminal of the preamplifier. In this embodiment, upon application of a forward bias to the shunt PIN diode, the shunt PIN diode provides shunt protection to the preamplifier.

When operating in Rx mode, members of the plurality of RF coil elements are configured to operate as a coil array, in which the resonant frequency of the coil array is the same as the working frequency of the primary coil. At lower frequencies (e.g., 3T or lower), the Q factor of a member of the plurality of RF coil elements may be high, such that mutual inductance among members of the plurality of RF coil elements is not trivial. Local coupled modes may be chosen for a desired imaging application (e.g., knee/arm/elbow). For example, if a uniform Tx field is desired for a particular imaging application, the uniform coupled frequency will be set at the working frequency or within a threshold of the working frequency when operating in Tx mode. One example includes a coil array configured with two loops facing each other. Each loop is one channel. In this example, the two loop sizes are different instead of being the same size. As a result the local coupled modes are dominant. In this example, the co-rotation (uniform) mode frequency will be lower than the working frequency, and the counter-rotation (non-uniform) mode frequency is higher. To achieve a uniform Tx field embodiments set the co-rotation mode frequency at the working frequency or within a threshold of the working frequency in Tx mode. Other embodiments may include 3, 4, or more channels using the same approach.

In one embodiment, the single-layer MRI RF coil array is configured to operate in a non-amplified Tx mode. In a non-amplified Tx mode, the magnitude/phase control component is configured to reduce the magnitude of the induced current such that the single-layer MRI RF coil array effectively does not generate an amplified Tx field. In this embodiment, the single-layer MRI RF coil array may be used in conjunction with a non-single-layer MRI RF coil array to image a larger anatomical region than could be practically imaged by the single-layer MRI RF coil array alone. For example, a single-layer MRI RF coil array configured to image a specific anatomical region (e.g., a knee) may be configured to operate in a non-amplified Tx mode, and used in conjunction with a non-single-layer MRI RF coil array configured to image a thigh located adjacent to the knee. Thus, in this embodiment, the WBC coil operates as the Tx field generator when the single-layer MRI RF coil array is configured to operate in non-amplified Tx mode.

Figure 20:
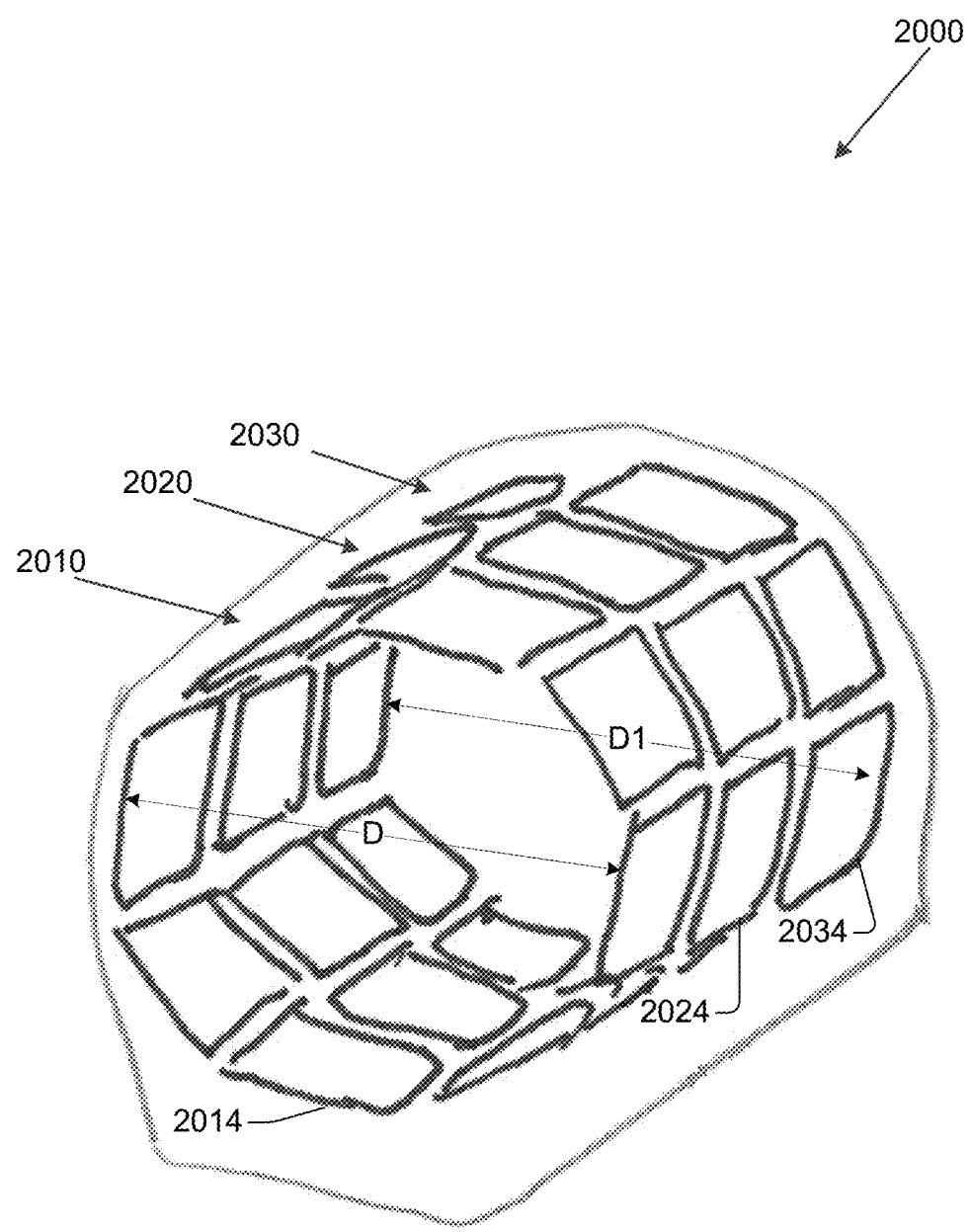
FIG. 20 is a perspective view of an example single-layer MRI RF coil array.

In one embodiment, the single-layer MRI RF coil array is configured for use imaging a human knee, arm or elbow. FIG. 20 illustrates an example embodiment of a single-layer MRI RF coil array 2000 configured for use imaging a human knee, arm or elbow. In single-layer MRI RF coil array 2000, the plurality of rows is configured in an anatomy-specific shape configured to image a human knee, arm or elbow. Single-layer MRI RF coil array 2000 may be operably connected with an MRI system (not illustrated for clarity).

In one embodiment of single-layer MRI RF coil array 2000, the anatomy-specific shape is a cylindrical shape configured to define a volume conforming to the knee, arm, or leg. In one embodiment, the cylindrical shape has a constant diameter. For example, in FIG. 20, the cylindrical shape has a diameter D at a first end, and a diameter D1 at a second end, where D=D1. In one embodiment, D has a value of, for example, 15 cm. In another embodiment, D has a value of 22 cm. In another embodiment, D may have another, different value suitable for conforming to a human knee, arm, or leg.

In another embodiment of single-layer MRI RF coil array 2000, the anatomy-specific shape is a truncated cone shape configured to define a volume conforming to the knee, arm, or leg. In this embodiment, the truncated cone shape has a first diameter D at a first end, and a second, different diameter D1 at a second, different end, where D does not equal D1. For example, in one embodiment a first diameter D may be chosen to receive a lower thigh, and a second diameter D1 may be chosen to accommodate an upper calf. In this example, D may equal 22 cm and D1 may equal 17 cm. In another embodiment, D and D1 may have other, different values.

In one embodiment of single-layer MRI RF coil array 2000, the plurality of rows comprises three rows of RF coil elements. For example, in this embodiment, the plurality of rows includes row 2010, row 2020, and row 2030. In this embodiment, a row has eight RF coil elements. In this embodiment, row 2010 may include eight RF coil elements 2014, row 2020 may include eight RF coil elements 2024, and row 2030 may include eight RF coil elements 2034. In one embodiment, RF coil elements 2014, 2024, or 2034 may be configured as single-layer MRI RF coil elements described herein, including single-layer MRI RF coil element 600, 800, 900, 1000, 1100, 1200, or 1500. RF coil elements 2014, 2024, or 2034 may be configured as loop coils or saddle coils. In this embodiment, single-layer MRI RF coil array 2000 is configured as a 3×8 channel coil array. In this embodiment, rows 2010, 2020, and 2030 are illustrated as aligned with each other. In another embodiment, row 2010, row 2020, or row 2030 may be shifted azimuthally. For example, in one embodiment, row 2020 may be shifted azimuthally 22.5 degrees. In another embodiment, row 2010, 2020, or 2030 may be shifted another amount. While in this example, MRI RF coil array 2000 includes three rows having eight RF coil elements each, in another embodiment, other numbers of rows (e.g., 2, 4, 5), or other numbers of RF coil elements per row (e.g., 6, 7, 9), may be employed.

Figure 21:
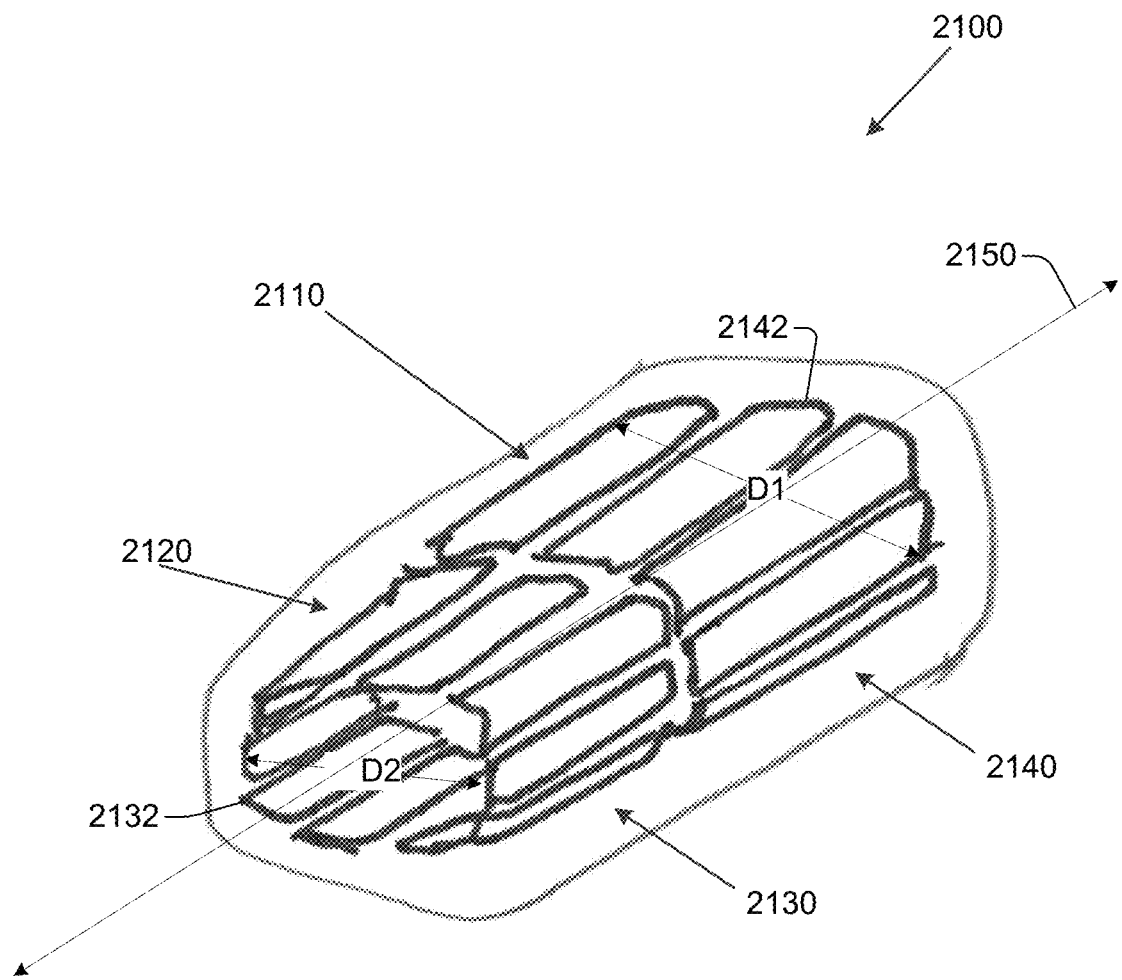
FIG. 21 is a perspective view of an example single-layer MRI RF coil array.

In one embodiment, the single-layer MRI RF coil array is configured for use imaging a human hand or wrist. FIG. 21 illustrates an example embodiment of a single-layer MRI RF coil array 2100 configured for use imaging a human hand or wrist. In this embodiment, the anatomy-specific shape includes a cylindrical shape 2120 configured to define a first volume conforming to the wrist, and an elliptical shape 2110 connected to the cylindrical shape 2120. The elliptical shape 2110 is configured to define a second volume conforming to the hand. A first diameter D1 of the elliptical shape 2110 is greater than a first diameter D2 of the cylindrical shape 2120.

In one embodiment of single-layer MRI RF coil array 2100 the plurality of rows comprises at least two rows. In this example, the at least two rows includes row 2130 and row 2140. In this embodiment, row 2130 has eight RF coil elements 2132 and row 2140 has eight RF coil elements 2142. In one embodiment, RF coil elements 2132 or 2142 may be configured as single-layer MRI RF coil elements described herein, including single-layer MRI RF coil elements 600, 800, 900, 1000, 1100, 1200, or 1500. In this embodiment, single-layer MRI RF coil array 2100 is configured as a 2×8 channel coil array. In this embodiment, row 2130 is aligned with row 2140 about axis 2150. In another embodiment, row 2130 or row 2140 may be rotated a threshold amount (e.g., 5 degrees, 10 degrees, 30 degrees) about axis 2150. While in this example, single-layer MRI RF coil array 2100 includes two rows having eight RF coil elements each, in another embodiment, other numbers of rows, or other number of RF coil elements per row, may be employed.

Figure 22:
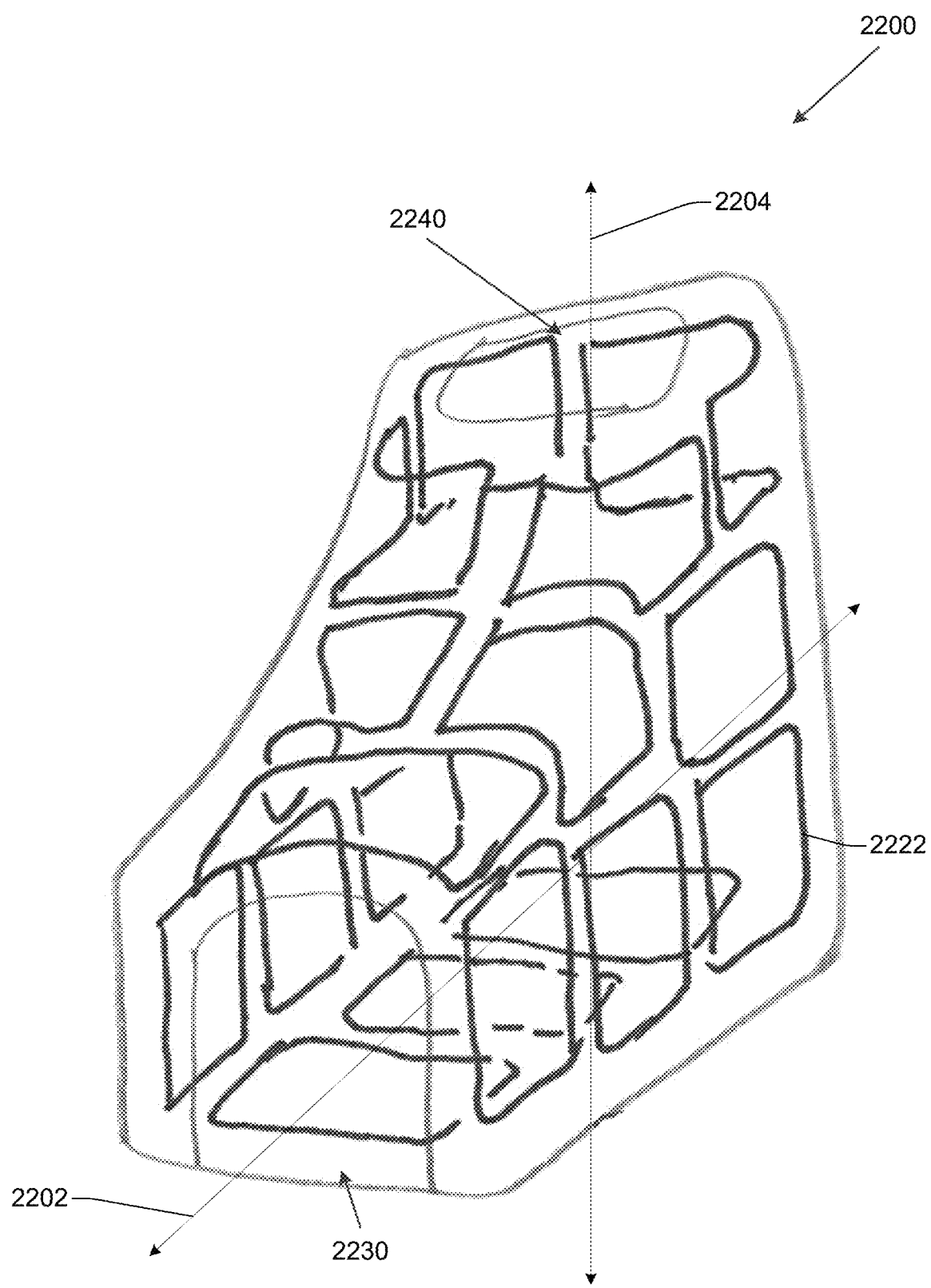
FIG. 22 is a perspective view of an example single-layer MRI RF coil array.

In one embodiment, the single-layer MRI RF coil array is configured for use imaging a human foot or ankle. FIG. 22 illustrates an example embodiment of a single layer MRI RF coil array 2200 configured for use imaging a human foot or ankle. In single-layer MRI RF coil array 2200, the plurality of rows is configured in an anatomy-specific shape configured to image a human foot or ankle. In one embodiment, the plurality of RF coil elements includes at least 16 RF coil elements 2222. In this embodiment, single-layer MRI RF coil array 2200 is configured as a 16 channel coil array. In one embodiment, RF coil elements 2222 may be configured as single-layer MRI RF coil elements described herein, including single-layer MRI RF coil elements 600, 800, 900, 1000, 1100, 1200, or 1500. RF coil elements 2222 may be configured as loop coils or saddle coils. Single-layer MRI RF coil array 2200 may be operably connected with an MRI system (not illustrated for clarity).

In one embodiment, single-layer MRI RF coil array 2200 is configured to operate in one of two imaging transmit modes. A first amplified Tx mode in which single-layer MRI RF coil array 2200 is configured to operate in is to support imaging of a human foot and ankle only with an amplified Tx field when operating in Tx mode. A second, non-amplified Tx mode in which single-layer MRI RF coil array 2200 is configured to operate in is to support imaging of a foot and ankle and calf. In the second, non-amplified Tx mode, single-layer MRI RF coil array 2200 is configured to operate in conjunction with another, different coil, such as a calf coil which may, in one embodiment, not be a single-layer MRI RF coil. In this second mode the foot ankle coil section (e.g., single-layer MRI RF coil array 2200) does not provide an amplified Tx field in Tx mode. For example, the magnitude of an induced current in single-layer MRI RF coil array 2200 may be reduced such that it does not provide an amplified Tx field. This allows the WBC to provide a uniform Tx field for the foot, ankle and calf in Tx mode. One exemplary technique to implement this multimode approach is described with respect to FIG. 18.

In one embodiment of single-layer MRI RF coil array 2200, the anatomy-specific shape includes an L-shaped foot/ankle section configured to define a volume conforming to the ankle and foot. The foot/ankle section is configured as a boot-like structure, where the boot-like structure is configured to receive, through a leg opening 2230, a portion of the leg along a first cylindrical volume disposed along a first axis 2202, and further configured to receive the foot extending transversely with respect to the first axis along a second axis 2204. In one embodiment, the toes of the foot extend through a toe opening 2240.

Conventionally, a first section of a foot/ankle section will experience a much higher Tx field magnitude than a second, different section because the first section may be smaller than the second section. Embodiments described herein facilitate manipulating the Tx of the first section and the second section to obtain a uniform Tx field in both sections by controlling the phase and magnitude of induced currents in the plurality of coil elements. For example, embodiments may manipulate the magnitude or phase of an induced current near the toe opening 2240 to have a different value than the magnitude or phase of an induced current near the leg opening 2230, resulting in a more uniform Tx field than can be achieved by conventional approaches that do not employ single-layer MRI RF coil elements with independently adjustable magnitude and phase.

Figure 23:
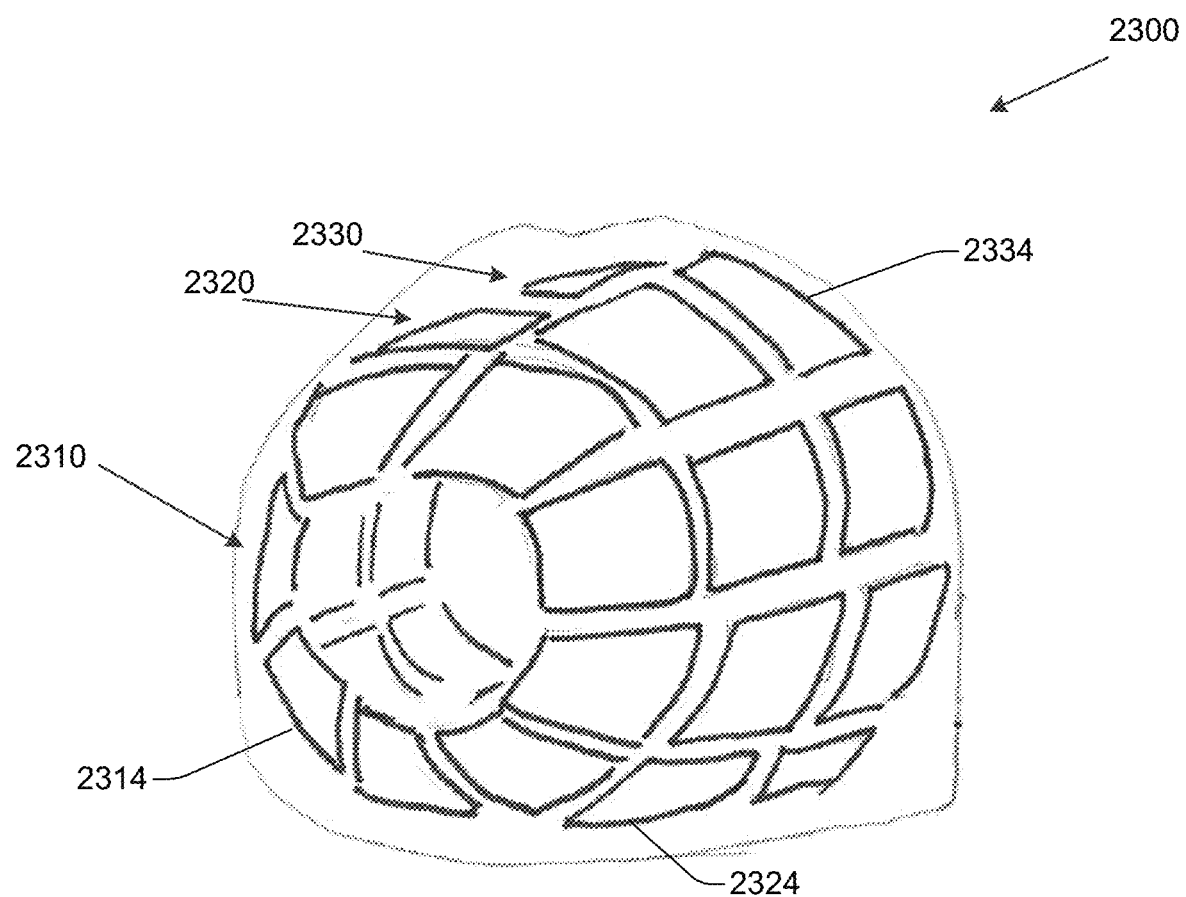
FIG. 23 is a perspective view of an example single-layer MRI RF coil array.

In one embodiment, the single-layer MRI RF coil array is configured for use imaging a human head. FIG. 23 illustrates an example embodiment of a single-layer MRI RF coil array 2300 configured for use imaging a human head. In single-layer MRI RF coil array 2300, the plurality of rows is configured in an anatomy-specific shape configured to image a human head. In this embodiment, the anatomy specific shape includes a domed shape configured to define a volume conforming to the human head. In one embodiment, the plurality of rows includes at least two rows, where a row has at least four RF coil elements. In one embodiment, the plurality of rows includes three rows 2310, 2320, and 2330. In this embodiment, each row has eight RF coil elements 2314, 2324, and 2334. In one embodiment, RF coil elements 2314, 2324, or 2334 may be configured as single-layer MRI RF coil elements described herein, including MRI RF coil element 600, 800, 900, 1000, 1100, 1200, or 1500. In this embodiment, single-layer MRI RF coil array 2300 is configured as a 3×8 channel coil array. While in this example, single-layer MRI RF coil array 2300 includes three rows having eight RF coil elements each, in another embodiment, other numbers of rows, or other number of RF coil elements per row, may be employed. In one embodiment, single-layer MRI RF coil array 2300 is configured such that at least one of the RF coil elements is configured to provide a mechanical opening for an eye, nose, or mouth. A first coil element located near a larger mechanical opening (e.g., in the nose, eye, or mouth area) may be a larger loop or saddle coil than other members of the at least three coil elements.

At high frequencies (e.g. 3T), because the human brain's dielectric constant is high (e.g. ~80), the EM field wavelength within the human brain is approximately 20 cm, which is similar to the length of an MRI coil array element. Thus, in a conventional head coil, achieving a uniform Tx field is challenging. Embodiments described herein may use parallel transmission (pTx) to create a more uniform Tx field over a smaller FOV. Additionally, human heads can vary greatly in size, for example, from that of a newborn to that of an adult. Embodiments described herein facilitate manipulating the Tx field of RF coil elements by controlling the phase and magnitude of induced currents in the RF coil elements. For example, an induced current in RF coil element 2314 may be controlled to have a first magnitude and a first phase, an induced current in RF coil element 2324 may be controlled to have a second different magnitude and a second different phase, while an induced current in RF coil element 2334 may be controlled to have a first magnitude and a second phase. Other combinations of magnitudes and phases may be employed.

A member of the RF coil elements may resonate in Tx mode and generates an induced current and its own induced Tx magnetic field. The magnitude and phase of a member of the RF coil elements may be independently adjusted, or pre-set to at least one value of magnitude or phase. The at least one value of magnitude or phase may be selected from a plurality of combinations of preset values of magnitude and phase. The preset value may be selected automatically by an MRI system, or may be manually chosen by a human operator. The preset values may include preset values for different shapes or sizes of heads.

In one embodiment, single-layer MRI RF coil array 2300 is configured to operate in one of two imaging modes. Single-layer MRI RF coil array 2300 is configured to operate in a first Tx amplified mode to support imaging of a human head only, generating an amplified Tx field in Tx mode. Single-layer MRI RF coil array 2300 is further configured to operate in a second, non-amplified Tx mode, to support imaging of the head and cervical (C) or thoracic (T) spine in conjunction with another, different coil, such as a neck coil or a spine coil which may not be a single-layer MRI RF coil arrays. In the second, non-amplified Tx mode, single-layer MRI RF coil array 2300 does not provide an amplified Tx field in Tx mode. This allows the WBC to provide a uniform Tx field on a head, C spine, or T spine when operating in Tx mode. One exemplary technique to implement this multimode approach is described with respect to FIG. 18, in which the induced magnitude is reduced to a very small magnitude. In one embodiment, the induced magnitude is reduced to a value approaching zero.

Figure 24:
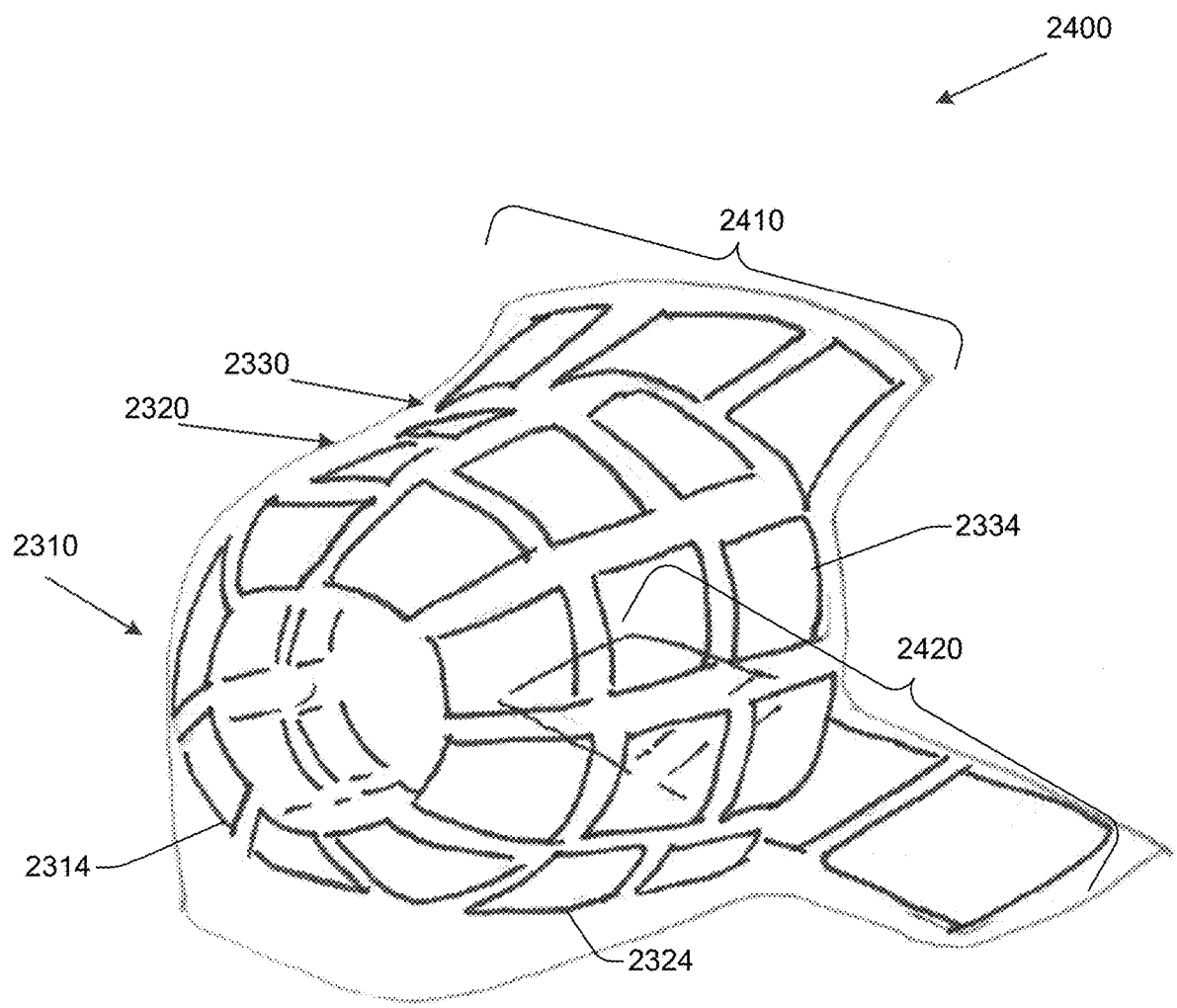
FIG. 24 is a perspective view of an example single-layer MRI RF coil array.

In one embodiment, the single-layer MRI RF coil array is configured for imaging a human head and neck. FIG. 24 illustrates an example embodiment of a single-layer MRI RF coil array 2400 configured for use imaging a human head and neck. Single-layer MRI RF coil array 2400 is similar to single-layer MRI RF coil array 2300 but includes additional elements and details. In single-layer MRI RF coil array 2400, the plurality of rows is configured in an anatomy-specific shape configured to image a human head and neck. In this embodiment, the anatomy-specific shape includes a domed shape configured to define a volume conforming to the human head, as well as an anterior component 2410 configured to conform to the neck, and a posterior component 2420 configured to conform to the chest. In one embodiment, the anterior component includes 2410 at least three RF coil array elements, and the posterior component 2420 includes at least three RF coil array elements. Thus in this example, single-layer MRI RF coil array 2400 is configured as an 8×3+6 channel array. In another embodiment, anterior component 2410 or posterior component 2420 may include other, different numbers of RF coil array elements.

In one embodiment, the magnitude of an induced current or a phase of the induced current in at least one first RF coil element or at least one second RF coil element are independently adjustable. The magnitude of the induced current or the phase of the induced current in the at least one first RF coil element or the at least one second RF coil element is a function of a coil loss resistance of the primary coil, a coil loss resistance of the at least one first RF coil element or the at least one second RF coil element, or a difference between the working frequency of the primary coil and the first frequency. Independently adjusting the magnitude of the induced current or the phase of the induced current in the at least one first RF coil element or the at least one second RF coil element achieves a more uniform Tx field, increasing the circularity of the Tx filed in the chest/neck area, and thus increasing the efficiency of single-layer MRI RF coil array 2400 compared to conventional approaches.

Figure 25:
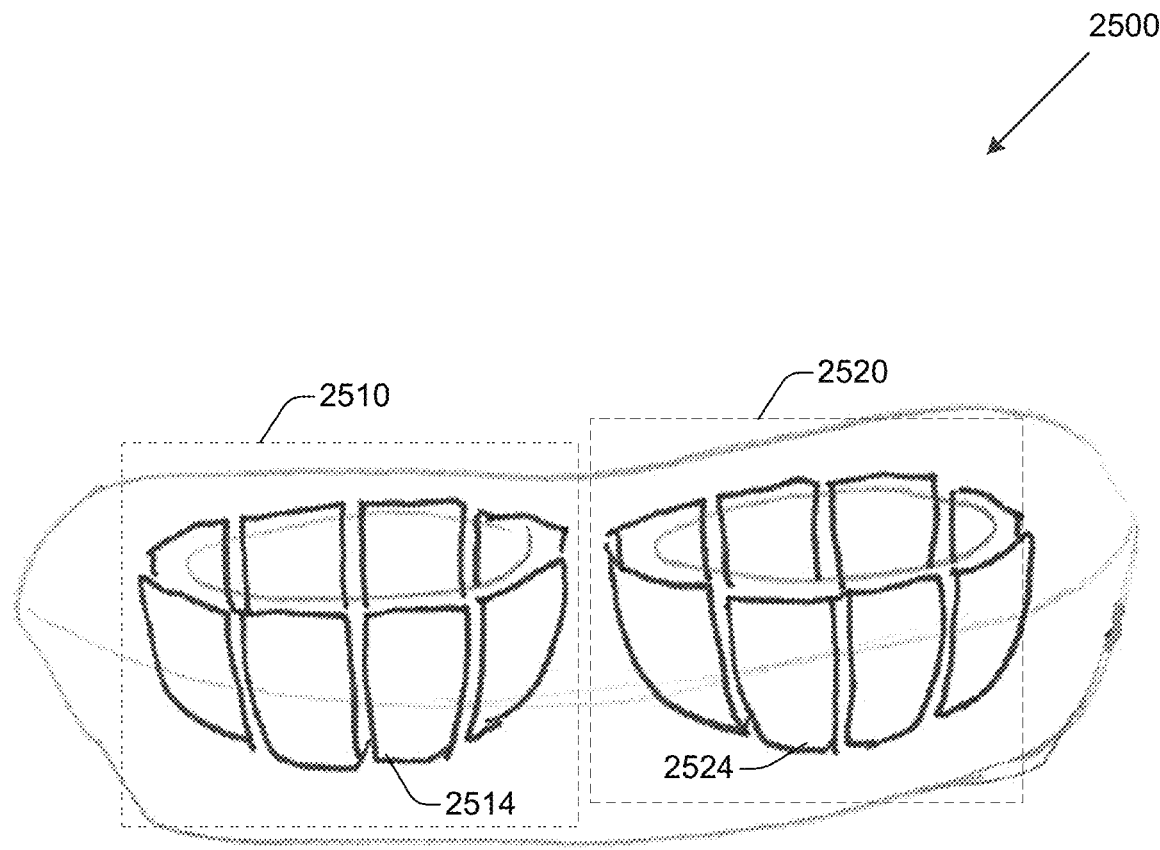
FIG. 25 is a perspective view of an example single-layer MRI RF coil array.

In one embodiment, the single-layer MRI RF coil array is configured for use imaging a human breast. FIG. 25 illustrates an example embodiment of a single-layer MRI RF coil array 2500 configured for use imaging a human breast. In single-layer MRI RF coil array 2500, the plurality of rows is configured in an anatomy-specific shape configured to image a human breast. In this embodiment, the anatomy specific shape includes two cup-shaped components 2510 and 2520 configured to define a volume conforming to a human breast. Cup-shaped components 2510 and 2520 include a plurality of RF coil array elements 2514 and 2524. In one embodiment, RF coil element 2514 or 2524 may be configured as MRI RF coil elements described herein, including MRI RF coil elements 600, 800, 900, 1000, 1100, 1200, or 1500. In this embodiment, cup-shaped component 2510 includes eight RF coil array elements 2514, and cup-shaped component 2520 also includes eight RF coil array elements 2524, resulting in a 2×8 channel single-layer MRI RF coil array 2500. A cup-shaped component includes an aperture for receiving a human breast. In one embodiment, single layer MRI RF coil array 2500 is further configured to image the breast, chest wall, and axilla.

In one embodiment, a first Tx field generated by cup-shaped component 2510 may be controlled to have a different value than a second Tx field generated by cup-shaped component 2520. For example, a first breast received by cup-shaped component 2510 may be of a different size than a second breast received by cup-shaped component 2520, and thus a region of interest for the first breast may be situated in a slightly different position within cup-shaped component 2510 than the second breast received by cup-shaped component 2520. Thus, the magnitude and phase of induced currents in members of the plurality of RF coil array elements 2514 and 2524 may be independently adjusted to facilitate achieving a more uniform Tx field.

Figure 26:
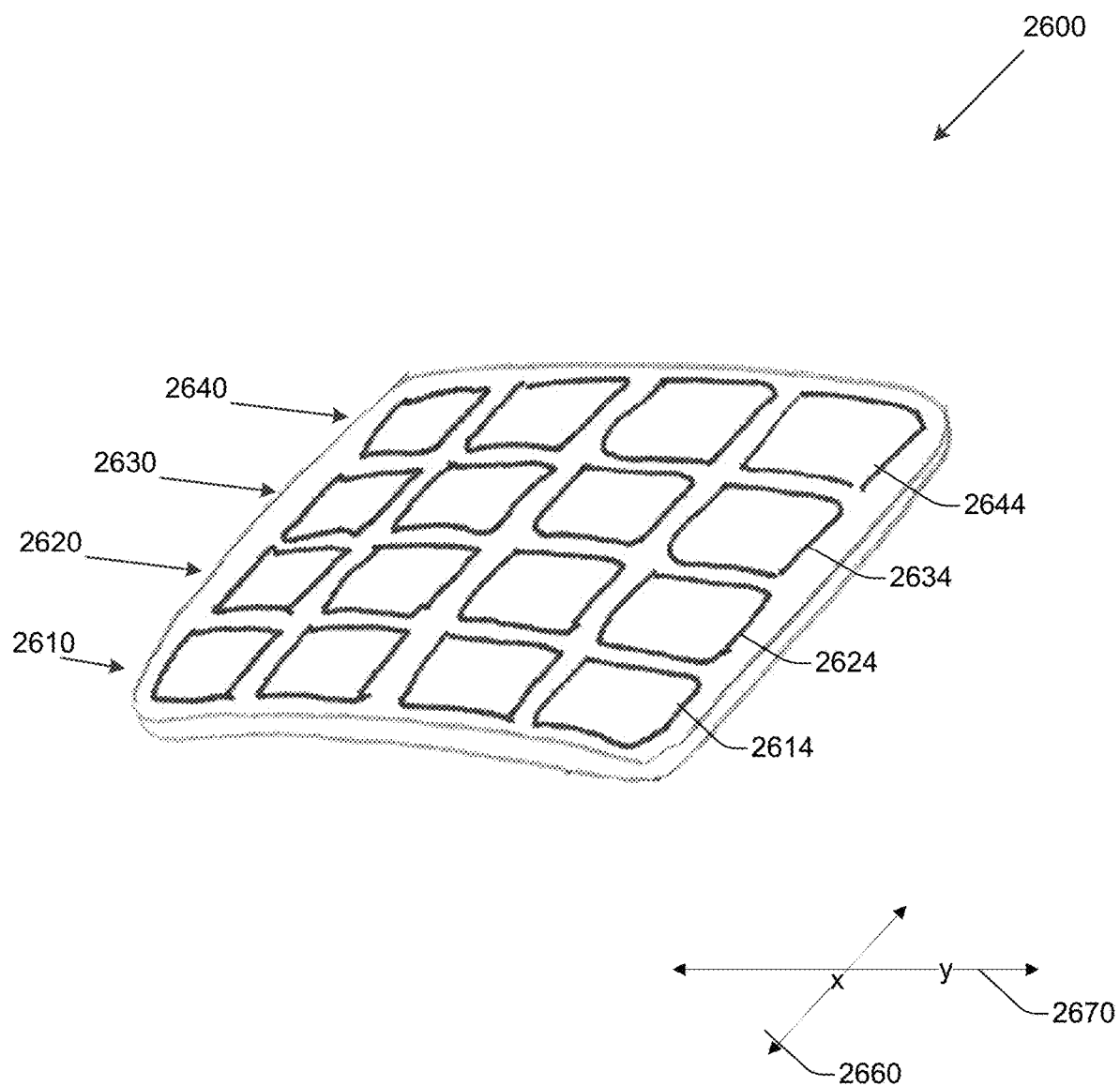
FIG. 26 is a perspective view of an example single-layer MRI RF coil array.

In one embodiment, the single-layer MRI RF coil array is configured for use imaging a human torso or cardiac region. FIG. 26 illustrates an example embodiment of a single-layer MRI RF coil array 2600 configured for use imaging a human torso or cardiac region. In single-layer MRI RF coil array 2600, the plurality of rows is configured in an anatomy-specific shape configured to image a human torso or cardiac region. Single-layer MRI RF coil array 2600 may be operably connected with an MRI system (not illustrated for clarity).

In one embodiment of single-layer MRI RF coil array 2600, the anatomy-specific shape is a rectangular shape configured to define a volume conforming to the human torso or cardiac region. In one embodiment, the plurality of rows includes at least four rows 2610, 2620, 2630, and 2640. A member of the plurality of rows includes an RF coil element (e.g., RF coil element 2614, 2624, 2634, or 2644).

In one embodiment, RF coil element 2614, 2624, 2634, or 2644 may be configured as single-layer MRI RF coil elements described herein, including MRI RF coil elements 600, 800, 900, 1000, 1100, 1200, or 1500. In this embodiment, a row 2610, 2620, 2630, or 2640 has at least four RF coil elements, resulting in a 4×4 channel single-layer MRI RF coil array. In another embodiment, single-layer MRI RF coil array 2600 may include other different numbers of rows or RF coil elements (e.g., 3×3, 5×5). In one embodiment, rows 2610, 2620, 2630, and 2640 are aligned with each other as illustrated in FIG. 26. In another embodiment, a member of rows 2610, 2620, 2630, or 2640 may be offset laterally along an x axis 2660 or y axis 2670. For example, row 2610 may be laterally offset 1 cm in the x axis 2660, from row 2620. In another embodiment, rows 2610, 2620, 2630, or 2640 may be laterally offset other, different amounts. In another embodiment, MRI RF coil elements of a row may be evenly displaced in the row relative to other MRI RF coil elements in the row. In another embodiment, MRI RF coil elements in a row may be unevenly displaced from other MRI RF coil elements in the row.

Figure 27:
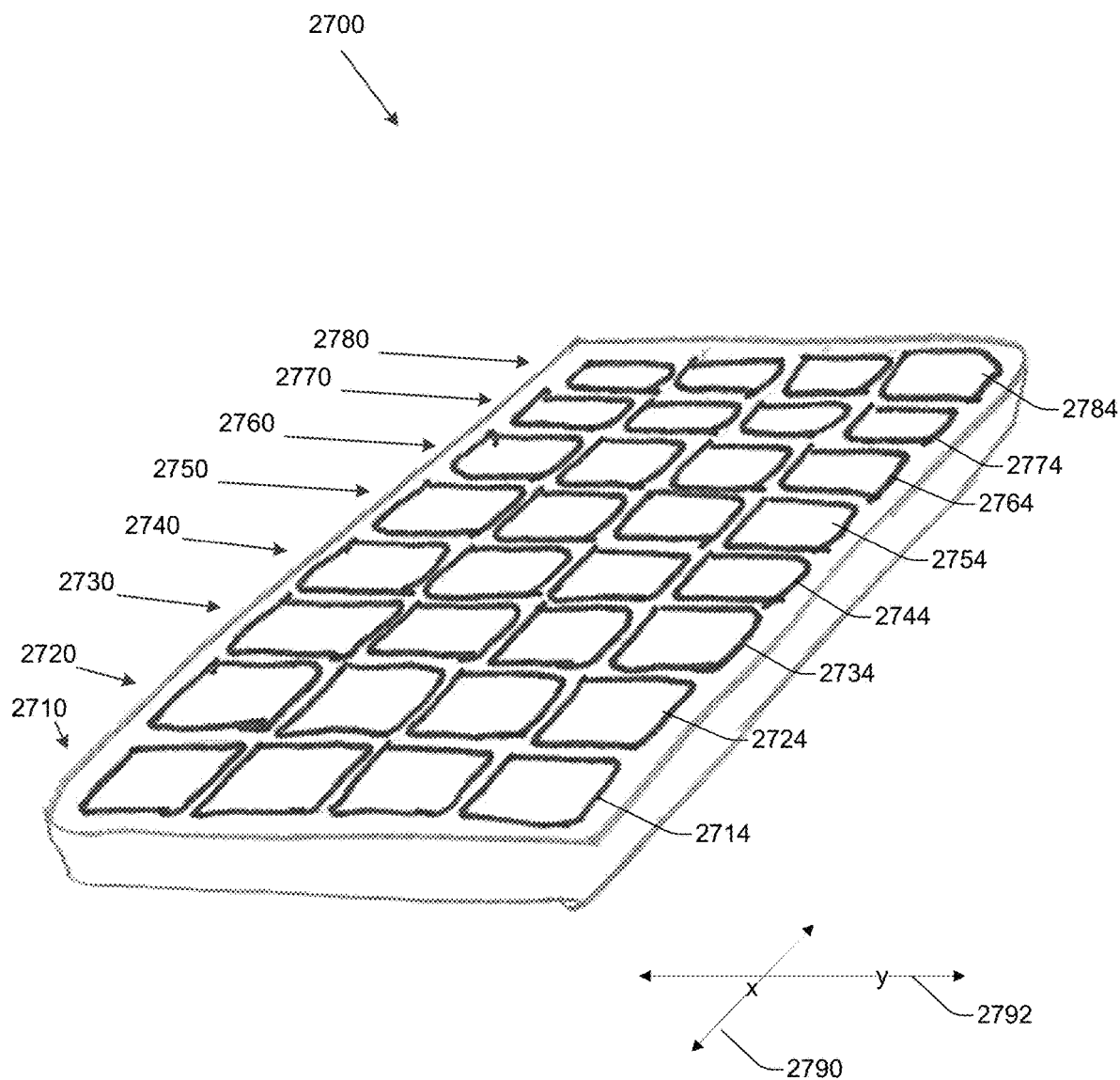
FIG. 27 is a perspective view of an example single-layer MRI RF coil array.

In one embodiment, the single-layer MRI RF coil array is configured for use imaging a human spine. FIG. 27 illustrates an example embodiment of a single-layer MRI RF coil array 2700 configured for use imaging a human spine. In single-layer MRI RF coil array 2700, the plurality of rows is configured in an anatomy-specific shape configured to image a human spine. Single-layer MRI RF coil array 2700 may be operably connected with an MRI system (not illustrated for clarity).

In one embodiment of single-layer MRI RF coil array 2700, the anatomy-specific shape is a rectangular shape configured to define a volume conforming to the human spine. In one embodiment, the plurality of rows includes at least eight rows 2710, 2720, 2730, 2740, 2750, 2760, 2770, and 2780. A member of the plurality of rows includes an RF coil element (e.g., RF coil element 2714, 2724, 2734, 2744, 2754, 2764, 2774, or 2784). In one embodiment, RF coil elements 2714, 2724, 2734, 2744, 2754, 2764, 2774, or 2784 may be configured as single-layer MRI RF coil elements described herein, including single-layer MRI RF coil elements 600, 800, 900, 1000, 1100, 1200, or 1500. In this embodiment, a row 2710, 2720, 2730, 2740, 2750, 2760, 2770, and 2780 has at least four RF coil elements, resulting in a 4×8 channel single-layer MRI RF coil array. In another embodiment, single-layer MRI RF coil array 2700 may include other different numbers of rows or RF coil elements (e.g., 3×6, 5×9).

In one embodiment, rows 2710, 2720, 2730, 2740, 2750, 2760, 2770, and 2780 are aligned with each other along an x axis 2790 or y axis 2792. In another embodiment, a member of rows 2710, 2720, 2730, 2740, 2750, 2760, 2770, and 2780 may be offset laterally a threshold amount (e.g., 1 cm, 2 cm) from another member of rows 2710, 2720, 2730, 2740, 2750, 2760, 2770, and 2780.

In one embodiment, single-layer MRI RF coil array 2700 may be used in conjunction with single-layer MRI RF coil array 2600. For example, in clinical situations, the spine array and torso/cardiac area are often imaged together. In this case the amplified Tx field achievable using both single-layer MRI RF coil array 2700 and single-layer MRI RF coil array 2600 together is more uniform in Tx mode than is achievable separately, or by conventional approaches. An approach to using single-layer MRI RF coil array 2700 with single-layer MRI RF coil array 2600 is described with respect to FIG. 13. For example, a first single-layer MRI RF coil array (e.g., single-layer MRI RF coil array 2600) configured to image a human torso may be arranged on a first plane to conform with a torso of a patient. A second single-layer MRI RF coil array (e.g., single-layer MRI RF coil array 2700) configured to image a human spine may be disposed a threshold distance (e.g., 35 cm) away from the first single-layer MRI RF coil array on a second plane to conform with a spine of the patient.

Figure 28:
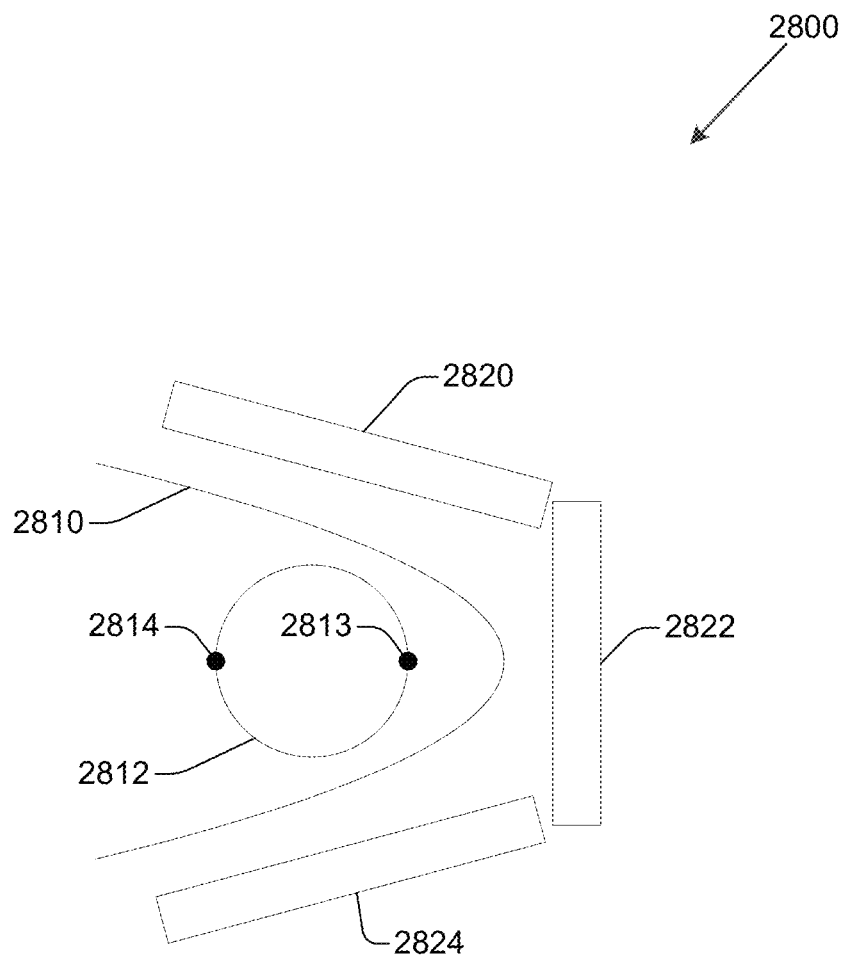
FIG. 28 is a view of an example single-layer MRI RF coil array.

In one embodiment, the single-layer MRI RF coil array is configured for use imaging a human shoulder. FIG. 28 illustrates an example embodiment of a single-layer MRI RF coil array 2800 configured for use imaging a human shoulder. In single-layer MRI RF coil array 2800, the plurality of rows is configured in an anatomy-specific shape configured to define a volume conforming to the human shoulder. Single-layer MRI RF coil array 2800 may be operably connected with an MRI system (not illustrated for clarity). Single Layer MRI RF coil array 2800 includes an anterior section 2820 operably connected to a side section 2822, operably connected to a posterior section 2824. Anterior section, side section 2822, and posterior section 2824 may each comprise a row or plurality of rows of MRI RF coil elements as described herein, including single-layer MRI RF coil elements 600, 800, 900, 1000, 1100, 1200, or 1500. In one embodiment, anterior section 2820 is oriented within a threshold of parallel to the posterior section 2824. FIG. 28 illustrates further illustrates a shoulder 2810, and a primary region of interest (ROI) 2812. In this example, single-layer MRI RF coil array 2800 is configured to image the primary ROI 2812.

In a conventional shoulder coil that coil covers three sides of the anatomy being imaged, if each coil element resonates with a WBC in Tx mode, the induced field near the anterior, posterior, or side elements may be much stronger than the area far away from the side, which can degrade image quality. For example, the induced Tx field at first point 2813 may be significantly different than the induced Tx field at second point 2814. Embodiments described herein facilitate adjusting the magnitudes and phases of induced currents in MRI RF coil elements in the anterior section 2820, the side section 2822, and the posterior section 2824 such that the induced current changes the magnitude of the side area Tx field, which improves uniformity of the Tx field in the primary ROI 2812, and improves the image quality available for clinical imaging. Thus, a more uniform Tx field may be generated at first point 2813 and second point 2814 by independently manipulating the magnitude and phase of induced currents in different RF coil elements of anterior section 2820, side section 2822, and the posterior section 2824, than is achievable with conventional approaches.

Figure 29:
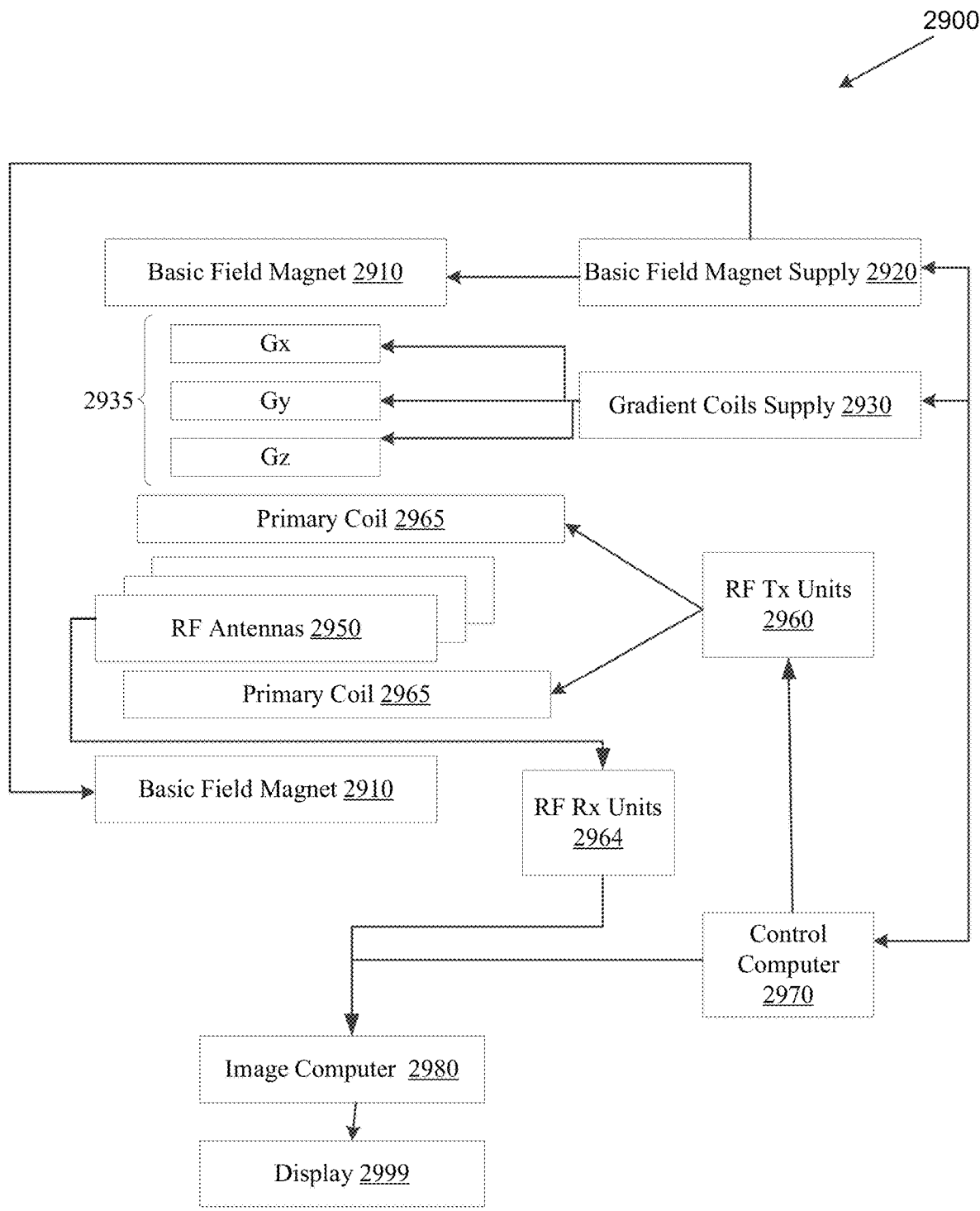
FIG. 29 illustrates an example MRI apparatus.

FIG. 29 illustrates an example MRI apparatus 2900 configured with a set of example single-layer MRI RF coils. The apparatus 2900 includes a basic field magnet(s) 2910 and a basic field magnet supply 2920. Ideally, the basic field magnets 2910 would produce a uniform $B_0$ field. However, in practice, the B0 field may not be uniform, and may vary over an object being imaged by the MRI apparatus 2900. MRI apparatus 2900 may include gradient coils 2935 configured to emit gradient magnetic fields like $G_x$, $G_y$, and $G_z$. The gradient coils 2935 may be controlled, at least in part, by a gradient coils supply 2930. In some examples, the timing, strength, and orientation of the gradient magnetic fields may be controlled, and thus selectively adapted during an MRI procedure.

MRI apparatus 2900 may include a primary coil 2965 configured to generate RF pulses. The primary coil 2965 may be a whole body coil. The primary coil 2965 may be, for example, a birdcage coil. The primary coil 2965 may be controlled, at least in part, by an RF transmission unit 2960. RF transmission unit 2960 may provide a signal to primary coil 2965.

MRI apparatus 2900 may include a set of RF antennas 2950 that are configured to inductively couple with primary coil 2965 and generate RF pulses and to receive resulting magnetic resonance signals from an object to which the RF pulses are directed. In one embodiment, a member of the set of RF antennas 2950 may be fabricated from flexible coaxial cable. The set of RF antennas 2950 may be connected with an RF receive unit 2964.

The gradient coils supply 2930 and the RF transmission units 2960 may be controlled, at least in part, by a control computer 2970. The magnetic resonance signals received from the set of RF antennas 2950 can be employed to generate an image, and thus may be subject to a transformation process like a two dimensional fast Fourier transform (FFT) that generates pixilated image data. The transformation can be performed by an image computer 2980 or other similar processing device. The image data may then be shown on a display 2999. RF Rx Units 1264 may be connected with control computer 2970 or image computer 2980. While FIG. 29 illustrates an example MRI apparatus 2900 that includes various components connected in various ways, it is to be appreciated that other MRI apparatus may include other components connected in other ways.

In one example, MRI apparatus 2900 may include control computer 2970. In one example, a member of the set of RF antennas 2950 may be individually controllable by the control computer 2970. A member of the set of RF antennas 2950 may be an example single-layer MRI RF coil element, or an example single-layer MRI RF coil array. For example, MRI RF coil element 600, 800, 900, 1000, 1100, 1200, or 1500 may be implemented as part of RF antennas 2950 illustrated in FIG. 29. In another embodiment, RF antennas 2850 may include single-layer MRI RF array 2100, 2200, 2300, 2400, 2500, 2600, 2700, or single-layer MRI RF array 2800. In another embodiment, the set of RF antennas 2950 may include other, different combinations of example embodiments of single-layer MRI RF coil elements or example embodiments of single-layer MRF RF coil arrays.

An MRI apparatus may include, among other components, a controller (e.g. control computer 2970 or other control component) and an RF coil operably connected to the controller. The controller may be configured to provide the RF coil with a current, a voltage, or a control signal. The coil may be a whole body coil. The coil may inductively couple with an example MRI RF coil element or single-layer MRI coil array, as described herein, including MRI RF coil element 600, 800, 900, 1000, 1100, 1200, or 1500, or single-layer MRI coil array 2100, 2200, 2300, 2400, 2500, 2600, 2700, or single-layer MRI RF array 2800.

The magnitude and phase of an induced current in members of RF antennas 2950, including individual coil array elements, may be independently adjustable according to embodiments described herein. Independently adjusting the magnitude and phase of an induced current in members of RF antennas 2950 facilitates adjusting the value of a Tx field generated by RF antennas 2950, and facilitates increasing the uniformity of the Tx field experienced by a region of interest that may be subjected to the Tx field. Thus, in one example, MRI apparatus 2900 is configured to image a region of human anatomy (e.g., head, neck, shoulder, foot, knee, breast) using embodiments of single-layer MRI RF coil arrays or MRI RF coil array elements described herein, and to adjust the uniformity of the Tx field generated by adjusting the magnitude or phase of an induced current in RF antennas 2950.

For example, at a first region of interest (ROI) being imaged during an MRI procedure, the first ROI (e.g., lateral knee) may be subjected to a Tx field generated by RF antennas 2950, where the Tx field in the first ROI is dominated by a first member of the RF antennas 2950. Control computer 2970 may control the magnitude or phase of a member of the RF antennas 2950 such that the Tx field in the first ROI is altered, thus changing the Tx field experienced by the first ROI. At a second, different ROI in the anatomy being imaged, (e.g., medial knee) the second, different ROI may experience a Tx field dominated by a second, different member of RF antennas 2950. Control computer 2970 may then control the magnitude or phase of a second, different member of the RF antennas 2950 such that the Tx field is altered, thus changing the Tx field experienced by the second, different ROI. While two members of the RF antennas 2950 are described here, embodiments may include more than two members of RF antennas 2950, and control computer 2970 may control more than two members of RF antennas 2950.

Figure 30:
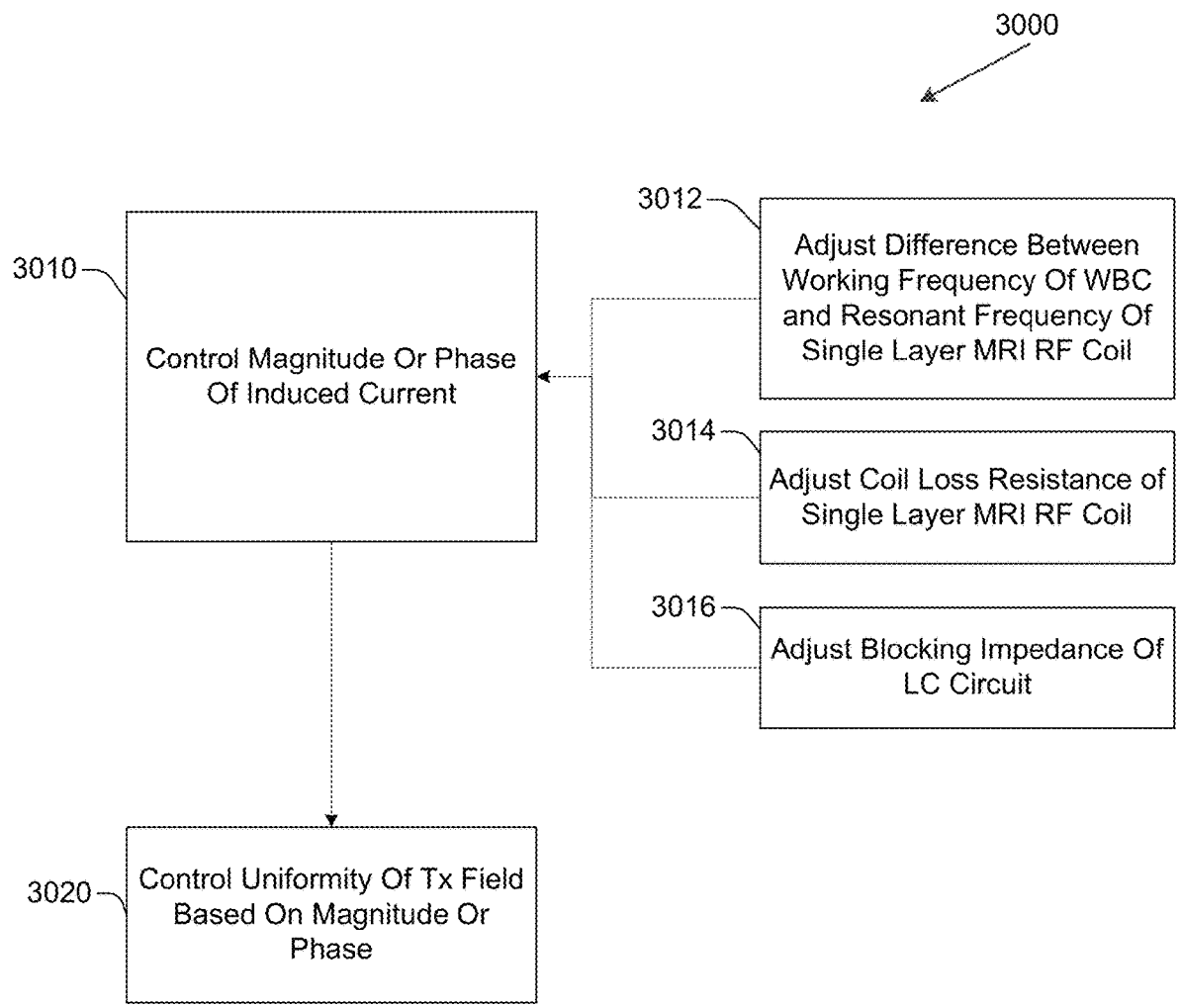
FIG. 30 illustrates an example method for adjusting an MRI RF Tx field.

FIG. 30 illustrates a method 3000 for controlling the uniformity of a magnetic resonance imaging (MRI) transmit (Tx) field generated by inductive coupling between a single-layer MRI radio frequency (RF) coil array and a whole body coil (WBC) during an MRI procedure. The single-layer MRI RF coil array includes at least one single-layer MRI RF coil element. Method 3000 includes, at 3010, controlling, during the MRI procedure, a magnitude of an induced current in the at least one single-layer MRI RF coil element, or a phase of the induced current. In one embodiment, controlling the magnitude or the phase includes adjusting, at 3012, a difference between a working frequency of the WBC and a resonant frequency of the at least one single layer MRI RF coil element. In another embodiment, controlling the magnitude or the phase includes adjusting, at 3014, a coil loss resistance of the at least one single layer MRI RF coil element. In another embodiment, controlling the magnitude or the phase includes adjusting, at 3016, a blocking impedance of an LC circuit connected in parallel with the at least one single layer MRI RF coil element. In another embodiment, controlling the magnitude or the phase includes adjusting at least one of a difference between a working frequency of the WBC and a resonant frequency of the at least one single layer MRI RF coil element, a coil loss resistance of the at least one single layer MRI RF coil element, or a blocking impedance of an LC circuit connected in parallel with the at least one single layer MRI RF coil element.

Method 3000 further includes, at 3020, controlling a uniformity of the Tx field generated based, at least in part on the magnitude or phase. Controlling the magnitude or phase of the induced current varies the uniformity of the Tx field generated by the single-layer MRI RF coil. Varying the uniformity of the Tx field changes the Tx field to which a region of interest being imaged is subjected. Varying the Tx field to which the region of interest is subjected may result in a more uniform Tx field across different portions of the ROI, which improves MRI image quality compared to conventional approaches. Method 3000 does not require the use of parallel transmission (pTx) to control the uniformity of the Tx field. In one embodiment, controlling the uniformity of the Tx field includes reducing the magnitude of the induced current to a low enough value that the magnitude of the Tx field generated by inductive coupling is effectively zero relative to a Tx field generated by the WBC.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the invention. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Circuit", as used herein, includes but is not limited to hardware, firmware, or combinations of each to perform a function(s) or an action(s), or to cause a function or action from another circuit, logic, method, or system. Circuit may include a software controlled microprocessor, a discrete logic (e.g., ASIC), an analog circuit, a digital circuit, a programmed logic device, a memory device containing instructions, and other physical devices. A circuit may include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

"Computer-readable storage device", as used herein, refers to a device that stores instructions or data. "Computer-readable storage device" does not refer to propagated signals. A computer-readable storage device may take forms, including, but not limited to, non-volatile media, and volatile media. Non-volatile media may include, for example, optical disks, magnetic disks, tapes, and other media. Volatile media may include, for example, semiconductor memories, dynamic memory, and other media. Common forms of a computer-readable storage device may include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A single-layer magnetic resonance imaging (MRI) radio frequency (RF) coil array configured to operate in a transmit (Tx) mode or in a receive (Rx) mode, the single-layer MRI RF coil array comprising:
    a plurality of rows configured in an anatomy-specific shape, where a row includes a plurality of RF coil elements;
    where an RF coil element includes:
        an LC coil;
        a matching and Tx/Rx switch circuit operably connected to the LC coil;
        a preamplifier operably connected to the matching and Tx/Rx switch circuit; and
        a magnitude/phase control component operably connected to the LC coil;
    where the LC coil includes at least one inductor and at least one capacitor, where the at least one inductor and the at least one capacitor resonate at a first frequency, and where the at least one capacitor comprises a first capacitor;
    where the matching and Tx/Rx switch circuit is configured to, when operating in Tx mode, create a resonant tank circuit from the LC coil to the preamplifier to electrically isolate the preamplifier from an induced current in the LC coil while the LC coil resonates with a primary coil at a working frequency of the primary coil;
    where the LC coil, upon resonating with the primary coil at the working frequency of the primary coil, generates a local amplified Tx field based on the induced current in the LC coil;
    where a magnitude of the induced current or a phase of the induced current is independently adjustable;
    where the magnitude of the induced current or the phase of the induced current is configured to be varied over a range of magnitudes or phases respectively;
    where the matching and Tx/Rx switch circuit is configured to, when operating in Rx mode, create a non-resonant circuit from the LC coil to the preamplifier to electrically connect the LC coil with the preamplifier;
    where the magnitude/phase control component comprises a first circuit leg comprising a diode switch and an impedance source electrically coupled in series, where the first circuit leg is electrically coupled in parallel with the first capacitor, and where the magnitude/phase control component is configured to adjust the magnitude of the induced current or the phase of the induced current at the LC coil by adjusting an ON/OFF state of the diode switch; and
    where a magnitude of a first induced current or a phase of the first induced current of a first RF coil element is independently adjustable from a magnitude of a second induced current or a phase of the second induced current of a second, different RF coil element.

2. The single-layer MRI RF coil array of claim 1, where the RF coil element is configured as a loop coil or a saddle coil.

3. The single-layer MRI RF coil array of claim 1, where the magnitude of the induced current or the phase of the induced current is selectable from a set of pre-set values.

4. The single-layer MRI RF coil array of claim 1, where the primary coil is a whole body coil (WBC).

5. The single-layer MRI RF coil array of claim 1, where the LC coil includes at least one conductor, where the at least one conductor is a flexible co-axial cable.

6. The single-layer MRI RF coil array of claim 1 further comprising a shunt PIN diode having a first terminal connected to a first input terminal of the preamplifier, and a second terminal connected to a second input terminal of the preamplifier, where, upon application of a forward bias to the shunt PIN diode, the shunt PIN diode provides shunt protection to the preamplifier.

7. The single-layer MRI RF coil array of claim 1, where the magnitude of the induced current or the phase of the induced current is a function of a coil loss resistance of the primary coil, a coil loss resistance of the RF coil element, or a difference between the working frequency of the primary coil and the first frequency.

8. The single-layer MRI RF coil array of claim 1 configured to operate in a non-amplified Tx mode.

9. The single-layer MRI RF coil array of claim 1 configured for use on a human knee, arm, and leg.

10. The single-layer MRI RF coil array of claim 9, where the anatomy-specific shape is a cylindrical shape configured to define a volume conforming to the human knee, arm, and leg, where the cylindrical shape has a constant radius.

11. The single-layer MRI RF coil array of claim 9, where the anatomy-specific shape is a truncated cone shape configured to define a volume conforming to the human knee, arm, and leg.

12. The single-layer MRI RF coil array of claim 9, where the plurality of rows comprises three rows, and where a row has eight RF coil elements.

13. The single-layer MRI RF coil array of claim 1, configured for use on a human hand and a human wrist.

14. The single-layer MRI RF coil array of claim 13, where the anatomy-specific shape includes a cylindrical shape configured to define a first volume conforming to the human wrist, and an elliptical shape connected to the cylindrical shape, the elliptical shape configured to define a second volume conforming to the human hand, where a first diameter of the elliptical shape is greater than a first diameter of the cylindrical shape.

15. The single-layer MRI RF coil array of claim 13, where the plurality of rows comprises at least two rows, where a row has eight RF coil elements.

16. The single-layer MRI RF coil array of claim 1, configured for use on a human foot and a human ankle.

17. The single-layer MRI RF coil array of claim 16, where the anatomy-specific shape includes an L-shaped foot/ankle section configured to define a volume conforming to the human foot and the human ankle, where the L-shaped foot/ankle section is configured as a boot-like structure, where the boot-like structure is configured to receive, through a leg opening, a portion of a human leg along a first cylindrical volume disposed along a first axis, and further configured to receive the human foot extending transversely with respect to the first axis, where the toes of the human foot extend through a toe opening.

18. The single-layer MRI RF coil array of claim 1, configured for use on a human head.

19. The single-layer MRI RF coil array of claim 18, where the anatomy-specific shape includes a domed shape configured to define a volume conforming to the human head.

20. The single-layer MRI RF coil array of claim 18, where the plurality of rows includes at least one row, where a row has at least four RF coil elements.

21. The single-layer MRI RF coil array of claim 18, where at least one of the RF coil elements is configured to provide a mechanical opening for an eye, nose, or mouth.

22. The single-layer MRI RF coil array of claim 18, further configured for use on a human neck and a human chest.

23. The single-layer MRI RF coil array of claim 22, further comprising an anterior component configured to conform to the human neck, and a posterior component configured to conform to the human chest, where the anterior component includes at least three RF coil array elements, and where the posterior component includes at least three RF coil array elements.

24. The single-layer MRI RF coil array of claim 1, configured for use on human breasts.

25. The single-layer MRI RF coil array of claim 24, where the anatomy-specific shape includes two cup-shaped components configured to define a volume conforming to the human breasts, where the two cup-shaped components include apertures for receiving the human breasts.

26. The single-layer MRI RF coil array of claim 24, configured to image the human breasts, a human chest wall, and a human axilla.

27. The single-layer MRI RF coil array of claim 1, configured for use on a human torso.

28. The single-layer MRI RF coil array of claim 27, where the anatomy-specific shape includes a rectangular shape configured to conform to the human torso.

29. The single-layer MRI RF coil array of claim 28, where the plurality of rows includes at least four rows, where a row has at least four RF coil elements.

30. The single-layer MRI RF coil array of claim 28, further comprising a posterior section configured to conform to a human spine, where the posterior section includes a plurality of rows, where a row includes a plurality of RF coil elements.

31. The single-layer MRI RF coil array of claim 1, configured for use on a human spine or back.

32. The single-layer MRI RF coil array of claim 31, where the anatomy-specific shape includes a rectangular shape configured to conform to the human spine or back.

33. The single-layer MRI RF coil array of claim 31 further comprising an anterior section configured to conform to an anterior region of a human torso, where the anterior section includes a plurality of rows, where a row includes a plurality of RF coil elements.

34. The single-layer MRI RF coil array of claim 1 configured for use on a human shoulder.

35. The single-layer MRI RF coil array of claim 34, where the anatomy-specific shape includes an anterior section and a posterior section oriented within a threshold of parallel to the anterior section, and a side section arranged within a threshold of perpendicular to the anterior section and the posterior section, where the anatomy-specific shape is configured to define a volume conforming to the human shoulder.

36. The single-layer MRI RF coil array of claim 1, where the at least one capacitor comprises a second capacitor, where the magnitude/phase control component comprises a second circuit leg, where the second circuit leg comprises a second diode switch and a second impedance source electrically coupled in series from a first terminal of one of the first and second capacitors to a second terminal of the one of the first and second capacitors, such that the second circuit leg is electrically coupled in parallel with the one of the first and second capacitors, and where the magnitude/phase control component is configured to adjust the magnitude or the phase while the LC coil resonates by adjusting an ON/OFF state of the second diode switch.

37. The single-layer MRI RF coil array of claim 1, where the matching and Tx/Rx switch circuit comprises a diode, a third capacitor, and an inductor that are distinct from the LC coil and the magnitude/phase control component and that create the resonant tank circuit and the non-resonant circuit, wherein one of the third capacitor and the inductor is electrically coupled directly from a first terminal of the LC coil to a first input terminal of the preamplifier, and wherein the diode and another one of the third capacitor and the inductor are electrically coupled in series directly from the first terminal of the LC coil to the first input terminal of the preamplifier.

38. A magnetic resonance imaging (MRI) apparatus, comprising:
a controller;
a primary coil connected to the controller; and
a single-layer MRI radio frequency (RF) coil array operably connected to the controller, where the single-layer MRI RF coil array includes at least one RF coil element, where the single-layer MRI RF coil array is configured for a specific anatomy;
where the controller provides the primary coil with a current, a voltage, or a control signal, and
where a member of the at least one RF coil element comprises:
an LC coil;
a matching and transmit (Tx)/receive (Rx) switch circuit operably connected to the LC coil;
a preamplifier operably connected to the matching and Tx/Rx circuit; and a magnitude/phase control component operably connected to the LC coil;

where the LC coil includes at least one inductor and at least one capacitor, where the at least one inductor and the at least one capacitor resonate at a first frequency, and where the at least one capacitor comprises a first capacitor;

where the matching and Tx/Rx switch circuit is configured to, when operating in Tx mode, create a resonant tank circuit from the LC coil to the preamplifier to electrically isolate the preamplifier from an induced current in the LC coil while upon the LC coil resonates with the primary coil at a working frequency of the primary coil;

where the LC coil, upon resonating with the primary coil at the working frequency of the primary coil, generates a local amplified Tx field based on the induced current in the LC coil, where a magnitude of the induced current or a phase of the induced current is independently adjustable, and where the magnitude of the induced current or the phase of the induced current is configured to be varied over a range of magnitudes or phases respectively;

where the matching and Tx/Rx switch circuit is configured to, when operating in Rx mode, create a non-resonant circuit from the LC coil to the preamplifier to electrically connect the LC coil with the preamplifier; and where the magnitude/phase control component comprises a first circuit leg comprising a diode switch and an impedance source electrically coupled in series, where the first circuit leg is electrically coupled in parallel with the first capacitor, and where the magnitude/phase control component is configured to adjust the magnitude of the induced current or the phase of the induced current at the LC coil by adjusting an ON/OFF state of the diode switch; and where a magnitude of a first induced current or a phase of the first induced current of a first RF coil element is independently adjustable from a magnitude of a second induced current or a phase of the second induced current of a second, different RF coil element.

39. The MRI apparatus of claim 38, where the magnitude/phase control component is configured to adjust the magnitude of the induced current or the phase of the induced current by controlling a coil loss resistance of the primary coil, a coil loss resistance of the member of the at least one RF coil element, or a difference between the working frequency of the primary coil and the first frequency.

40. The MRI apparatus of claim 38, where the matching and Tx/Rx switch circuit is a capacitive matching and Tx/Rx switch circuit, or an inductive matching and Tx/Rx switch circuit.

41. The MRI apparatus of claim 38, where the magnitude of the induced current or the phase of the induced current is a function of a coil loss resistance of the primary coil, a coil loss resistance of the member of the at least one RF coil element, or a difference between the working frequency of the primary coil and the first frequency, and where the magnitude/phase control component is configured to adjust the magnitude of the induced current or the phase of the induced current by adjusting at least one of the coil loss resistance of the primary coil, the coil loss resistance of the member of the at least one RF coil element, or the difference between the working frequency of the primary coil and the first frequency.

42. A single-layer magnetic resonance imaging (MRI) radio frequency (RF) coil array configured to operate in a transmit (Tx) mode or in a receive (Rx) mode, the single-layer MRI RF coil array comprising:

a plurality of RF coil elements in a plurality of rows and in an anatomy-specific shape, where the plurality of RF coil elements comprises a first RF coil element and a second RF coil element each comprising:

an LC coil comprising at least one inductor and at least one capacitor that are configured to resonate together at a first frequency;

a preamplifier;

a matching and Tx/Rx switch circuit configured to isolate the preamplifier from the LC coil while the LC coil resonates at the first frequency in the Tx mode, and to further connect the preamplifier to the LC coil in the Rx mode; and a magnitude/phase control component comprising a plurality of diode switches and a plurality of resistive or reactive components, where each of the resistive or reactive components is electrically coupled in series with a corresponding one of the diode switches from a first location on the LC coil to a second location on the LC coil, and where the magnitude/phase control component is configured to vary an impedance of the LC coil, and to vary a magnitude and/or phase of a Tx field produced by the LC coil, by varying ON/OFF states of the diode switches;

where the Tx fields respectively of the first and second RF coil elements are independently adjustable by the ON/OFF states respectively of the first and second RF coil elements; and where the single-layer MRI RF coil array is configured to switch between a first Tx field pattern and a second Tx field pattern by varying the ON/OFF states of the first and second RF coil elements, where the first Tx field pattern has higher uniformity across a first anatomical feature than a second anatomical feature, and where the second Tx field pattern has higher uniformity across the second anatomical feature than the first anatomical feature.

43. The single-layer MRI RF coil array of claim 42, wherein the first and second anatomical features correspond to different areas of a head or different sized heads.

44. The single-layer MRI RF coil array of claim 42, wherein the matching and Tx/Rx switch circuit comprises a first reactive component, a second reactive component, and a diode, where the first reactive component is electrically coupled from a first terminal of the LC coil to a first input terminal of the preamplifier, where the second reactive component and the diode are electrically coupled in series from the first terminal of the LC coil to the first input terminal of the preamplifier, where the first and second reactive components are respectively a capacitor and an inductor or vice versa, and where the first and second reactive component are configured to resonate together when the diode is forward biased to isolate the preamplifier from current in the LC coil while the LC coil resonates at the first frequency in the Tx mode.

45. The single-layer MRI RF coil array of claim 44, where the at least one inductor and the at least one capacitor are electrically coupled in series in a loop, where the LC coil comprises a third reactive component partially forming the loop, where the first terminal of the LC coil is at a first terminal of the third reactive component, and where the first and third reactive components are respectively a capacitor and an inductor or vice versa.

46. The single-layer MRI RF coil array of claim 42, where the LC coil is a loop or saddle coil, where each inductor of the at least one inductor and each capacitor of the at least one capacitor individually form a portion of the loop or saddle coil, where each of the resistive or reactive components is electrically coupled in series with the corresponding one of the diode switches to form a circuit leg, which is electrically coupled in parallel with a corresponding one of the at least one capacitor.

* * * * *